(12) United States Patent
Raymond et al.

(10) Patent No.: US 7,968,790 B2
(45) Date of Patent: *Jun. 28, 2011

(54) PHOTOVOLTAIC (PV) ENHANCEMENT FILMS FOR ENHANCING OPTICAL PATH LENGTHS AND FOR TRAPPING REFLECTED LIGHT

(75) Inventors: Mark A. Raymond, Littleton, CO (US); Howard G. Lange, Mount Prospect, IL (US); Seth Weiss, Cherry Hills Village, CO (US)

(73) Assignee: Genie Lens Technologies, LLC, Englewood, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/407,555

(22) Filed: Mar. 19, 2009

(65) Prior Publication Data

US 2010/0180929 A1   Jul. 22, 2010

Related U.S. Application Data

(63) Continuation-in-part of application No. 12/355,339, filed on Jan. 16, 2009.

(51) Int. Cl.
*H01L 31/042* (2006.01)
*H01L 31/00* (2006.01)

(52) U.S. Cl. ..................... 136/246; 136/257

(58) Field of Classification Search .............. 136/244, 136/246, 257; 264/210.1–210.4, 212, 284, 264/319; 156/209
See application file for complete search history.

(56) References Cited

U.S. PATENT DOCUMENTS

| 4,239,810 | A | | 12/1980 | Alameddine et al. |
| 4,620,364 | A | * | 11/1986 | Landis ........................ 438/71 |
| 4,711,972 | A | * | 12/1987 | O'Neill ........................ 136/246 |

(Continued)

FOREIGN PATENT DOCUMENTS

JP        6029562 A    2/1994

(Continued)

OTHER PUBLICATIONS

Smith et al., "Ray tracing analysis of the inverted pyramid texturing geometry for high efficiency silicon solar cells", Feb. 1993, Solar Energy Materials and Solar Cells, vol. 29, Issue 1, pp. 37-49.*

(Continued)

*Primary Examiner* — Basia Ridley
*Assistant Examiner* — Tamir Ayad
(74) *Attorney, Agent, or Firm* — Marsh Fischmann & Breyfogle LLP; Kent A. Lembke

(57) ABSTRACT

A solar energy conversion assembly for efficiently capturing solar energy by providing additional chances to absorb reflected sunlight and providing longer path lengths in the photovoltaic (PV) material. The assembly includes a PV device including a layer of PV material and a protective top covering the PV material (e.g., a planar glass cover applied with adhesive to the PV material). The assembly further includes a PV enhancement film formed of a substantially transparent material, and film is applied to at least a portion of the protective top such as with a substantially transparent adhesive. The PV enhancement film includes a plurality of absorption enhancement structures on the substrate opposite the PV device. Each absorption enhancement structure includes a light receiving surface that refracts incident light striking the PV enhancement film to provide an average path length ratio of greater than about 1.20 in the layer of PV material.

23 Claims, 31 Drawing Sheets

U.S. PATENT DOCUMENTS

| | | | |
|---|---|---|---|
| 4,918,030 | A | 4/1990 | Lamb et al. |
| 4,989,972 | A | 2/1991 | Braun |
| 5,080,725 | A | 1/1992 | Green et al. |
| 5,261,970 | A | 11/1993 | Landis et al. |
| 5,359,691 | A | 10/1994 | Tai et al. |
| 5,817,396 | A * | 10/1998 | Perlo et al. ............ 428/141 |
| 5,907,766 | A | 5/1999 | Swanson et al. |
| 6,252,155 | B1 | 6/2001 | Ortabasi |
| 6,335,479 | B1 * | 1/2002 | Yamada et al. ......... 136/251 |
| 6,840,636 | B1 | 1/2005 | Colvin |
| 6,958,868 | B1 | 10/2005 | Pender |
| 7,368,655 | B2 | 5/2008 | Blieske et al. |
| 7,394,016 | B2 | 7/2008 | Gronet |
| 7,664,350 | B2 | 2/2010 | Ghosh et al. |
| 7,672,549 | B2 | 3/2010 | Ghosh et al. |
| 2003/0029497 | A1 | 2/2003 | Tanaka |
| 2004/0123895 | A1 | 7/2004 | Kardauskas et al. |
| 2004/0165835 | A1 * | 8/2004 | Kaneko et al. ............ 385/88 |
| 2005/0039788 | A1 * | 2/2005 | Blieske et al. ......... 136/246 |
| 2006/0207646 | A1 | 9/2006 | Terreau et al. |
| 2007/0079864 | A1 | 4/2007 | Gronet |
| 2007/0125415 | A1 | 6/2007 | Sachs |
| 2007/0240370 | A1 * | 10/2007 | Thiagarajan et al. ......... 52/177 |
| 2007/0240754 | A1 | 10/2007 | Gayout et al. |
| 2008/0072956 | A1 | 3/2008 | Sharma et al. |
| 2008/0135091 | A1 | 6/2008 | Cheng et al. |
| 2008/0185034 | A1 | 8/2008 | Corio |
| 2008/0271776 | A1 | 11/2008 | Morgan |
| 2008/0289684 | A1 | 11/2008 | Moslehi |
| 2008/0308154 | A1 | 12/2008 | Cart et al. |
| 2009/0000656 | A1 | 1/2009 | Shembel et al. |
| 2009/0064993 | A1 | 3/2009 | Ghosh et al. |
| 2009/0067784 | A1 | 3/2009 | Ghosh et al. |
| 2009/0126792 | A1 * | 5/2009 | Gruhlke et al. ......... 136/259 |
| 2010/0147381 | A1 | 6/2010 | Haney et al. |

FOREIGN PATENT DOCUMENTS

JP             2001007371 A         1/2001

OTHER PUBLICATIONS

Landis, Geoffrey A "A Light-Trapping Solar Cell Coverglass", 1990, IEEE, 0160-8371/90/0000-1304, pp. 1304-1307.*

Scheydecker, A., et al., "Reduction of Reflection Losses of PV-Modules by Structured Surfaces" Solar Energy, vol. 53, No. 2, pp. 171-176, 1994.

Sistek, Hanna, posted by, "Improving Solar Efficiency by Coating Cells," Green Tech, Jul. 16, 2008, http://news.cnet.com/8301-11128_3-9993084-54.html, retrieved on Dec. 30, 2008.

"New Antireflective Coating Increases PV Conversion Efficiency" Posted Jul. 20, 2008, http://www.finishingtodaymag.com/copyright/BNP_GUID_9-5-2006_A_10000000000000..., retrieved on Dec. 30, 2008.

Knight, Matthew, "New Nano coating boosts solar efficiency" CNN.com/technology, http://www.cnn.com/2008/TECH/science/11/12/solar.coating/index.html, Nov. 12, 2008, retrieved on Dec. 30, 2008.

Bales, Jim, Ph.D., "Photo-voltaic system design and lab," SP.721 (D-Lab) Fall 2004, notes: Session 23.

Mulligan, William P., "Manufacture of Solar Cells with 21% Efficiency," SunPower Corporation, www.sunpowercorp.com/Smarter-Solar/the-SunPower-Advantage/-/media/Downloads/smarter_solar/bmpaper.ashx, retrieved on Dec. 30, 2008.

Tvingstedt, Kristofer, et al., "Trapping light with micro lenses in thin film organic photovoltaic cells" Dec. 22, 2008, vol. 16, No. 26/Optics Express 21608.

Sopori, B.L., et al., "Light-Trapping in a-Si Solar Cells: A Summary of the Results from PV Optics," NREL/ CP-520-25770, Apr. 1999.

International Search Report, dated Aug. 19, 2010; PCT/US2010/020597; from the Korean Intellectual Property Office.

Brendel, R., Simple Prism Pyramids: A New Light Trapping Texture for Silicon Solar Cells, Max-Planck-Institut fur Festkorperforschung, HeisenbergstraBe 1, 70569 Stuttgart, Germany, 0-7803-1220-1/93 IEEE, pp. 252-255.

Rand, James A., et al., "Light-Trapping Silicon Solar Cells Experimental Results and Analysis," CH2953-8/91/0000-0192 IEEE, pp. 192-197.

Smith, A.W., et al., "Texture: A Ray Tracing Program for the Photovoltaic Community," 0160-8371/90/0000-0426, 1990, IEEE, pp. 426-431.

* cited by examiner

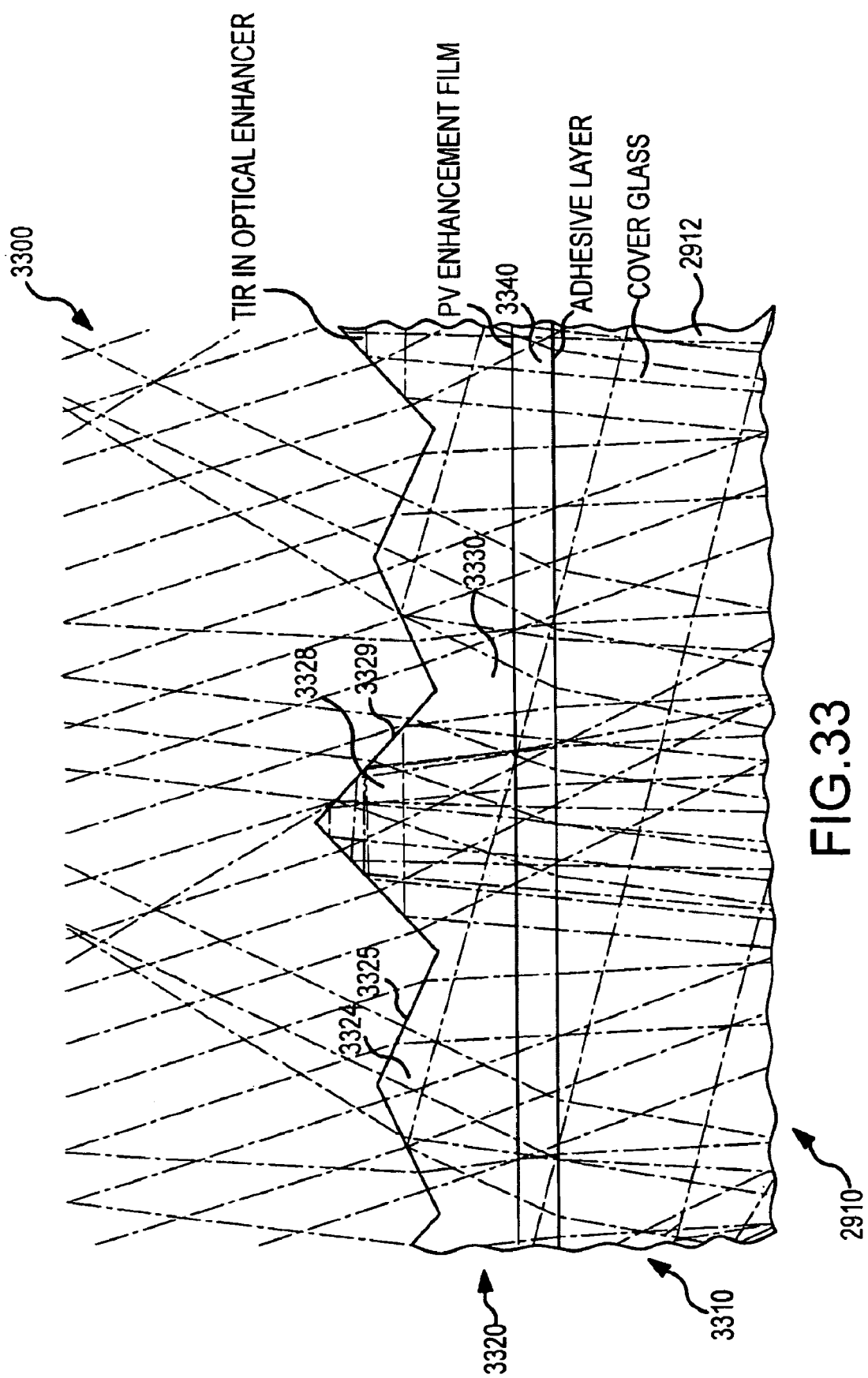

PHOTOVOLTAIC (PV) ENHANCEMENT FILMS FOR ENHANCING OPTICAL PATH LENGTHS AND FOR TRAPPING REFLECTED LIGHT

CROSS-REFERENCE TO RELATED APPLICATIONS

This application is a continuation-in-part of U.S. patent application Ser. No. 12/355,339 filed Jan. 16, 2009, which is incorporated herein by reference in its entirety.

BACKGROUND OF THE INVENTION

1. Field of the Invention

The present invention relates, in general, to devices and systems for converting solar energy into electricity such as devices using the photovoltaic effect to convert solar energy directly into electricity, and, more particularly, to a PV device such as a module, array, or panel of solar cells that includes a PV enhancement (or light trapping) layer or film to better trap or capture light or rays from the Sun that are incident on a front or receiving surface of the PV device to achieve enhanced absorption and conversion of the solar energy into electricity. The PV enhancement film is adapted to reduce reflection or loss of incident light when the Sun is normal to the front surface of a solar cell (or to the solar module, array, or panel) and also at oblique angles, thus reducing the need to track the Sun's position with the PV device including the PV enhancement film.

2. Relevant Background

With the growing interest in renewable energy including use of solar power, there is an increasing demand for more efficient solar cells. Solar cells or photovoltaic (PV) cells are devices that convert solar energy into electricity by the photovoltaic effect, and solar cells are widely used in devices ranging from satellites and other applications including portable consumer electronic devices that are remote from a conventional power source. More recently, large solar power collection systems with arrays of cells or PV modules (or solar panels) are being used to supply power to electrical grids for distribution to consumers. Several concerns are limiting the implementation of solar cells including cost of materials and manufacturing, environmental concerns with materials such as lead, and low efficiency of the cells. As a result, researchers continue to look for ways to lower manufacturing costs and for ways to enhance the efficiencies of solar cells and panels, modules, or arrays that include such cells. For example, existing solar cells, such as those based on a silicon substrate, typically have efficiencies of 10 to 20 percent, and, as a result, even small increases (e.g., of one to several percent) in efficiency may represent large relative gains in being able to convert solar energy into useful electricity (e.g., an increase in efficiency of 1 to 2 percent represents a 5 to 20 percent or higher gain in efficiency for a cell design). Even with these limitations, though, the manufacture and installation of solar cells and PV arrays has expanded dramatically in recent years. Some estimates indicate that PV production has been doubling every two years making it the world's fastest growing energy technology, with about 90 percent of the capacity being grid-tied electrical systems that are ground mounted (e.g., in solar farms) or on building roofs/walls. Concerns with global warming and financial incentives provided by world governments will likely only increase the demand for PV arrays and the demand for more efficient solar cells.

Solar cells or photovoltaics (or PV devices) convert sunlight directly into electricity and generally are made of semiconducting materials similar to those used in computer chips. When sunlight is absorbed by these materials, the solar energy frees electrons loose from their atoms, which allows the electrons to flow through the material to produce electricity. The process of converting light (i.e., photons) to electricity is called the photovoltaic (PV) effect. In practice, solar cells are typically combined into modules that hold numerous cells (e.g., up to 40 or more cells), and a set of these modules (e.g., up to 10 or more) are mounted in PV arrays or solar panels that can measure up to several meters or more per side, with each cell typically only being up to 100 to 150 square centimeters in size. These flat-plate PV arrays are mounted at a fixed angle facing the Sun (e.g., south) or they may be mounted on a tracking device that follows the position of the Sun to allow them to better capture the Sun's light throughout the day. Solar cells may be formed using thin film technologies to use layers of semiconductor materials that are only a few micrometers thick.

The performance of a solar cell is measured in terms of its efficiency at turning sunlight into electricity. Only sunlight of certain energies will work efficiently to create electricity and much of this desirable energy sunlight may be reflected from the surfaces of the solar cell or absorbed by its materials without creating electricity. Due to these and other areas for loss of sunlight, a typical solar cell may have an efficiency ranging from about 5 to 20 percent, with some highly efficient solar cells claiming efficiencies of up to 22 percent or higher. For example, an energy conversion efficiency of 22 percent was announced in 2007 as being a world record event for a practical-sized (e.g., about 100 $cm^2$), crystalline silicon-type solar cell (e.g., an HIT solar cell composed of a single thin crystalline silicon wafer surrounded by ultra-thin amorphous silicon layers). Low efficiencies mean that larger arrays are required to provide a particular amount of electricity, which increases the material and manufacturing costs. As a result, improving solar cell efficiencies while holding down the cost per cell continues to be an important goal of the solar power industry.

Even when a PV array is positioned normal to the Sun's rays, sunlight is reflected or lost to a typical solar cell, with estimates at 5 to 33 percent or more of the light being spectrally reflected and lost. In some cases, the solar cells may be protected from the environment with a glass sheet or with transparent plastic packaging. Significant efforts have been made in the solar power industry to boost efficiency by reducing reflection when the sunlight is incident at a normal angle (or when the angle of incidence is at or near zero degrees) on the PV array. Typical solutions have called for application of an antireflection coating of a material such as a $SiN_x$ layer or the like on the cell and/or upon the protective glass/plastic layer to minimize the reflection of light from this protective layer. The AR coating provides a layer or layers of material with a desirable refractive index and thickness (e.g., a quarter wavelength) to lessen reflection of sunlight at the coated surface (e.g., the planar surface of the sheet of protective glass). In some embodiments, the AR coating may be a metal fluoride combined with silica (e.g., a flouropolymer), a zinc or other metal oxide (or other transparent conductive oxide), or other material layer. Recently, coatings formed of a single-layer of porous silicon oxide have been applied to a protective glass layer to decrease glass reflection by about 3 percent at noon and by about 6 percent in mornings and evenings (e.g., when the sunlight strikes the solar cell at an oblique or non-zero incident angle). Additionally, other AR coatings are being developed including textured-dielectric coatings and multi-layered, nanostructured coatings (e.g., seven layers of silicon dioxide and titanium dioxide nanorods). While providing some improvements in light capture and efficiency of solar cells, existing AR coatings generally are most useful in controlling reflection of sunlight when the sunlight is striking the PV array at normal (e.g., near noon for many arrays) and do little to limit other types of reflection or bounce back losses.

As discussed above, the largest problem with the rapidly developing technology of photovoltaics revolves around cost-versus-efficiency. Whether traditional silicon materials are used or newer cadmium telluride or copper photovoltaic constructions are used, efficiencies are still a significant limitation on solar cell use and adoption by consumers and the power industry. While multiple-layered more expensive PV cells that are designed for concentrator systems or to absorb a wider variety of wavelengths (including the longer wave lengths) are significantly more efficient, the more elaborate and expensive multi-layer PV materials also result in increased ray loss at angles other than nearly perfect toward the Sun in both axis. This additional loss is caused by increased ray deflection as a result of cosine fall off as well as the narrow acceptance angles required by the complexity of the PV structures as they attempt to use more of the available wave lengths.

Losses in absorption into PV materials are caused by several factors. One of the factors is normal "cosine fall off" or the lack of absorption due to the incoming angle of the sunlight and the relationship of the incoming rays to the structures in the PV materials. For example, a typical solar cell will have an upper or front surface that is not perfectly planar but is instead textured or rough. This results in many of the rays simply being deflected off of the surface of the PV materials and not being absorbed. However, this phenomenon also happens even when sunlight or rays are directed directly into the PV materials at zero degrees or at a perfect angle into the PV material. Part of the reason for the deflection of the rays is that the structures within the PV materials are not flat and are for the most part three-dimensional. Incoming rays, even when perfectly aimed, are bouncing off these structures (e.g., are reflected) and are never absorbed by the solar cell.

Hence, there remains a need for improved solar cell devices/products such as PV arrays that better control reflection and/or increase the amount of incident sunlight that is absorbed by the solar cells. Preferably, the improved solar cells would have improved energy conversion efficiencies with or without tracking of the Sun's position, and the solar cells and PV arrays of solar cells would not be significantly more expensive to manufacture or require redesigns/modification of the underlying solar cell configuration or makeup.

SUMMARY OF THE INVENTION

The present invention addresses the above problems by providing photovoltaic (PV) enhancement films for use with solar panels/arrays and solar cells (or other PV devices) to increase the efficiency of the PV materials in absorbing available solar energy. Specifically, the PV enhancement films are designed to increase the efficiency of the PV materials (or PV device) by modifying or enhancing the optical path length of received or incident light through the PV material for better absorption. The PV enhancement films may combine this function of increasing (or even optimizing) path lengths with an ability to capture or trap light reflected from light-receiving surfaces of solar cells that normally would be lost and direct this reflected light back onto the light-receiving surfaces (often at a different incidence angle) for second or additional chances for absorption and conversion into electricity. The trapping or redirection of the light is achieved through the use of total internal reflection (TIR), and the PV enhancement films act to pass most incident light onto the light-receiving surface (without significant focusing) and then trap a significant portion of reflected light back to the light-receiving surface.

The PV enhancement films maybe formed of a plastic, glass, ceramic, or other substantially transparent material (e.g., highly light transmissive material such as an energy-cured polymer) and include a thin substrate upon which a plurality of elements or structures are formed (or provided). These elements may be termed TIR structures or elements while also functioning to provide optical path length modification, and, hence, these structures or elements are also labeled as absorption enhancement structures or elements herein (i.e., wherever the term TIR structure is used in this description the term absorption enhancement structure may be substituted as a structure designed to provide TIR also will typically provide at least some amount of desired path length lengthening). The TIR or absorption enhancement structures may be chosen to provide a combined functionality: (a) to optimize or increase the optical path length of light passing through the PV materials and also (b) to provide at least some capture of reflected light such as via TIR or the like. In this manner, the absorption enhancement structures increase absorption for light passed to the PV material while also capturing a portion of the light that may be lost due to reflection to increase absorption by providing second, third, or more chances to absorb light reflected from the PV device layers (such as from the light receiving surface of the PV materials such as a thin film of PV material).

Each of the absorption enhancement elements is designed to receive and transmit the received light with a modified direction/angle to modify path length and then to direct reflected light from the solar cell back to its light-receiving surface for possible absorption. For example, the absorption enhancement elements are elongated structures that are provided with a sawtooth pattern on a side of the substrate with the triangular cross section absorption enhancement elements each providing two facets to alter the path of incident light and to trap reflected light via TIR. In other cases, the absorption enhancement elements are three-dimensional (3D) structures on the surface of the substrate that each act to alter the path of incident light to provide an enhanced optical path length through the PV materials and to also reflect back otherwise lost sunlight, e.g., a plurality of hemispherical/dome shaped bodies, full or truncated cone shaped bodies (frustoconical shapes), three-sided or four-sided (or more-sided) pyramids (coming to a true point/apex, to a flat/planar side/facet, to a curved, domed, or hemispherical point, or other termination), and so on. Through modeling with ray tracing computer programs, it is believed likely that the PV enhancement films will provide better optimized optical path lengths of received light and to capture enough reflected light to significantly increase efficiencies of solar cells, solar arrays, and the like. For example, modeling indicates that use of some embodiments of the PV enhancement films will increase efficiencies up to 10 percent while other implementations may increase efficiencies up to 35 percent or more (such as in solar arrays with no tracking and with larger reflection losses during off-peak hours and in arrays with very thin films in which increased path lengths improve the amount of absorption).

More particularly, a solar cell assembly is provided for more efficiently capturing solar energy. The assembly includes a PV device including a layer of PV material and a protective top covering the PV material (e.g., a planar glass cover applied with adhesive to the PV material). The assembly further includes a PV enhancement film formed of a substantially transparent material (such as a glass, a plastic, a ceramic, or the like that passes a substantial percentage of received light through), and the film is applied to at least a portion of the protective top such as with a substantially transparent adhesive. The PV enhancement film includes a plurality of absorption enhancement structures on the substrate opposite the PV device. Each absorption enhancement structure includes a light receiving surface that refracts incident light striking the PV enhancement film to provide an average path length ratio of greater than about 1.10 in the layer of PV material over a range of incidence angles. The average path length ratio may be determined as an average of path length ratios determined within the range of incidence angles, with each ratio calculated by dividing the length of the path of the refracted incident light through the PV material by the length of the path of the incident light traveling through the PV material in the absence of (or without use of) the PV enhancement film. Such ratios may be determined in some cases based on ray tracings performed at a set of angles within the range of incidence angles taking into account the configuration of the PV enhancement film and its structures and also The range of incidence angles may be selected from the range of plus/minus 80 degrees as measured from an orthogonal plane passing through a light-receiving surface of the PV material. In some cases, though, the range of incidence angles is plus/minus 40 degrees, plus/minus 20 degrees, or even plus/minus 10 degrees to better enhance absorption by the PV material when sun light is at its greatest intensity (and most of the Sun's energy is collected by solar cells or PV devices). The structures may be configured to obtain average path length ratios that are greater than 1.2 in the layer of PV material over the range of incidence angles (or a subrange within the overall range of incidence angles such as from −20 to +20 degrees or the like) while other embodiments provide ratios of 1.5 or better. The structures may also be designed to provide TIR to direct a portion of light reflected from the PV material (or other surfaces) back toward the PV material for possible absorption, and, in this manner, the structures may increase absorption or efficiency of the PV material by either increasing path length or providing TIR or by providing both of these functions in the same or differing portions of the range of incidence angles. The PV material layer may take many forms such as the PV material found in a crystalline silicon solar cell. In other cases, the PV material may be provided by materials/layers found in a thin film solar cell and comprise amorphous silicon, microcrystalline silicon, cadmium telluride, copper indium gallium diselenide (GIGS), organic PV cell material(s), and the like. The PV enhancement films provide especially good improvement results for amorphous and microcrystalline silicon films but are also expected to be very useful with transparent conducting oxide (TCO) thin films or substrates.

In one embodiment, adjacent ones of the absorption enhancement structures have one of two differing configurations with one configuration chosen to provide better path length enhancement (lengthening in the PV material) in one portion of the range of incidence angles and the other configuration chosen to provide better path length enhancement in a second portion (typically, differing from, but possibly overlapping with, the first portion). In one embodiment, the structures are mixed or alternated in a sawtooth-like pattern with differing height triangular cross sections with similar bases/pitches, e.g., pitches or bases of less than about 15 mils (such as about 13 mils) and heights of less than about 11 mils with one set of structures being less than about 8 mils while the other set is between 8 and 11 mils (e.g, one set of structures may be about 7 mils in height or thickness while the other set is about 10 mils in height). In this manner, each structure acts to provide a more desirable or adequate path length for optimized light capture in the PV material or layer for a portion or subrange of the overall range of incidence angles. For example, a first configuration (e.g., height of about 7 mils) being better at increasing path length when the absolute value of the incidence angle is greater than about 20 degrees while the second configuration may be more effective (as compared to the first configuration) at increasing path length when the absolute value of the incidence angle is less than about 20 degrees.

According to another aspect, one embodiment provides a solar cell assembly for more efficiently capturing solar energy by providing additional chances to absorb reflected sunlight. The assembly includes a solar cell (note in a solar array assembly a plurality of solar cells would be included in the assembly). The solar cell includes a light-receiving surface, and a fraction or percentage of light incident upon the light-receiving surface is reflected over a predefined range of incidence angles (e.g., most light may be absorbed in the range of −10 to 10 degrees, but at more oblique angles of incidence such as greater than 10 degrees and less than −10 degrees, greater and greater portions of the light striking the solar cell may be reflected). Significantly, the solar cell assembly includes a PV enhancement film formed of substantially transparent material (such as a light-transmissive plastic) positioned to cover or abut at least a portion of the light-receiving surface (and, more typically, to cover most or all of the light-receiving surface). The PV enhancement film includes a substrate positioned proximate to or abutting (except for an optional adhesive layer affixing the film to the solar cell) the light-receiving surface. The film also includes a plurality of total internal reflection (TIR) elements on the substrate opposite the light-receiving surface. Each of the TIR elements is designed to direct at least a portion of the reflected light back toward the light-receiving surface of the solar cell.

The TIR elements transmit the light incident (or most of this received light) to the light-receiving surface (e.g., do not block or focus this light) and also direct the portion of the reflected light back to the light-receiving surface using TIR as the reflected light strikes one or more sides of the TIR elements. Each of the TIR elements may have a linear or elongated body with at least two inward angled sides. For example, the TIR elements may have triangular cross sections (e.g., as viewed on end) with sides angled inward at angles of less than about 60 degrees (e.g., of less than about 45 degrees). The TIR elements may be of like size and shape, or the TIR elements may have differing sizes (and/or shapes) such that alternating ones have differing thicknesses for example (or alternating sets of the TIR elements may be configured differently) to tune the optical effect achieved (i.e., differing TIR elements may provide better TIR trapping effects at differing incidence angles and it may be useful to select two or more of such TIR elements in a single PV enhancement film). In another example, the TIR elements are linear but include three, four, or more facets/sides such as two inward angled sides with an upper planar side positioned therebetween that is parallel to the light-receiving surface (e.g., similar to a cross of a pyramid structure). In other embodiments, the PV enhancement film may include a light receiving and trapping surface that defines the TIR elements, and this surface may have a sinusoidal shape when viewed along an edge of the PV enhancement film (e.g., to provide elongated TIR elements with a sinusoidal sectional shape). In other embodiments, the TIR elements are provided on a surface of the substrate opposite the light-receiving surface and have 3D bodies with a shape selected to provide a desired TIR effect (such as a plurality of pyramids or 3 to 4 or more-sided pyramid shapes protruding from a substrate or sheet, numerous hemispherical shaped bodies or domes, a number of cones or truncated cones, and the like). The PV enhancement film may be relatively thin and the TIR elements small to achieve the TIR trapping effect, and, in one embodiment, the TIR elements each has a base and a height less than about 10 mils in magnitude.

BRIEF DESCRIPTION OF THE DRAWINGS

FIG. 33 illustrates a ray tracing in a solar cell assembly or enhanced PV device in accordance with an embodiment of the invention utilizing two absorption enhancement structures arranged in a mixed or alternating sawtooth pattern on the surface of the PV enhancement film, with each structure providing path length improvements or increases over a range of incidence angles but one structure being chosen specifically to enhance path lengths in the range of about plus/minus 20 degrees or a weak spot/range or gap in the path length enhancement capability of the other structure.

DETAILED DESCRIPTION OF THE PREFERRED EMBODIMENTS

Figure 1:
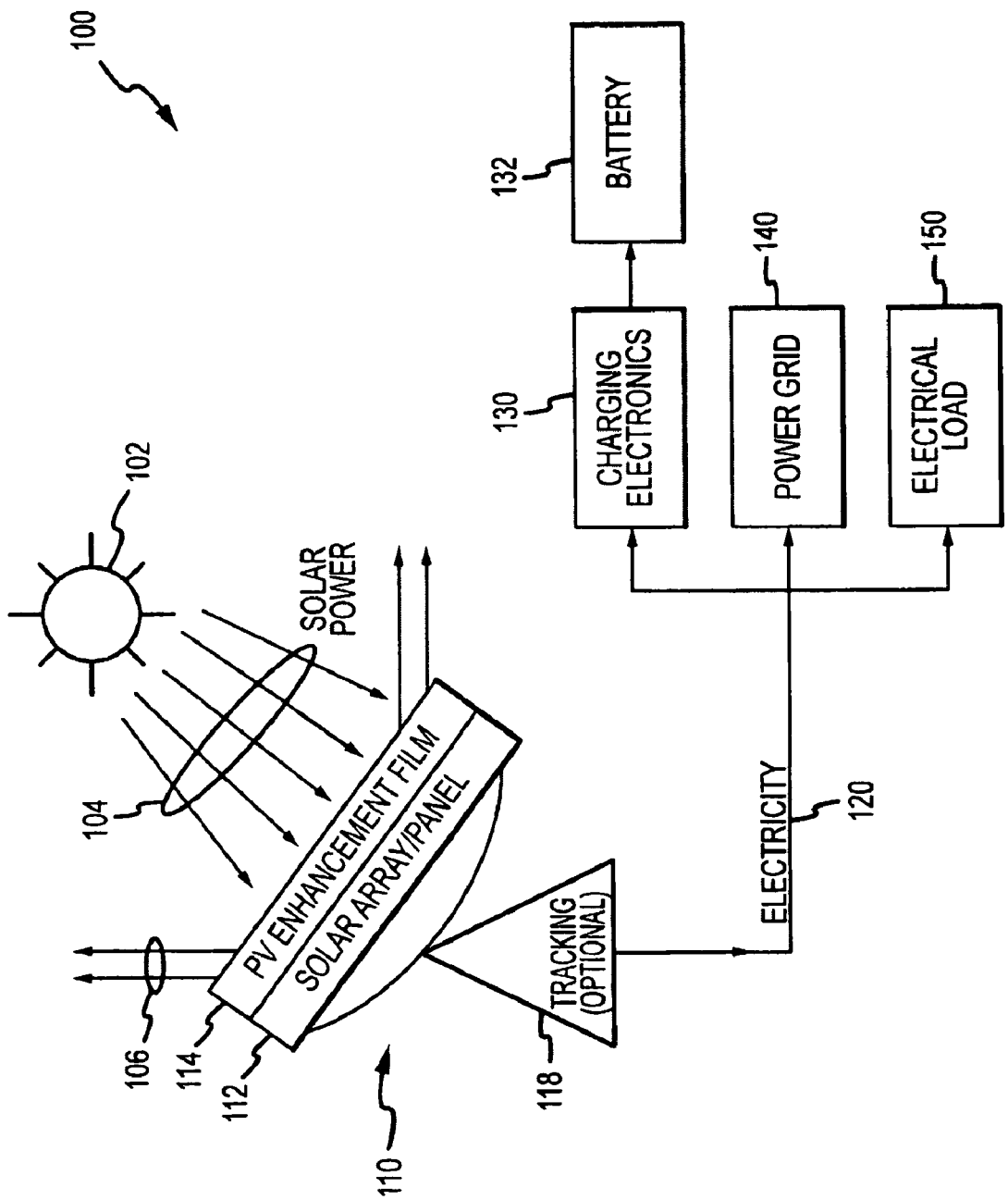
FIG. 1 is a functional block illustration of a solar energy conversion system of an embodiment of the invention showing generally use of a PV enhancement film(s) on a solar panel or array, with the PV enhancement film taking any of the forms described herein to reduce reflection or bounce back of sunlight or the Sun's rays via TIR techniques.

Generally, the present invention is directed to photovoltaic (PV) enhancement films for use in solar panels, arrays, or modules (or with individual solar cells or other PV device) to improve solar efficiencies. The PV enhancement films are adapted to be applied to existing solar arrays, panels, or modules and/or used with solar cells/PV devices during initial manufacture. The PV enhancement films each include a substrate of plastic, glass, or ceramic (e.g., a substantially transparent material such as a thin polymeric film or the like) with a plurality of structures or elements on one surface that are shaped and sized to provide modify/change the direction of received or incident light to provide a more desirable path length (e.g., to make the path length more optimal for absorption of the Sun's energy by the PV materials of a PV device such as a solar array) and also to provide total internal reflection (TIR) to trap or capture at least a portion of light reflected from the light receiving surfaces of the PV materials or of the PV device (such as from the protective glass layer covering).

Herein, these structures or elements will be interchangeably labeled absorption enhancement structures/elements and TIR structures/elements. In part, this terminology is used because initial investigations were mainly directed toward optimizing TIR to improved improve the efficiency of PV devices, but experiments and studies (such as computer modeling) showed that selecting a structure shape and size to provide a longer path length (e.g., an "optimal" or "optimized" path length) may be more or at least equally important as capturing reflected or otherwise lost sunlight. To this end, efforts to provide the absorption enhancement structures on the PV enhancement films turned toward providing both TIR and more optimized optical path lengths, such as with a single structure design or a film with two or more structure designs providing differing functionality such as alternating structures in an alternating sawtooth pattern with a first structure providing better TIR and a second structure providing better path length improvements (e.g., maximize length for a particular arrangement of PV enhancement film, protective glass element, adhesive layer(s), and PV material).

The PV enhancement film may be attached to a solar array such that the absorption enhancement structure-side faces the Sun and the opposite (typically planar) side abuts the light receiving side and/or surfaces of the solar cells in the solar array (e.g., attached with adhesive to PV material of a solar cell, to a protective glass coating or element, to a layer of AR material(s), or the like). The absorption enhancement structures are each adapted to create TIR directionally toward the photovoltaic structures of the solar cells to enhance performance of the solar array (or individual PV device) by deflecting unabsorbed photons back toward the photovoltaic structures for a second (or additional) chance for absorption and conversion into electricity. Briefly, in this regard, each absorption enhancement structure on the PV enhancement film acts to allow incident sunlight to pass relatively unhindered to the solar cells of the array, and, then, to trap a substantial fraction of the reflected or bounced back light with TIR causing the initially unabsorbed sunlight or rays to be returned at least one more time to the solar cell (with some rays being directed to the solar cell 2 to 5 times or more before they are either absorbed or escape the PV enhancement film and the solar array that includes such a film). Significantly, each absorption enhancement structure also acts to redirect the light so as to change its path as it passes through the absorption enhancement structure to strike the light receiving surface of the PV material (and as it passes through intervening layers of material such as an adhesive attaching the PV enhancement film to the PV device, a protective element such as a glass layer, one or more layers of AR materials, another adhesive attaching the glass/AR to the PV material or its light receiving surface, and so on). By careful selection of the shape and size of the absorption enhancement structure, the optical path length of the incident light may be matched to the PV material/PV device to enhance or improve the portion or fraction of the received light that is absorbed within the PV device (e.g., "optimize" the path length to increase PV device efficiency typically by maximizing the path length for a range of angles of incidence such as plus or minus 40 degrees, plus or minus 30 degrees, plus or minus 20 degrees or the like).

The shape of the absorption enhancement structure may vary widely to practice the invention with some absorption enhancement structures being linear with a triangular, a polygonal, an arcuate or other cross section while others are non-linear with a variety of shapes such as pyramids (three, four, or more angled sides with/without an apex (e.g., a flat or shaped peak rather than a point)), domes, cones, frustoconical shapes, and hexagonal shapes (e.g., textured surfaces with domes or other side-by-side absorption enhancement elements on a surface of a sheet or film of transparent material). The angles defined by the light-receiving/trapping surfaces of the absorption enhancement structures may also vary widely from about −5 to +5 degrees with angles in the −45 to 45 degree range being desirable in some cases. Also, the size of the absorption enhancement structures may be varied to practice the invention with some embodiments utilizing absorption enhancement elements as small as about 0.25 mils (5 microns) in width while others use absorption enhancement elements up to 1 inch or more in width. The height (or thickness) may also vary again with some embodiments being very thin (e.g., about 0.25 mils or 5 microns in height) while others are relatively thick (e.g., up to about 1 inch or more in height). In one exemplary embodiment, a two or three-faceted absorption enhancement structure is utilized that is about 2 mils high and about 1 mil wide at the top planar facet or side of the structure (with the base width or pitch varying with the inward angle of the side(s) of the structure.

The following description begins with a description of use of structures/elements of PV enhancement films for providing increased TIR (e.g., with reference to FIGS. 2-24 with FIG. 1 showing a solar energy conversion system that may use any of the PV enhancement films described herein in solar array or panel 112). However, with this description fully understood, it will be clear to one skilled in the art that absorption enhancement structures/elements optimized for TIR also provide increases in path length in the PV material (just as absorption enhancement structures optimized for optical path length also provide a substantial amount of light capturing functionality) such that the TIR structures of the figures are absorption enhancement structures useful for improving path lengths. The description then continues with a more detailed look at optimizing the PV enhancement films for optimizing ray path length into the PV materials, e.g., beginning after the discussion of FIG. 24 and with reference to FIG. 25 and on. Prior to turning to this more detailed discussion, it may be useful to more generally describe aspects of one or more embodiments of the present invention.

Through efforts to improve PV device efficiency, the inventors have designed and fabricated PV enhancement films with absorption enhancement structures (of a variety of form and size). The PV enhancement films improve the efficiency in at least two ways: (1) by recycling reflected rays through TIR such as with absorption enhancement structures optimized to create TIR and (2) by optimizing or at least improving the desired path length into the PV materials such as with absorption enhancement structures configured to alter the path of the incident light so as to obtain a desired angle of incidence of the rays upon the PV material light receiving surface to increase (or even substantially maximize) the length of the path the light takes as it passes through the PV material for a range of angles of incidence (e.g., for the Sun directly above a panel to plus or minus some amount such as plus or minus 20 to 40 degrees or the like to better collect the Sun's energy at its highest intensities). Typically, the "optimized" path length for a ray of light is the optical path length through the PV material (such as through a thin film silicon-based PV cell or the like) that is the longest distance through the PV material. In contrast (or without use of the absorption enhancement structures), the path length may be near to the shortest path such as at noon or when the Sun is directly above a solar panel or array (and at its highest intensity) and incident light may pass through the material on an orthogonal path (e.g., the path length only equal to the thickness of the PV material).

Structures or elements on the PV enhancement films may be optimized both for TIR and for increased path length through the PV materials for various incoming ray angles (azimuth) and/or by time of day (e.g., may be more useful to increase path length during prime energy collection periods such as 10 AM to 2 PM, 9 AM to 3 PM, or some other time period of expected higher Sun energy intensities and to enhance TIR at other times). In addition, the rays may have their paths modified or be redirected by the absorption enhancement structures/elements to improve performance of the PV materials or of the PV device at specific band gaps that are customized for the particular PV materials (e.g., shaping/sizing of the absorption enhancement structures may be selected to suit the PV materials, which may involve not simply maximizing the length of the optical path in some cases).

To assist in selecting a configuration for the absorption enhancement structures for a PV enhancement film, a structure optimization module, which is typically implemented as a computer program or software run by one or more processors on a computer or computing device to transform a set of input variables to determine, store in memory, and/or display an output (e.g., a structure design including shape and size), has been created and used by the inventors. Specifically, various data including refractive indexes and thicknesses of the various materials are chosen and provided to the running structure optimization module (e.g., a user interface such as a GUI, a command line interface, or the like is displayed to a user on a computer monitor screen and the user enters refractive indexes and thicknesses of PV enhancement film, a protective glass, one or more layers of adhesive, and PV material(s)). Another input provided to the structure optimization module or tool is a range of incidence angles or incoming ray or sun angles for use in optimization (e.g., plus or minus 40 degrees or the like with 0 degrees being perpendicular to the PV material's light receiving surface). In other words, the absorption enhancement structures are optimized or selected by the structure optimization module specifically for a range of incoming ray angles. The processor(s) or computer makes calculations for or grinds through all of the angles, e.g., at each angle by whole degree/radian, fraction of a degree/radian, some preset degree offset (such as for each 2, 3, 4 degrees and so on, or the like) for the user-defined PV devices or PV assembly with and without the use or application of the PV enhancement film to determine an absorption enhancement structure (or combination of such structures when using more than one in a single PV enhancement film) that provides an improved optical path length (e.g., a longest path length, a correct path length for a particular range of band gaps, and so on) for the PV material. In some cases, the structure optimization module or tool acts to process numerous (e.g., millions to billions) combinations over several hours of processing time to determine a result such as an absorption enhancement structure or combination of such structures with side angles (shape, size, and so on in some cases) that optimizes path length.

Figure 4:
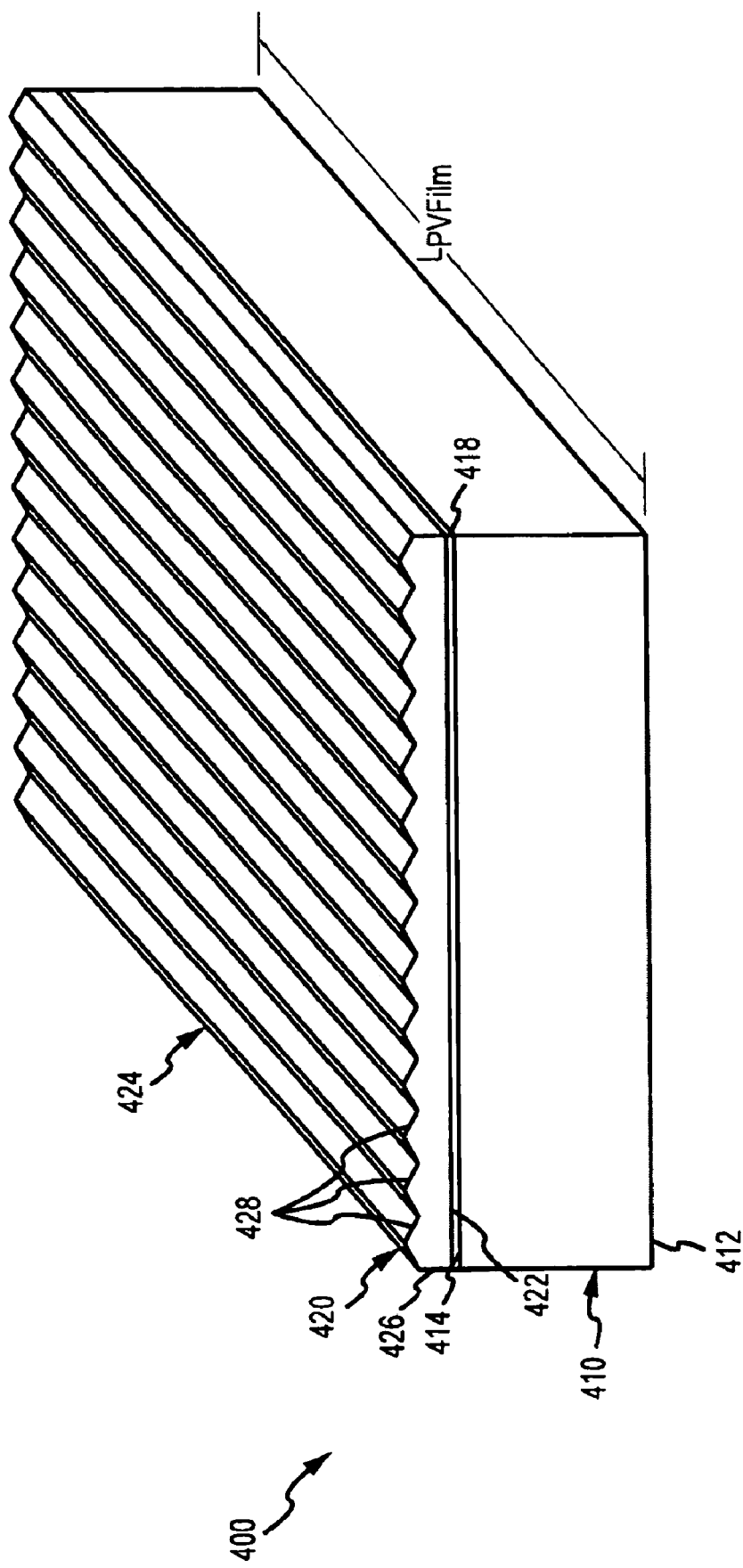
FIG. 4 illustrates a perspective view of a solar cell assembly including a PV enhancement film or layer in accordance with one embodiment of the invention with linear or elongated TIR structures or elements.
Figure 5:
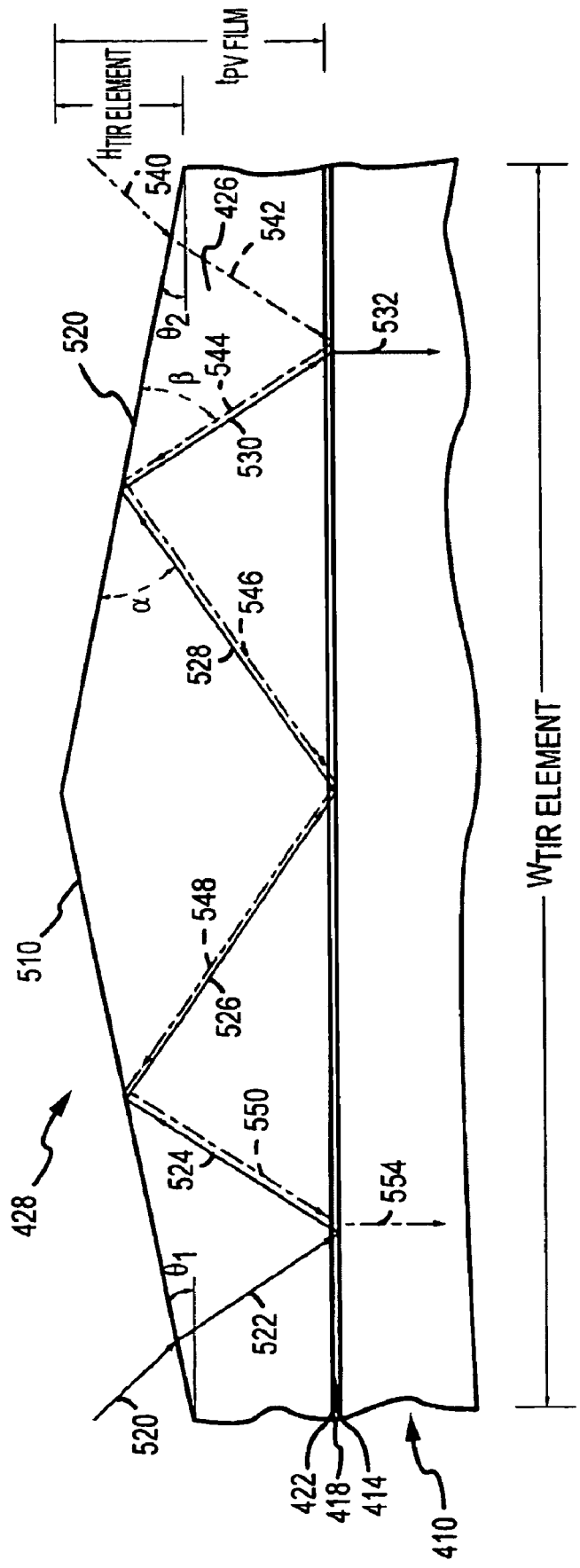
FIG. 5 illustrates an enlarged or detailed partial end view of the solar cell assembly of FIG. 4 showing in more detail a single TIR structure or element during use to trap rays or sunlight reflected or bounced back from a solar cell receiving or front surface to enhance rate of absorption of available solar energy by the solar cell.

In some embodiments, a PV enhancement film may be provided with a single absorption enhancement structure design such as elongated structures with a triangular cross section as shown in FIGS. 4 and 5, for example. However, use of the structure optimization module or tool of one or more embodiments of the present invention has shown that it may be useful to combine two or more absorption enhancement structures that are each designed to provide optimization for differing ranges of angles of incoming/received sunlight and/or to provide differing functionality (e.g., one set of absorption enhancement structures may be designed for optimizing optical path length over a particular range of angles of incidence while another set of absorption enhancement structures may be designed for providing improved TIR, which may be more important at incidence angles outside the range of angles used in designing the first set of structures or may overlap this range by providing TIR enhancements in this range of angles, too).

Figure 25:
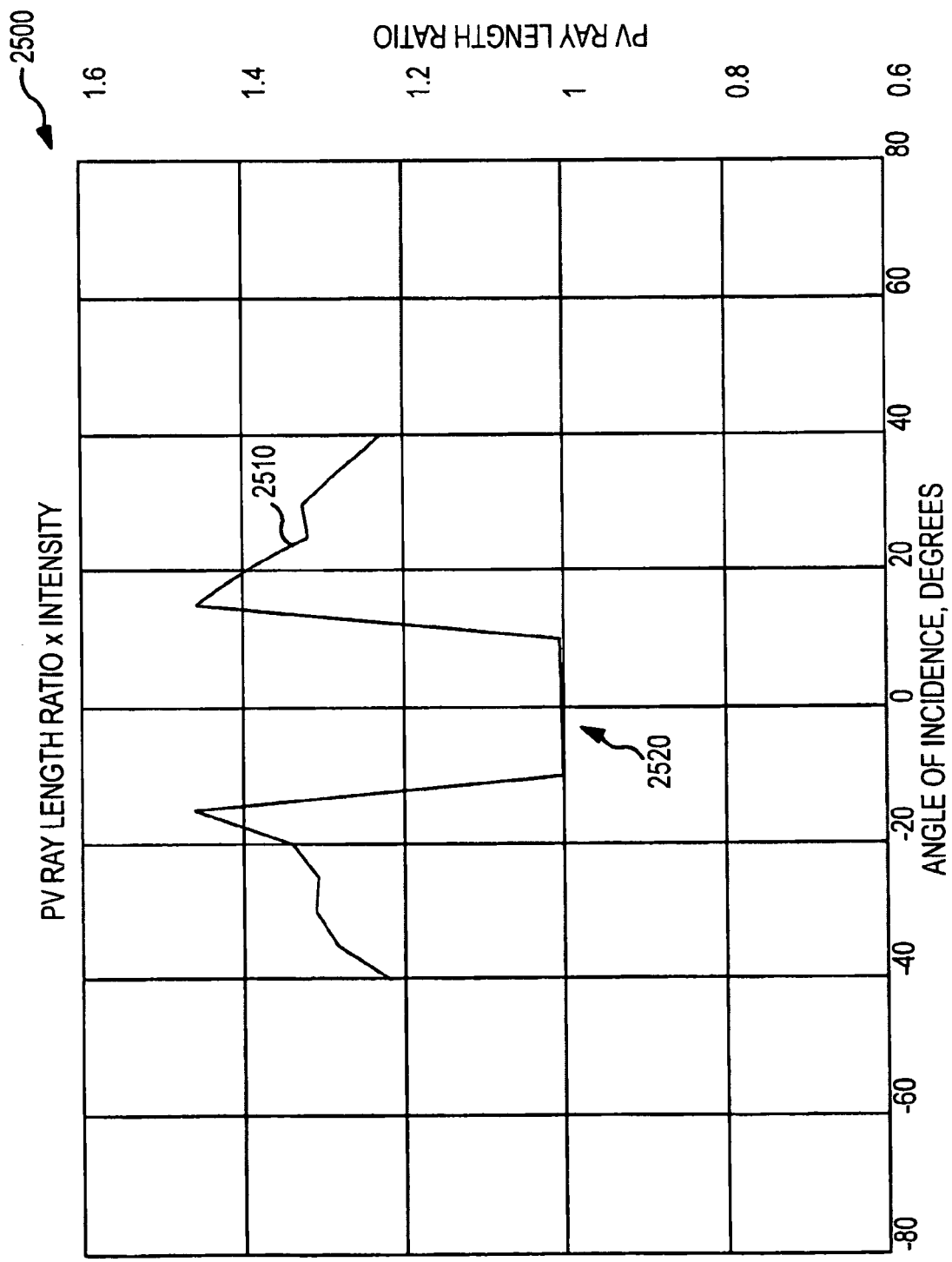
FIG. 25 is a graph showing PV ray length ratios as a function of angle of sunlight upon one PV enhancement film in accordance with an embodiment of the invention.

For example, optimization of an absorption enhancement structure for use with a PV enhancement film for a first range of angles may provide an overall improvement of path lengths relative to the PV device without such a film (sometimes with huge improvements achieved in particular narrow ranges). However, the absorption enhancement structure may have a range of incidence angles where no or little improvement is achieved (e.g., a range of weakness). The inventors found such a situation when a PV enhancement film with absorption enhancement structures optimized/configured for optimizing path length over a range of −40 degrees to +40 degrees. The PV enhancement film was fabricated of a plastic with an index of refraction of 1.49 and each absorption enhancement structure was elongated (such as shown in FIGS. 4 and 5) with a pitch of 13.333 mils and a thickness of 7 mils. FIG. 25 shows a graph 2500 showing path length ratio in PV material compared with angle of incidence on the PV device, with the path length ratio determined at a particular angle of incidence by dividing path length with use of the PV enhancement film by path length without use of such a film and its structures (e.g., with a ratio of 1 showing that the path length had not changed with the addition of the PV enhancement film). As shown with line 2510, significant improvements in optical path are achieved for angles of incidence with absolute values over about 10 degrees while an area of no change or "weakness" is found in the range of angles of about −10 to about +10 degrees as shown at 2520. The average length ratio was found to be 1.231, which indicates that inclusion of the PV enhancement film with absorption enhancement structures designed as shown in FIGS. 4 and 5 with the above defined triangular shape is desirable for providing enhanced path lengths (an average length ratio of 1.231 was achieved) and increasing the efficiency of a PV device.

Figure 23:
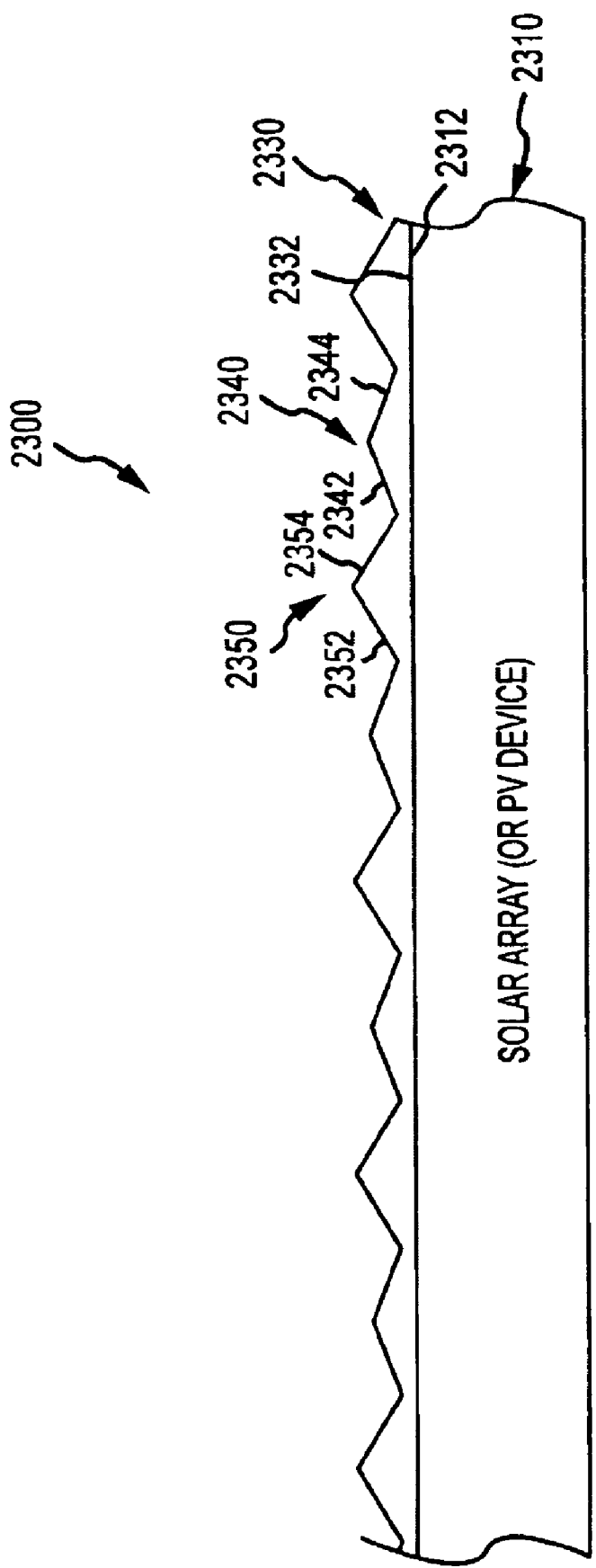
FIG. 23 is a schematic end view of a solar array assembly including a PV enhancement film with TIR structures with two designs that are alternated across the PV enhancement light-receiving/trapping surface.

However, the inventors further understood that such a pattern as shown by line 2510 with a weak or low improvement zone 2520 may be less than optimal for a PV enhancement film design. This may be improved upon by providing two or more configurations or designs for the absorption enhancement structures provided upon the PV enhancement film. For example, FIG. 23 shows the use of a sawtooth pattern of elongated, triangular-cross section structures with alternating configurations that may be used to address the weak spot 2520 shown in FIG. 25. One set of the structures may be chosen to provide the ratios as shown in FIG. 25 or optimizing path length over plus or minus forty degrees while the second set of structures may be chosen to increase the ratios within the weak spot or the second angle of incidence range of plus or minus 10 degrees. This is significant because it may be desirable to optimize path length of light through the PV materials during the "prime real estate" in solar energy collection, which typically equates to the time from about 10 AM to 2 PM during each day and/or about plus or minus forty degrees. Increasing performance during this prime time of energy collection by even a few percentage points may result in much larger overall increases in the effectiveness and/or efficiency of a PV device.

Figure 26:
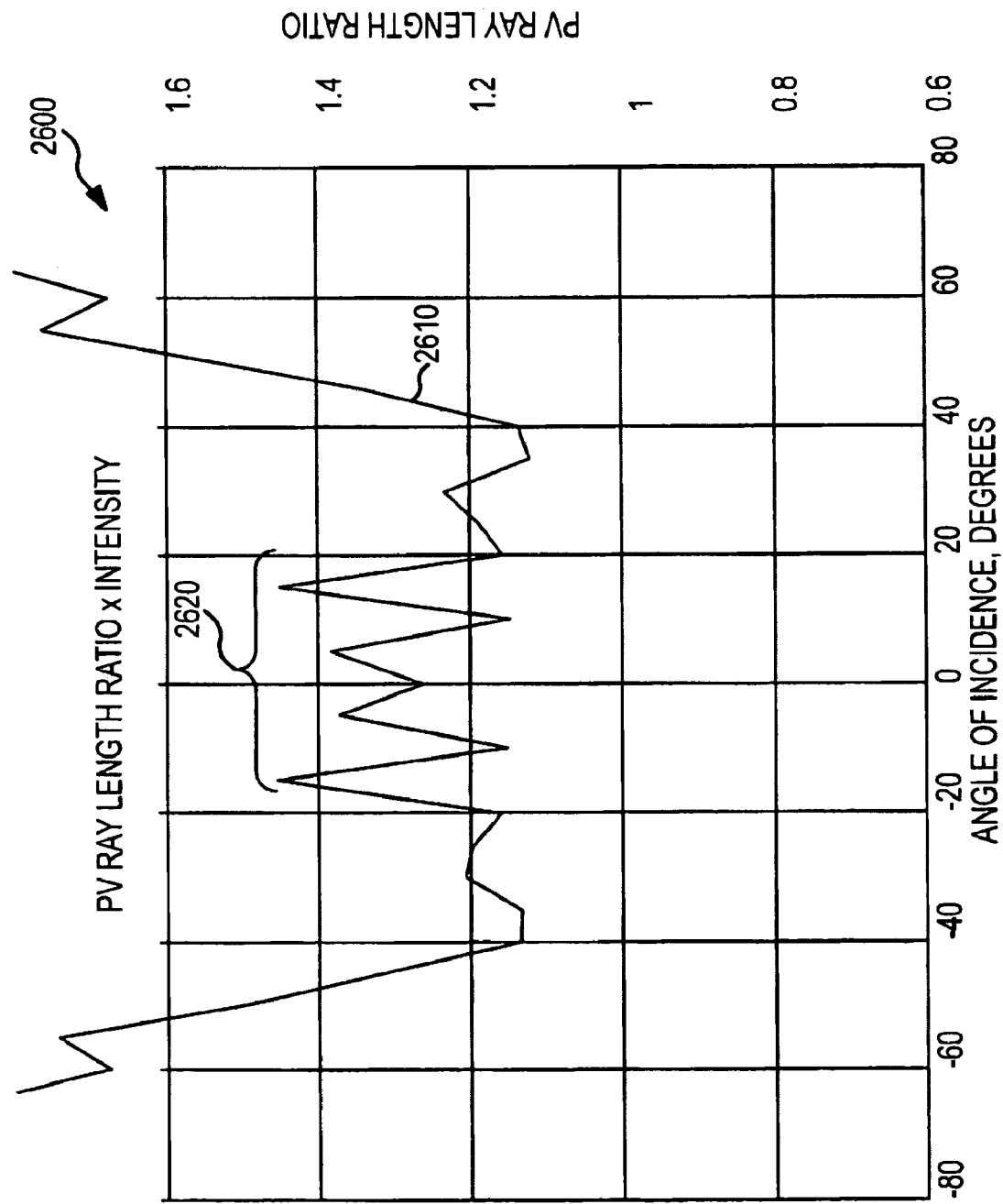
FIG. 26 is a graph similar to the graph of FIG. 25 showing PV ray length ratios as a function of angle of incidence upon another embodiment of a PV enhancement film that combines two absorption enhancement structures designs arranged in an alternating sawtooth pattern.

With these goals in mind, FIG. 26 shows a graph of ray path length ratios versus angle of incidence for a solar cell assembly or PV device of an embodiment in accordance with the invention (e.g., as may be provided by the sawtooth arrangement of absorption enhancement structures on a PV enhancement film as shown in FIG. 23 or the like). The PV device in this case was modeled as including a PV material (e.g., amorphous silicon or the like with a refractive index of 3.44) with a thickness of 11 mils. A protective cover glass with a thickness of 125 mils and a refractive index of 1.5 was applied to the light-receiving surface of the PV material with an adhesive, which had a thickness of 2 mils and a refractive index of 1.51. The alternating absorption enhancement structures were assumed to have a pitch of 13.333 and heights or thicknesses of 7 and 10 mils (arranged in an alternating pattern in this example but other cases may alternate sets of such structures such as 2 to 5 or more of one design and then 2 to 5 or more of the second design).

As shown with line 2610, use of the PV enhancement film with this sawtooth pattern of absorption enhancement structures achieves an increase of the path length over the entire range of incidence angles with the average ratio being 1.527. Significantly, the structures chosen to have a pitch of 13.333 mils and a height or thickness of 10 mils (rather than 7 mils) are more optimized for providing an improved path length in the range of incidence angles of plus to minus 10 degrees as shown by the peaks/increases in the path length ration ratio in the region 2620 in graph 2600. Hence, a PV enhancement film with a sawtooth pattern of differing, alternating absorption enhancement structures configured for optimizing path lengths over two differing (but sometimes overlapping ranges of incidence angles) may be desirable in some applications to better capture solar energy available during peak or prime energy collection periods as well as throughout the rest of the day. Further, as is discussed in detail below, the PV enhancement film may readily be used to improve the efficiency of an existing PV device (such as a previously manufactured and even installed solar panel or array) that may include a protective layer of glass or the like. In such cases, the optimization and selection of the one or more structures is performed by including the glass and adhesive as well as the PV film and PV material in the optimization process (e.g., as input parameters to the structure optimization module) to choose a more desirable absorption enhancement structure(s).

In general, a premise behind increasing path length is that many PV absorbers (or PV devices/material layers) are not completely ideal in the sense that not all of the photons or available energy is absorbed. Hence, the inventors recognized that increasing path lengths often results in substantially greater absorption of the received sunlight. In fact, use of the PV enhancement film described above with reference to FIG. 26 (with a first set (such as about 50 percent) of the absorption enhancement structures optimized for plus/minus 40 degrees and with a second set (such as about 50 percent) of the absorption enhancement structures optimized for plus/minus 40 degrees using a triangular cross section) shows an increase in path length on average of about 53 percent. More importantly, though, such a PV enhancement film with the combined sawtooth structures provided path length increases of about 35 percent in the prime energy collection zone shown at 2620 such as in the range of incidence angles for sunlight of about plus/minus 20 degrees). The significance of this achievement is that depending upon the absorber or PV device/material arrangement, the additional path length can provide substantially more absorption by or into the PV materials and, hence, provide large improvements in efficiencies. Another component providing the improved efficiency and/or energy conversion capacity for a particular PV device is the increase or modification of path length by the absorption enhancement structures of the PV enhancement film may increase performance by allowing absorption into a "best" or more efficient band gap for the particular PV material.

Increasing path length with PV enhancement films including optimized absorption enhancement structures may increase absorption in nearly any PV material and/or any PV device such as those with polysilicon and multi-layered silicon, CIGS, amorphous silicon Cad-Tel films, and the like. However, in theory, use of the described PV enhancement films may have the greatest increase or benefit in thinner PV materials such as amorphous silicon thin films. While most traditional PV silicon materials range between about 200 and about 300 microns, amorphous silicon, Cad-Tel, and CIGS PV devices may have thicknesses of less than about 25 microns, which presents a much shorter optical path length through PV devices fabricated with this thin film PV material and, in some cases, allows lees possible absorption of photons/energy. Hence, increasing the path length of the received/incident rays or sunlight is likely to be more important for these thinner films and often will result in higher or more substantial increases in overall efficiencies.

One of the most practical aftermarket products using the PV enhancement films described herein may be retrofitting or modifying PV materials and PV devices (such as solar cells/arrays). In such cases, the PV enhancement films can by applied such as with a thin film/layer of adhesive (or about the edges) over the PV device. Many existing/installed panels, arrays, and cells include glass tops or glass protective covers over the PV materials, with the layer of glass glued with adhesive to the PV material (with or without a layer(s) of AR material or coating). With this in mind, the structure optimization process (or use of the structure optimization module) may anticipate the end use of the PV enhancement film with the input variables and/or optimization information including information about the glass cover and adhesive. In this way, the PV enhancement film and its structures may be optimized for use with a particular glass cover (e.g., a particular PV device design) with absorption enhancement structures selected to suit the cover and a particular adhesive (or range of anticipated protective covers and/or adhesives). In other embodiments, though, the PV enhancement film may be attached directly to the PV material (e.g., take the place of the protective glass cover/top), and in such cases, the film may be formed of plastic or glass and be adapted to provide the desired amount of path length modification and/or TIR without concern for an intervening glass cover.

FIG. 1 is a functional block or schematic view of a solar energy conversion system 100 in accordance with an embodiment of the invention. As shown, a light or energy source 102, such as the Sun, transmits energy, rays, or sunlight 104 (often termed "solar energy" or "solar power" made up of nearly parallel light rays due to the distance between the Sun 102 and the array 112) onto a solar energy collection assembly 110. The assembly 110 includes a solar array or panel 112 that generally would include numerous solar cells (not shown in FIG. 1) that each are formed of PV structures designed to convert solar energy 104 into electricity 120. The assembly 110 may be rigidly mounted to generally face the Sun 102 such as on, in the northern hemisphere, a southern exposure portion of a building roof or in a solar farm, or the assembly 110 may include tracking components 118 that move and position the solar array/panel 112 to follow the Sun 102 such that the sunlight 104 is always or more often orthogonal to the receiving surface of the array 112 (and included solar cells).

Electricity 120 generated by the solar cells or PV structures of the solar array 112 may be provided to a variety of end use devices such as charging electronics 130 for storage in a battery or batteries 132, a power grid 140 (e.g., for use by a utility to meet residential and commercial power demands), and/or other electrical loads 150. One of the largest problems with the use of PV arrays 112 is efficiency in converting the solar energy 104 into electricity that can be used by the end users (battery 132, power grid 140, and/or electrical load 150). Some estimate that existing solar arrays may only be 10 percent efficient in generating the electricity 120, e.g., generate 100 W/m$^2$ from the received solar energy 104 of 1 kW/m$^2$. There are also inefficiencies and line losses in the transmittance and storage of the electricity 120 that may result in an end-to-end efficiency of even less than 10 percent (e.g., 7 to 8 percent by some industry estimates).

The present invention is directed toward increasing the efficiency of PV devices such as the solar array 112, and the inventors recognize that a significant portion of the solar energy 104 incident upon a typical solar array 112 may be lost as shown at 106 due to reflection or bounce back. For example, losses in absorption of PV materials in the solar array 112 may be caused by normal cosine fall off or the lack of absorption due to the incoming angle of the sunlight 104 with relation to the structures in the PV materials. Even when tracking 118 is utilized, a portion 106 of the sunlight 104 is lost due to reflection (such as off of a protective glass surface, due to surface irregularities, and so on).

Figure 2:
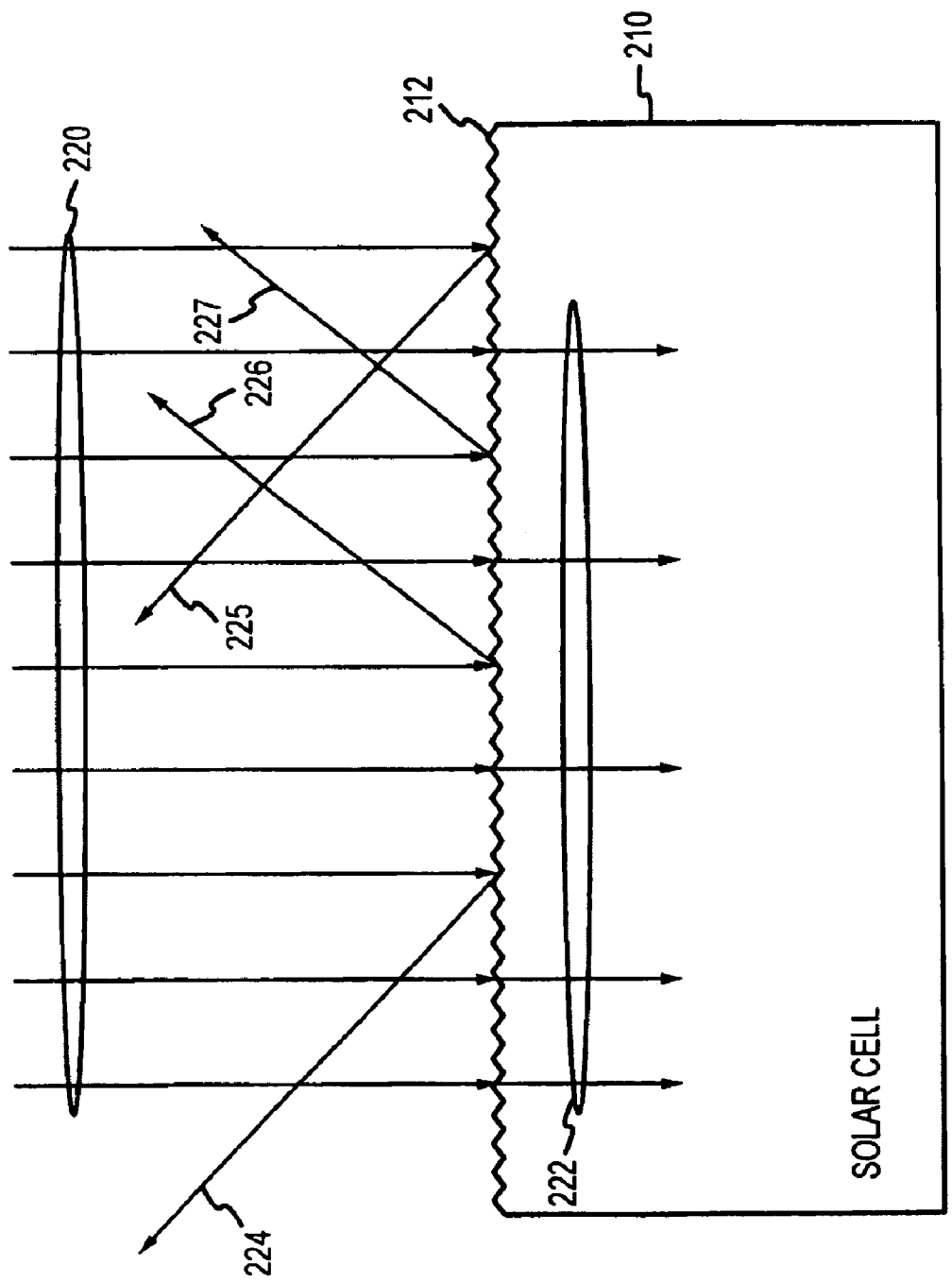
FIG. 2 illustrates a solar cell with an imperfect front or receiving surface and bounce back and/or reflection of incident solar radiation or sunlight.

For example, FIG. 2 illustrates a solar cell 210 that may be included within the array 112, and, due to manufacturing techniques (or even by intentional design) the light-receiving surface or front side 212 of the cell 210 may be irregular or be textured (e.g., not planar). As a result, sunlight 220 that strikes the cell surface 212 even at a zero degree angle of incidence may be deflected as shown at 224, 225, 226, 227 while other rays or photons 222 are absorbed by the PV materials or structures of the cell 210 and converted into electricity. The problem with deflection of rays 224, 225, 226, 227 (or rays 106 in FIG. 1) is worsened when no tracking is provided such that the rays 104, 220 strike the surface 212 (or solar array 112) at oblique angles (e.g., angles less than or greater than normal or zero degrees as measured from normal to the surface 212 or light-receiving surface(s) of array 112 or its solar cells).

With reference again to FIG. 1, one solution to improve the efficiency of the collection assembly 110 (or of array 112) is to bounce at least a portion or fraction of the unabsorbed rays 104 back into/onto the PV materials (or solar cells) of the solar array 112, which reduces the amount of solar energy 106 that is lost from the system 100. To this end, a PV enhancement film 114 is positioned over all or a subset of the solar cells or PV material of the array 112 to trap at least a fraction or portion of light reflected or deflected off of the surfaces of the array 112 without being absorbed and redirect it back at least once onto the array 112 to increase chances of absorption and generation of electricity 120. The film 114 includes a plurality of TIR structures or elements on the surface receiving the sunlight 104, and each of these structures or elements is adapted to make use of TIR techniques to allow incoming rays 104 to enter and strike the solar cells/PV materials of array 112 while also promoting or enhancing the possibility of rays bouncing back onto the solar cells/PV materials if not absorbed (e.g., if reflected/deflected off light-receiving surfaces/structures in array 112). As will be explained more below, each TIR structure on film 114 is a shape formed on the light-receiving surface of the film 114 in order to provide TIR of reflected or deflected rays. In essence, the TIR structures are "reverse funnels" that allow rays to enter but act to deflect rays back to the PV materials of the array 112 by design as those reflected/deflected rays try to exit, as lost rays 106, away from the PV material at certain angles. The TIR structures of film 114 continue to deflect a portion or fraction of the unabsorbed rays or sunlight such that the trapped and/or deflected rays within the film 114 are directed back to the PV materials, thereby increasing efficiencies of the materials and array 112 from about 5 to 20 percent up to 10 to 25 percent or more in some cases.

The film 114 may be retrofitted onto an existing solar array 112 or combined with new PV materials or solar cells during initial fabrication of the array 112, with either fabrication method of the array being performed relatively inexpensively (e.g., a plastic film 114 with numerous TIR structures may be attached with adhesives or other methods in a few minutes even after the array 112 is in position in a solar farm/plantation or a rooftop setting or may be laminated or otherwise applied over the solar cells of an array or over each solar cell as it is formed (e.g., the film 114 may include a plurality of segments or individual films each applied to a solar cell to form a solar cell assembly that may then be included within the array 112)). The film 114 (or films as may be useful to provide desired coverage of a larger array 112) may be made of a wide variety of materials such as readily available plastics that are transmissive to sunlight 104 such as a polymeric sheet or the like or made of glass or certain ceramics that are transparent or at least highly transmissive. In some embodiments, the materials used for forming the film 114 and its TIR structures/elements are chosen from glass, nearly any type of clear (i.e., transparent to translucent/less transmissive) plastic including but not limited to PET, propylene, OPP, PVC, APET, acrylic, or any clear plastic, and/or a ceramic. In many embodiments, the preferred base material is a plastic due to its durability, low material and manufacturing costs, and light weight, and the plastic of the film 114 may be extruded, calendared, cast, or molded to provide the functional TIR structures described herein.

Figure 3A:
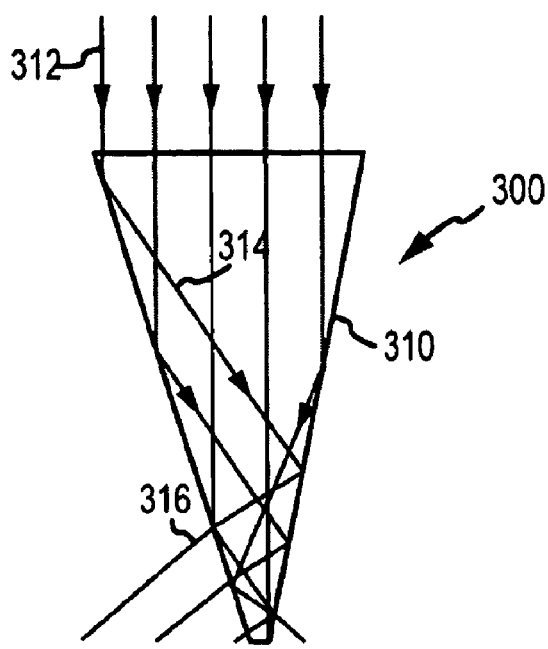
FIGS. 3A-3C illustrate schematically directing light with a conventional funnel, a conventional funnel with mirrored walls, and an inverted funnel (or truncated cone) showing that light entering a base or wider portion of a funnel has a tendency to be trapped or be directed back toward the base of the funnel (e.g., of the optical microstructure that may be utilized for its TIR properties)
Figure 3B:
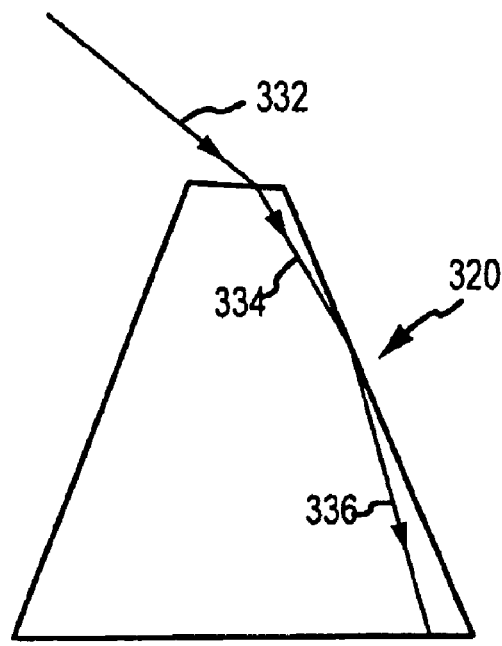
Figure 3C:
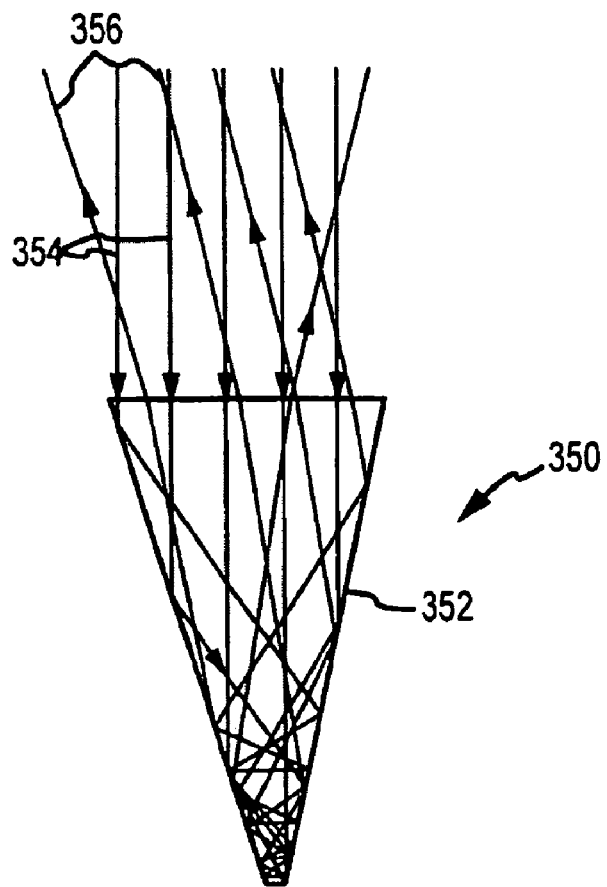

The TIR structures included on the PV enhancement films of embodiments of the invention function to create TIR on the light-receiving surfaces of solar cells/PV materials, and the TIR structures may be described as "reverse funnels" for directing light. FIGS. 3A-3C illustrate a conventional funnel or cone structure 300, an inverted funnel or cone structure 320 (e.g., with its larger portion used as its lower or base portion), and a funnel or cone structure 350 with mirrored walls. In describing attempts to direct or herd light rays, the rays of light do not react or behave as initial logic may suggest such as if one attempted to treat light as a fluid and apply fluid dynamics principles. In fact, light may be thought of as acting in an opposite fashion as a liquid in a funnel. In other words, when creating a funnel for fluids, the fluid will behave under the force of gravity in a predictable manner with gravity pulling the fluid from a larger end of the funnel to the smaller portion and the exit (e.g., funneling oil into a vehicle or the like with the exit having a smaller diameter). In contrast, when structures are created with mirrors, glass, or other reflective materials with narrowing pathways, the opposite effect happens when light is directed into the light "funnel."

FIG. 3A shows a funnel structure 300 in a material with an index of refraction of 1.49 and non-reflective walls. The incoming rays 312 are reflected as rays 314 that undergo smaller angles of reflection until the rays 316 finally escape from the surface or sidewall 310 of the cone/funnel structure 300. In contrast, as shown in FIG. 3B, an inverted funnel structure 320 allows received or incident light 332 to enter and continue on or be focused as shown at 334 and 336 through the larger opening of structure 320 (e.g., a ray entering a cone of a material with an index of refraction of 1.49 undergoing TIR). FIG. 3C illustrates for example of a cone structure 350 with reflective or mirrored sidewalls 352 and an index of refraction of 1.49 arranged with a narrowing diameter (e.g., a truncated or frustoconical shaped structure 300). An attempt to funnel incoming or received light rays 354 results in the light actually backing out as shown at 354 of the funnel structure 356 by being deflected/reflected off the narrowing walls 352 (e.g., the rays are reflected off the walls 352 at angles that sequentially differ such that they get reflected back out of the cone 350 such that rays that would normally escape from the funnel tip are reflected back up the funnel). The inventors recognized that the structure (or other "funnel" structures) 350 could be utilized to trap unabsorbed sunlight within a solar array or solar cell when the ray 354 is considered a photon or ray of sunlight that is being deflected or reflected from the cell or PV materials. In other words, the TIR elements/structures are arranged as inverted funnels as shown in FIG. 3B (or inverted versions of those shown in FIGS. 3A and 3C) upon the solar cells (or arrays) such that incident light is allowed to enter and be focused upon a solar cell/PV material while unabsorbed light is deflected back for a second (or third or more) chance for absorption.

The concept of using TIR in thin films (e.g., plastic films with a substrate with TIR structures on one side that are applied over solar cells) is believed to be a new concept. In order to use TIR as a method of turning rays or limiting loss of sunlight from a solar cell/PV material, it may be useful to describe basic physics or geometry of the angles and the resulting behavior of the rays. Sunlight or rays may enter into a transmissive TIR structure or element with refractive indexes of between 1.1 and about 2.0, with normal ideals between 1.4 and 1.65. Once rays enter the TIR structures, the rays will not exit the TIR structure if they remain within 42 degrees of parallel to the wall of the structure when striking the wall of the structure. Rays within this TIR physics law will deflect inside the TIR structure until they find an escape or are absorbed by the PV materials/solar cell and are converted into electricity. The "escape" out of the TIR structure would typically be the result of a deflection of past 42 degrees as measured from a wall of the TIR structure (e.g., an internal "surface" of a wall or facet of a TIR structure that comprises a solid body of plastic, glass, ceramic, or other highly transmissive material), creating a more direct "strike" of the surface allowing the rays to exit.

One idea supporting the invention is that many losses and decreases in efficiency in various PV films are the result of rays not being absorbed into the PV material, e.g., absorption of photons to start the photovoltaic effect (i.e., process of the electron moving down (creating a hole) to be replaced by an electron of the opposite polarity and therefore creating a flow of electrons to establish a current). Instead, the rays bounce off the three-dimensional (3D) surface or non-planar/textured surface of the PV materials or solar cell, whether the film is using silicate, cadmium telluride or other technology or materials. Since the goal of a solar cell design is for the rays to enter the PV film, and, therefore, the structures, PV films can be made of many layers, targeting the various wavelengths of the incident sunlight. Since a large portion of the solar energy lies in the shorter wavelengths for the PV process, these wavelengths are specifically targeted either on one or more layers for absorption. PV materials are often made of a pure material such as silicon mixed with tiny amounts of controlled impurities to produce controlled energy levels or bands in the material. Depending on the materials and amounts used there are valence bands and conduction bands. The photons coming from a source of light will cause electrons to occupy conduction bands that can conduct electrons to an electrode. On the other side of the material, there are holes that are effectively positive charges that were produced by the photons that traveled to the electrode on the other side of the PV material to complete the electric circuit. It is not the purpose here to dwell on these processes that are covered in solid state physics textbooks and available reference materials but to generally say that when photons are absorbed under the right conditions an electrical output will be generated.

One of the main problems with the ray absorption into PV materials is that incoming rays tend to bounce off the surface of the PV materials at extreme angles, significantly decreasing the ray's chance of absorption. This is attributed generally to a phenomenon known as cosine fall off. In this case, the incoming rays are coming in from difficult angles in the mornings, evenings, and/or differing seasons (or a combination thereof) that allow an undesirably small fraction or portion of the rays to be absorbed by the solar cell or array containing numerous solar cells. In addition, improper orientation of panels/panels with regard to the azimuth of the Sun may also contribute to or lead to loss of available solar energy.

It is important to note, however, that even with perfect tracking of the sun with PV materials, the angles of the structures themselves create a random-like mathematical percentage of rays bouncing off structures within the PV film and not being absorbed. Even short wave length rays coming in directly may hit structures or textured surfaces of a solar cell at angles that do not allow absorption (as shown in FIG. 2). While certain types of coatings (e.g., AR coatings) can help improve efficiencies by reducing reflection in some cases, the nature of the present invention differs as it provides a method that makes use of TIR to improve solar energy conversion efficiencies of solar cells and other PV devices (and of solar panels/arrays incorporating such solar cells and PV enhancement films). The PV enhancement films include TIR structures/elements that allow the incoming or incident rays to enter unencumbered through the micro-structured film (e.g., a sheet of plastic, glass, or ceramic with TIR elements on one side without shading (such as is the case with the micromirror systems)). Then, if a ray is reflected from the surface of the PV structures, each TIR structure is designed with an ability to create TIR, e.g., based on the angle of deflection parallel to the pathway of exit of that ray (which must be less than 42 degrees as measured from the wall of the TIR structure upon which the ray strikes). The trapped or deflected ray continues to "bounce" off of the internal structure of the TIR element at least once, possibly two, three, or more times based upon the shape of the structure and to "strike" the PV surface again (at least a second time) for possible absorption.

In fact, this TIR effect may happen a few times up to dozens of times until the ray is absorbed into the PV material generating energy or exits the structure because of a deflection creating an angle that exceeds 42 degrees (a more direct "hit") to the wall of the structure. Therefore, use of a PV enhancement film with TIR elements/structures with a solar cell/PV device in accordance of invention does not insure the absorption of each ray, but it does increase the odds of absorption by giving a portion or fraction of the unabsorbed rays another chance or opportunity at absorption by bouncing the ray back to the PV material at a different angle (at least the probability is that the ray will be incident upon the solar cell at a different angle than when first received). In many cases, a ray, if rejected again by the PV material with a deflection, will in theory have dozens more chances of absorption. Ultimately, the ray will either be absorbed or will find an exit angle from the structure that exceeds 42 degrees from parallel of the surface of the wall of exit. In ray tracing programs run by the inventors to test use of TIR structures/elements of the invention, using a 95% reflective mirrored surface in place of a light-receiving surface of a solar cell shows that rays may bounce dozens of times within the structures before exiting the structure. In other words, the TIR elements or microstructures can increase a deflected ray's odds of being absorbed by a significant amount or by many times in this TIR light-trapping process.

FIG. 4 illustrates a solar cell (or PV device) assembly 400 in accordance with one embodiment of the invention. As shown, the assembly 400 includes a solar cell or PV device 410 (such as a silicon-based solar cell, a thin-film device, a GaAs/Ge solar cell, and nearly any other PV design) with a rear or back surface (e.g., a back contact) 412 and a front or light-receiving surface 414 (e.g., a front contact covering PV materials such as p-semiconductor layer as may be found in a silicon solar cell/wafer design, an AR coating, a glass or other protective layer, or other surface directed toward the Sun in a solar cell design). Since a significant portion of incident light upon the light-receiving surface 414 of the solar cell may be reflected, deflected, or otherwise unabsorbed, the assembly 400 also includes a PV enhancement film 420. The film, sheet, or layer 420 is positioned to cover all or a portion of the light-receiving surface 414 and may be applied or attached via an adhesive layer 418 (e.g., a substantially transparent or at least translucent adhesive) such that the film 420 abuts or is positioned proximate to the surface 414 of cell 410. In other embodiments, other mounting methods such as mechanical methods or direct lamination onto the surface 414 may be used to provide the film 420 on the cell 410 (and, in other cases, the film 420 may be provided as an integral layer or portion of the cell 410 such as part of formation of a protective glass, plastic, or ceramic coating on the cell 410). In some cases, the PV enhancement film 420 will be manufactured separately from the cell 410 and applied later as a modification or retrofit (e.g., to a cell 410 already in use in a solar array or module in a solar farm or on a roof mounting) while in some cases the PV enhancement film 420 is provided on the cell 410 as part of the original fabrication of the cell 410 and assembly 400.

As shown, the PV enhancement film 420 includes a substrate 426 with a first side/surface 422 that is positioned proximate to the front or light-receiving surface 414 of the solar cell 410 (and may be considered a solar cell-facing or mating surface). The substrate 426 is generally a relatively thin layer formed of substantially transparent material (e.g., the same material as used for the TIR structures 428) and the cell-mating surface 422 often is generally planar to provide minimal interference with light passing from the PV enhancement film 420 to the cell 410. On a second side/surface 424 of the substrate 426, the PV enhancement film 420 includes a plurality of TIR structures or elements 428. The side/surface 424 may be thought of as the light-receiving surface/side of the film 420 and is spaced apart from the cell surface 414 by the thickness of the substrate 426. In this embodiment, the TIR elements 428 are two-sided or two-faceted structures with elongated bodies extending over the length (or width) of the solar cell 410 surface 414 as is shown with the length of the film, $L_{PV film}$. The TIR elements 428 are linear elements with a triangular cross section in this embodiment with the two facets or sides of the structure 428 forming the sides of the triangle and the base mating with or being an integral connection with the substrate 426. The size and shape of the triangular cross section of each TIR element 428 may be varied to practice the invention, and it may be varied depending on the intended use of the cell assembly 400 (e.g., 45 degree facets may be used for a cell assembly 400 used in a solar array (see FIG. 1) that is used with tracking such that sunlight is typically receiving with an orthogonal orientation while smaller (or larger) facet or side angles may be useful when no tracking is provided and a large portion of the sunlight strikes the cell assembly at oblique angles). The PV enhancement film 420 may be considered a "sawtooth" design with the TIR elements 428 being the teeth of a saw blade.

FIG. 5 illustrates an enlarged end view of the solar cell assembly 400 during use to trap sunlight showing details for a single TIR element 428 of the PV enhancement film 420. As shown, the PV enhancement film 420 has a thickness, $t_{PV film}$, made up of the thickness of the substrate 426 and the thickness or height, $H_{TIR element}$, of each TIR element 428. The thickness of the film, $t_{PV film}$, typically will range from up to about 1 micron to about 0.25 inches, with the substrate 426 having a thickness to facilitate structural integrity of the PV enhancement film 420 and facilitate manufacturing. Each TIR element 428 has a width, $W_{TIR element}$, that will also vary to practice the invention and will depend upon the facet or side angles, $\theta_1$ and $\theta_2$, will typically be up to 1 micron to 1 inch or more. The facet-defining angles, $\theta_1$ and $\theta_2$, are typically equal such that the triangular cross section of the TIR element 428 is an isosceles triangle, but this is not required to practice the invention. In one embodiment, the facet-defining angles, $\theta_1$ and $\theta_2$, are chosen to be less than about 45 degrees (as measured from a plane parallel to the surface 422 of substrate 426 or from a second side of substrate 422 from which the TIR elements 428 protrude, which is also parallel to the surface 422), with 45 degrees being useful when received solar energy is generally orthogonal to the light-receiving surface 414 of the solar cell 410 and smaller angles being useful when rays are received at more oblique angles.

As shown in use, a first ray 521 of sunlight is received or is incident upon a side or facet 510 of the TIR element 428 at an angle that is near normal or orthogonal (as measured from a plane orthogonal or normal to the light receiving surface 414 of the solar cell 410 with the ray 521 being shown at about −10 degrees). The received sunlight 521 is allowed to enter or pass through the TIR element 428 with some diffraction as shown with ray 522, and the ray 522 passes through the PV enhancement film 420 including the substrate 426 where it strikes the light receiving surface 414 (and/or PV structures) of cell 410. In this example, the ray 522 is not absorbed to make electricity but is instead reflected or bounced off at a different angle as shown with ray 524. The ray 524 strikes the side or facet 510 of the TIR element 428 at an angle, $\alpha$, and when this angle is less than about 42 degrees (as shown), the ray is trapped by facet 520 and reflected as shown with ray 526 back toward the light receiving surface 414 of cell 410 (e.g., a TIR effect is achieved with TIR element 428). Again, the ray 526 may not be absorbed by the solar cell 410 and instead reflected/bounced back as shown at 528 where it strikes the facet 520 to again be trapped/reflected at a differing angle as ray 530. Ray 530 strikes the light receiving surface 414 of the cell 410, where it is absorbed into the 410 as shown with absorbed energy/ray 532.

In this example, the TIR element 428 trapped the non-absorbed rays 524, 528 using TIR and provided the solar cell 410 with two additional chances to absorb the solar energy, which otherwise would have been lost (e.g., if conventional AR coating had been used the ray 524 would likely have been lost from the assembly 400). In practice, the number of additional chances will vary widely and will likely range from 0 to 12 or more (with 0 occurring when the first reflected ray 524 strikes the facet 520 at an angle, $\alpha$, greater than 42 degrees), with a general description being that the TIR element 428 acting to trap at least a fraction of the reflected light and direct it back onto the light-receiving surface 414 for one or more chances at absorption. For example, a cell 410 may experience up to 70 percent loss of sunlight due to reflection and/or bounce off of received rays from the light-receiving surface 414, and the PV enhancement film 420 with use of the TIR elements 428 (linear bodies with two-sided cross sectional shapes) may be able to force 35 percent or more of the lost sunlight to strike the light receiving surface 414 at least a second time (with some rays being trapped and forced to strike the surface 414 multiple times by the TIR element 428).

Similarly, other rays 540 may strike the TIR element 428 at differing angles (such as at more than 20 degrees as shown) and be allowed to enter the TIR element 428 as shown with ray 542. The ray 542 passes through the TIR element 428 and strikes the light-receiving surface 414 of the cell 410 where it is reflected or bounced off as ray 544. The ray 544 strikes the facet/side 520 at an angle, $\beta$, less than about 42 degrees (in this case), and is deflected as ray 546, which strikes surface 414 of cell 410 and is again reflected as ray 548. The unabsorbed ray 548 strikes facet 510 is again trapped by TIR and reflected as ray 550 toward the light-receiving surface 414, but this additional chance provided by the TIR element 428 results in the ray 550 being absorbed as shown at 554. It will be understood that FIG. 5 represents a greatly simplified description of the use of a PV enhancement film 420 with TIR elements 428 as numerous rays would be striking the TIR elements 428 along their lengths and across both facets 510, 520, and a large portion or fraction is absorbed by the solar cell 410 upon initial contact. But, FIG. 5 is useful for understanding how the PV enhancement film 420 may be used to provide TIR structures or elements 428 over the light-receiving surface 414 of a solar cell 410 to capture at least a fraction of the rays that are not absorbed by the cell 410 so as to increase the efficiency of the solar cell 410 by providing the PV structures/components of the cell 410 additional chances to absorb the rays. The "second chance" rays or trapped rays will typically strike the surface 414 at a different location than the initial receipt location and at a different angle, which may also increase the odds that the rays will be absorbed by the cell 410.

Figure 6:
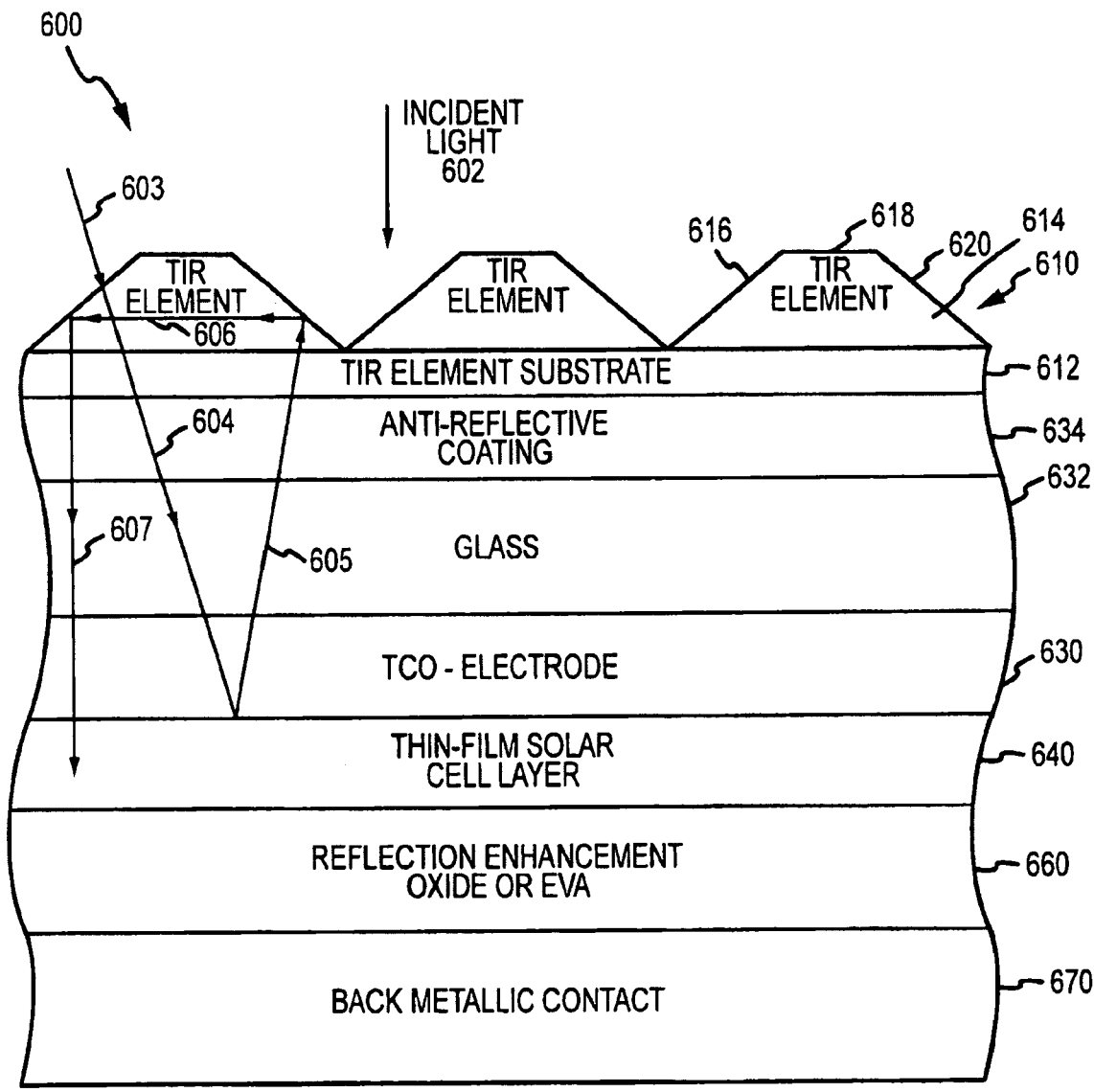
FIG. 6 illustrates a partial end view of a solar cell assembly similar to that shown in FIG. 5 showing exemplary details of solar cell that may be modified to include a PV enhancement film in accordance with an embodiment of the invention with two or more flat sides or facets to trap incident light that is reflected or bounced back from other layers of the solar cell assembly.

The shape of and/or wall angles the TIR element may be altered in accordance with the invention to provide better or differing TIR effects (or differing abilities to trap light on the solar cell/PV device front or light-receiving surface). For example, the inventors believe it may be beneficial to utilize TIR structures with 3 or more facets/sides to trap sunlight received over a range of angles (e.g., when tracking is not provided for a solar array or the like). FIG. 6 illustrates an end view similar to that of FIG. 5 of a solar cell assembly 600 with a PV enhancement film 610 applied to (or positioned over/adjacent) a solar cell. In this case, the PV enhancement film 610 is formed with a substrate 612 abutting the solar cell and supporting on an opposite side a plurality of linear (or elongated) TIR elements 614. Each TIR element 614 has a three-sided cross section, with first and second sides 616 and 620 that may be angled inward to meet a top side/surface 618. The top surface/side 618 may be planar and parallel to substrate 612 (or its side that abuts the solar cell) and the angled sides 616, 620 may be angled inward at a range of angles such as up to about 15 degrees to about 45 degrees or more. Light incident upon the assembly 600 is shown at 602 as may be the case at noon or when tracking is used, and such orthogonal rays 602 may generally pass through the film 610 for substantial absorption by the cell components. In contrast, rays 603 that are more oblique to the cell and substrate 612 may strike one of the facets 616, 618, 620 and pass through the substrate 612 and one or more layers/components of the solar cell, with received ray 604 shown passing through an AR coating 634, a protective glass layer 632 and an upper contact 630. At this point (or earlier), the ray 605 is reflected or bounced back toward the PV enhancement film 610 where it strikes the same or another facet 616, 618, 620 and is deflected as ray 606. It may be directed toward the solar cell or to strike yet another facet 616, 618, 620 as trapped/TIR-captured ray 607 for absorption upon this second (third, fourth, or later) opportunity provided by the PV enhancement film 610. As with other films, the substrate 612 and the TIR elements 614 typically are formed of the same materials such as a plastic, a glass, and/or a ceramic that is substantially transparent (i.e., relatively highly transmissive) to light 602 such as by extrusion or other pattern forming on a sheet or film of plastic or the like.

As will be understood, the PV enhancement films such as film 610 may be used with nearly any solar cell design and/or PV component where reflection or loss of incident light is a concern. FIG. 6 illustrates a relatively common solar cell arrangement that may be used in a solar cell assembly 600 for exemplary purposes. The solar cell includes a back metallic contact 670 and a front contact (e.g., a transparent conductive oxide (TCO) electrode such as tin oxide, zinc oxide, aluminum-doped zinc oxide, indium tin oxide, and the like) 630. Sandwiched between these cell components is a thin-film solar cell layer 640 (such as a semiconductor film including one or more semiconductor layers such as amorphous silicon with n-type and p-type conductivity regions, CdS/CdTe-based solar cells, crystalline solar cells, and the like with the particular type of solar cell layer used not being limiting to the invention and use of a PV enhancement film), and, in this case, an optional reflection component 660 is provided, e.g., a reflection enhancement oxide or ethyl vinyl acetate (EVA) layer, a reflection grating etched on the backside of the substrate and a textured photonic crystal as a backside reflector, or the like. Additionally, a protective glass 632 may be provided to protect the solar cell layer 640 and front electrode 630, and this is often the case in assemblies 600 in which the PV enhancement film 610 is retrofitted onto a previously built and/or installed solar cell (or solar array with a plurality of solar cells). An AR coating 634 (e.g., a metal fluoride and silica composite or the like) may be included in such cases to control reflection from the glass 632 (e.g., the AR coating 634 may be found in many existing solar cells that include a glass coating 632).

Figure 7:
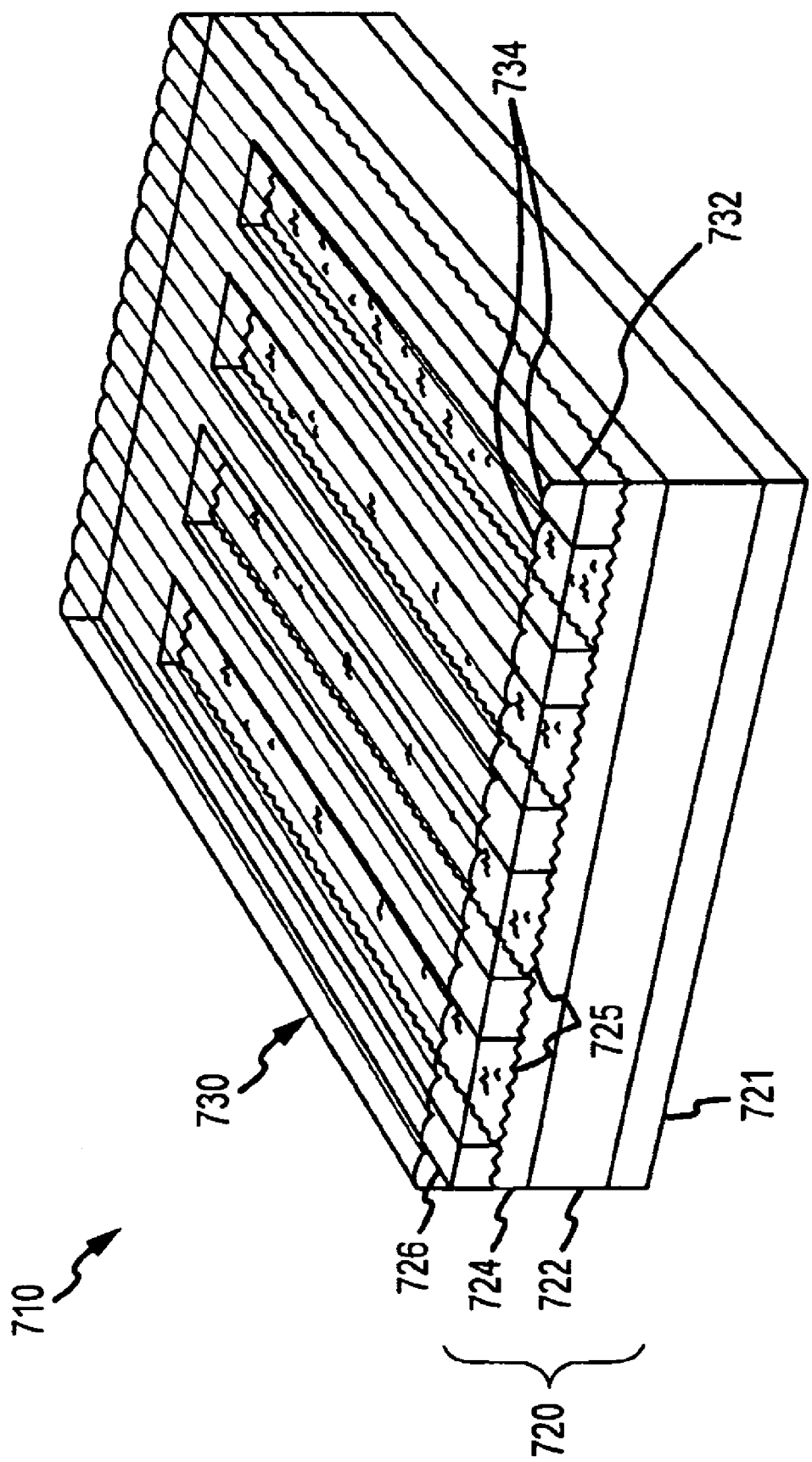
FIG. 7 illustrates a perspective view of an additional solar cell assembly in accordance with an embodiment of the invention including a PV enhancement film placed over the top contact, which in turn is deposited upon rough surface of PV structure.

FIG. 7 illustrates another embodiment of a solar cell assembly 710 that includes a solar cell 720 and a PV enhancement film 730. In this embodiment, the solar cell 720 may include a substrate 721 that may serve as one of the cell's electrodes, with a layer 722 deposited thereon. The layer 722 may be a silicon layer or other layer useful for absorbing solar energy. For example, the layer 722 may be formed as a Si-layer doped and otherwise formed to provide a n-type semiconductor. A p-type semiconductor 724 may then be formed upon the n-type semiconductor layer 722 in such a manner that results in a textured or rough surface 725 (e.g., with a plurality of pyramids or the like). A front or counter electrode 726 is formed with or over the layer 724 to form the solar cell 720. As may be expected, the roughness or texture of the light-receiving surface 725 of the solar cell 720 may result in a portion of incident light being reflected or deflected and not absorbed by the layers 722, 724 to generate electricity.

To enhance the efficiency of the cell 720, the solar cell assembly 710 includes a PV enhancement film 730 that is positioned over, and may be joined to, the front electrode 726 so as to substantially or completely cover the light-receiving surface 725. The PV enhancement film 730 is similar to the other films shown thus far in that it includes a substrate 732 of substantially transparent material upon which a plurality of linear or elongated TIR elements 734 are formed (or otherwise provided such as by a second depositing step or the like). The film 730 differs, though, as the TIR structures are formed with an arcuate light receiving/trapping surface such that each TIR structure may be considered to have a semi-circular cross section (e.g., the body of each TIR element 734 may be thought of as half or less of a cylinder). The TIR elements 734 are aligned with their elongated bodies side-by-side and with their longitudinal or central axes parallel. Again, the height and width of the TIR elements 734 may be widely varied to practice the invention and to achieve a desired TIR effect (e.g., better TIR at particular angles of incidence of received sunlight and so on to suit a particular solar cell 720). For example, each TIR element may be up to 0.25 inches in height but typically may be relatively thin such as several mils or less in height and may be up to about 1 inch in width but typically 10 or more TIR elements 734 are provided per inch of width of the film 730.

Figure 8:
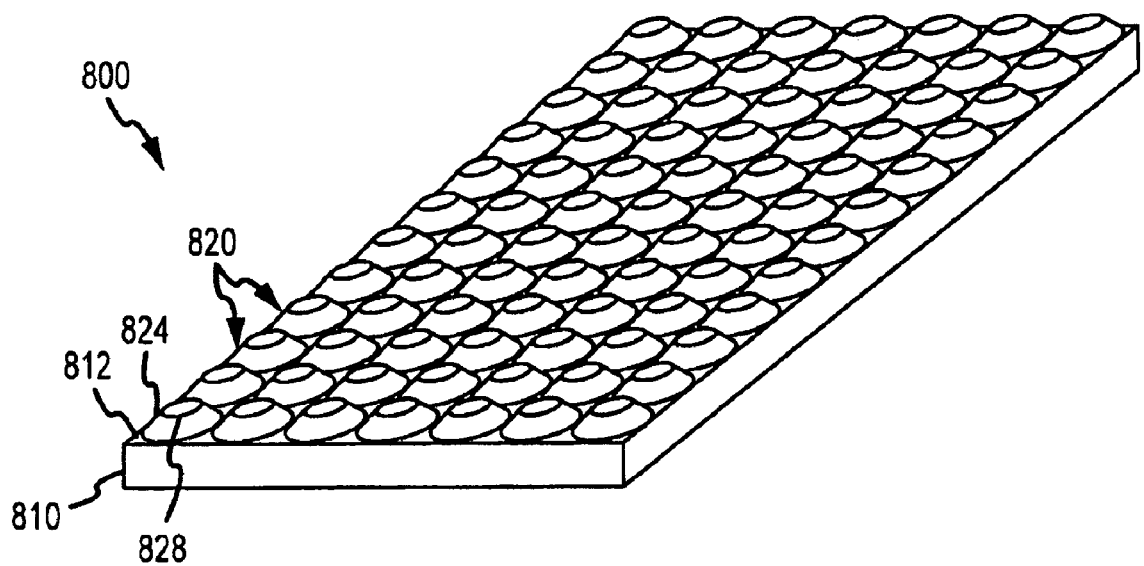
FIG. 8 is a perspective view of a PV enhancement film showing an embodiment using a plurality of truncated cone-shaped TIR structures.
Figure 9:
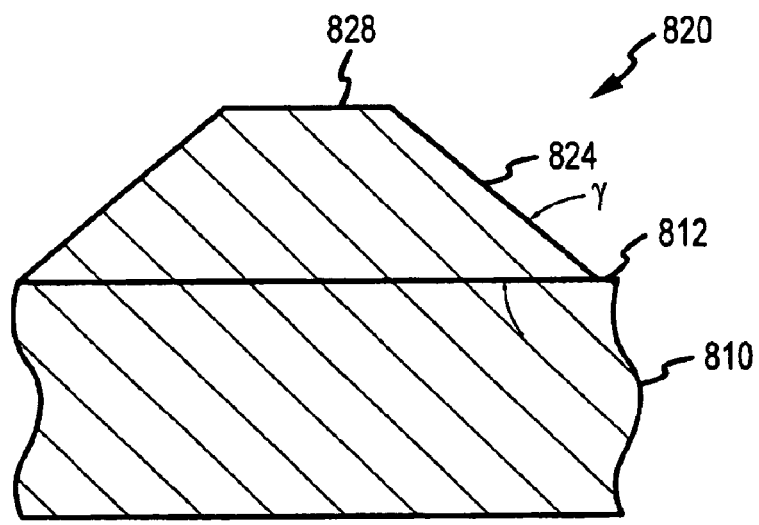
FIG. 9 is a sectional view of a single TIR structure of the PV enhancement film of FIG. 8.

In some embodiments, PV enhancement films are provided with numerous TIR structures or elements formed upon a surface of a substrate and the TIR structures do not have elongated or linear bodies. For example, FIGS. 8 and 9 illustrate another embodiment of a PV enhancement film 800 that may be used with any of the solar cells shown herein or, more typically, with a solar array of such cells as shown in FIG. 1. The PV enhancement film 800 includes a substrate 810 with an upper or light receiving surface 812 (the opposite surface of the substrate 810 typically is positioned against or near the light-receiving surface of a solar cell or solar array/module/panel). On the substrate surface 812, numerous TIR structures 820 are formed or provided to trap light using TIR. The TIR structures 820 may be considered inverse funnels with a frustoconical shape defined by an angled inward sidewall 824 that extends about the circumference of the structure 820 and upward to a top or upper surface 828. The funnel-shaped TIR structure 820 has its larger wider "opening" (with a first diameter) or its base against the surface 812 of the substrate 810 and angles inward at an angle, $\gamma$, such that its smaller "opening" (with a second diameter smaller than the first diameter) at surface 828 is part of the light receiving surface. In this arrangement, as explained with reference to FIGS. 3A and 3B, incident or received sunlight or rays are allowed to enter the funnel-shaped TIR element 820 but have more difficulty exiting and are trapped by TIR. The angle, $\gamma$, is typically less than about 60 degrees and more typically less than 45 degrees, the height of the structures 820 is typically relatively small such as less than about 1 inch and more typically, less than 0.25 inches (e.g., 1 to 3 mils or the like), and the diameters of the base and at surface 828 are typically relatively small such as less than about 1 inch but more typically less than 0.25 inches (e.g., less than about 5 mils or the like). The TIR elements 820 may be spaced apart on surface 812 of substrate 810 but more typically little or no space is provided between adjacent ones and/or rows of the TIR elements 820 to provide more TIR and trapping of reflected light. The TIR elements. 820 function to provide trapping of reflected light in a manner similar to that shown for the TIR elements of FIG. 6 but in a 3D manner rather than a 2D or linear manner.

Figure 10:
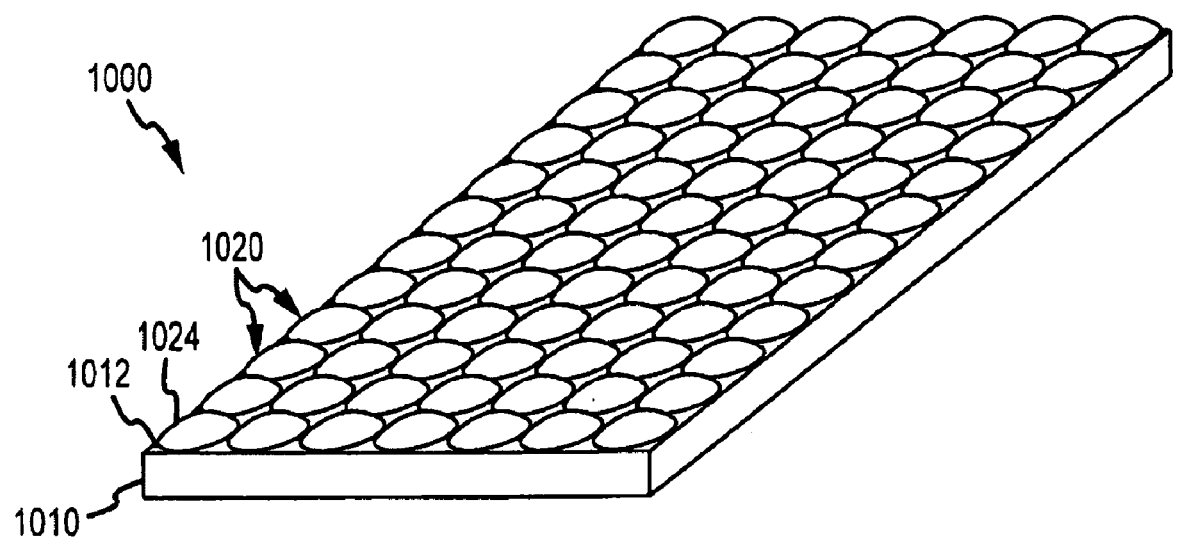
FIG. 10 is a perspective view of an additional PV enhancement film showing an embodiment using a plurality of dome or hemisphere-shaped TIR structures/elements to redirect reflected sunlight back toward a solar cell or PV device.
Figure 11:
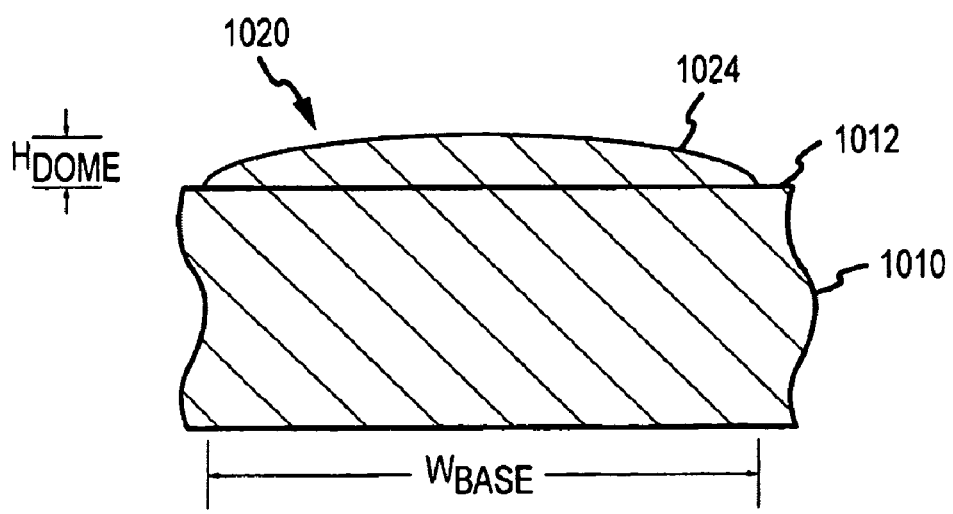
FIG. 11 is a sectional view of a single TIR structure of the PV enhancement film of FIG. 10.

FIGS. 10 and 11 illustrate yet another PV enhancement film 1000 in accordance with the present invention that may be used with solar cells such as an additional layer or component of a solar array as shown in FIG. 1. As with the film 800, the film 1000 includes numerous, non-linear TIR elements 1020 formed upon a surface 1012 of the film substrate 1010. The TIR elements 1020 in this case are shaped as small domes defined by a light receiving/trapping surface or wall 1024 that is shaped such that each dome 1020 has a semi-circular cross section but overall has a hemispherical shaped body defined by a width of a base (or base diameter), $W_{Base}$, and a dome/body height, $H_{Dome}$ (e.g., a base width of less than about 1 inch and more typically quite small such as less than 0.25 inches such as less than several mils and a dome height that is also relatively small such as less than about 1 inch and more typically less than 0.25 inches such as less then several mils). Again, the TIR elements 1020 may be spaced apart but more typically are tightly spaced upon the surface 1012 to trap a larger percentage of reflected light. Differing sized and shaped TER elements may be used in a single film, but to facilitate manufacturing and provide relatively consistent use of a PV device/materials, each of the TIR elements 1020 is substantially identical in shape and design.

The above description provides a general description of applications for a PV enhancement film with TIR structures or elements to improve the efficiencies of solar cells (or other PV devices) and of solar arrays, modules, and panels that incorporate such solar cells and PV enhancement films. The above description provides description of some PV enhancement films and TIR elements, and it also provides an introduction into how the TIR elements trap light using TIR to direct at least a fraction or portion of reflected (unabsorbed) sunlight back onto the solar cell/PV structures. At this point, it may be useful to provide additional explanation of the operation of TIR elements provided in PV enhancement films, and the following description provides additional embodiments of PV enhancement films along with a more detailed explanation of the optical principles utilized by the invention. Portions of the description include PV enhancement films and TIR elements shown more schematically than in prior descriptions/figures, but it will be understood that such embodiments or models used for computer-simulations and ray tracings may readily be implemented in physical products (e.g., TIR structures or elements provided on a side of a substrate or film of plastic, glass, ceramic, or substantially transparent material) for application over solar cells/solar arrays as discussed above.

This invention generally concerns the use of optical films (e.g., PV enhancement films) that make use of total internal reflection (TIR) and refraction (e.g., TIR structures or elements that provide TIR and also refraction). The TIR elements redirect sunlight reflected off the surface of a photovoltaic (PV) cell back to the cell so that energy that would be normally be lost for electrical power generation is used for (or at least available for) power generation, thus producing more power than if the cell did not have the optical or PV enhancement film as part of its assembly or covering it in a solar array. Embodiments of the invention make use of the properties of light reflection expressed by Fresnel reflection coefficients.

Figure 12:
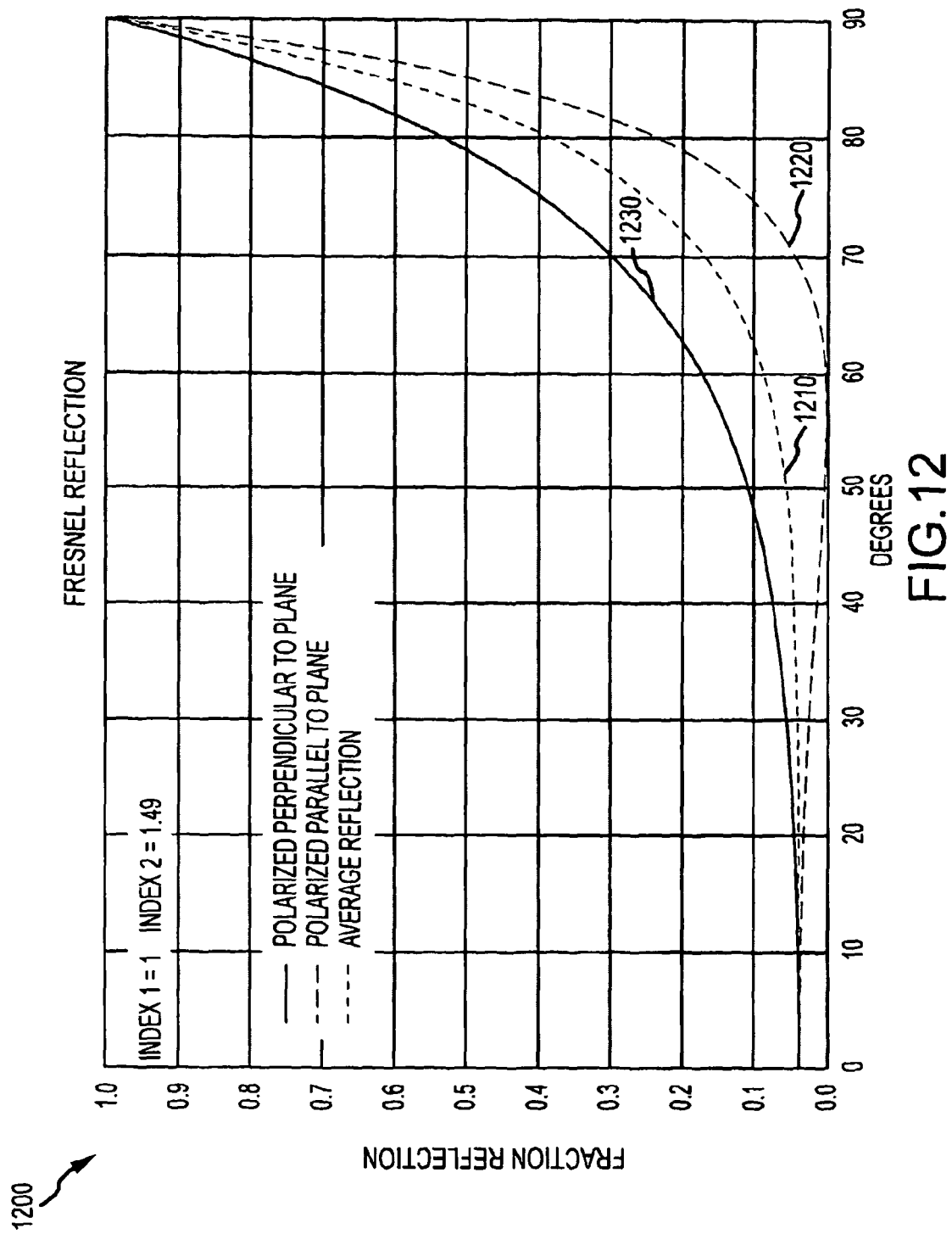
FIGS. 12 and 13 are graphs illustrating reflection as a function of the angle of light in exemplary mediums.

Relevant equations for modeling and/or evaluation of PV enhancement films and solar cells without such films can be written in the following manner: $\theta1$=angle of incidence; $\theta2$=angle of reflection; Rs=power in plane perpendicular to incidence; Rp=power in plane of incidence; $Rs=(\sin(\theta2-\theta1)/\sin(\theta2+\theta1))^2$; $Rp=(\tan(\theta2-\theta1)/\tan(\theta2+\theta1))^2$. A plot or graph 1200 is shown in FIG. 12 of the Fresnel reflection as a function of angle for light in a medium of index 1.00 intersecting a medium of index 1.49 with lines 1210, 1220, and 1230 representing average reflection, light polarized parallel to plane, and light polarized perpendicular to plane, respectively. The curves of graph 1200 show that about 4 percent of the light is reflected at normal incidence. As shown, the average amount of light reflected slowly increases to about 70 degrees and then the amount reflected increases rapidly with increasing angle. The curve 1210 is the total energy reflected. In the case where the light is in a medium of index 1.49 and passes to a medium of index 1.00, FIG. 13 illustrates a plot or graph of light reflection 1300 with lines 1310, 1320, and 1330 representing average reflection, light polarized parallel to plane, and light polarized perpendicular to plane, respectively.

Figure 13:
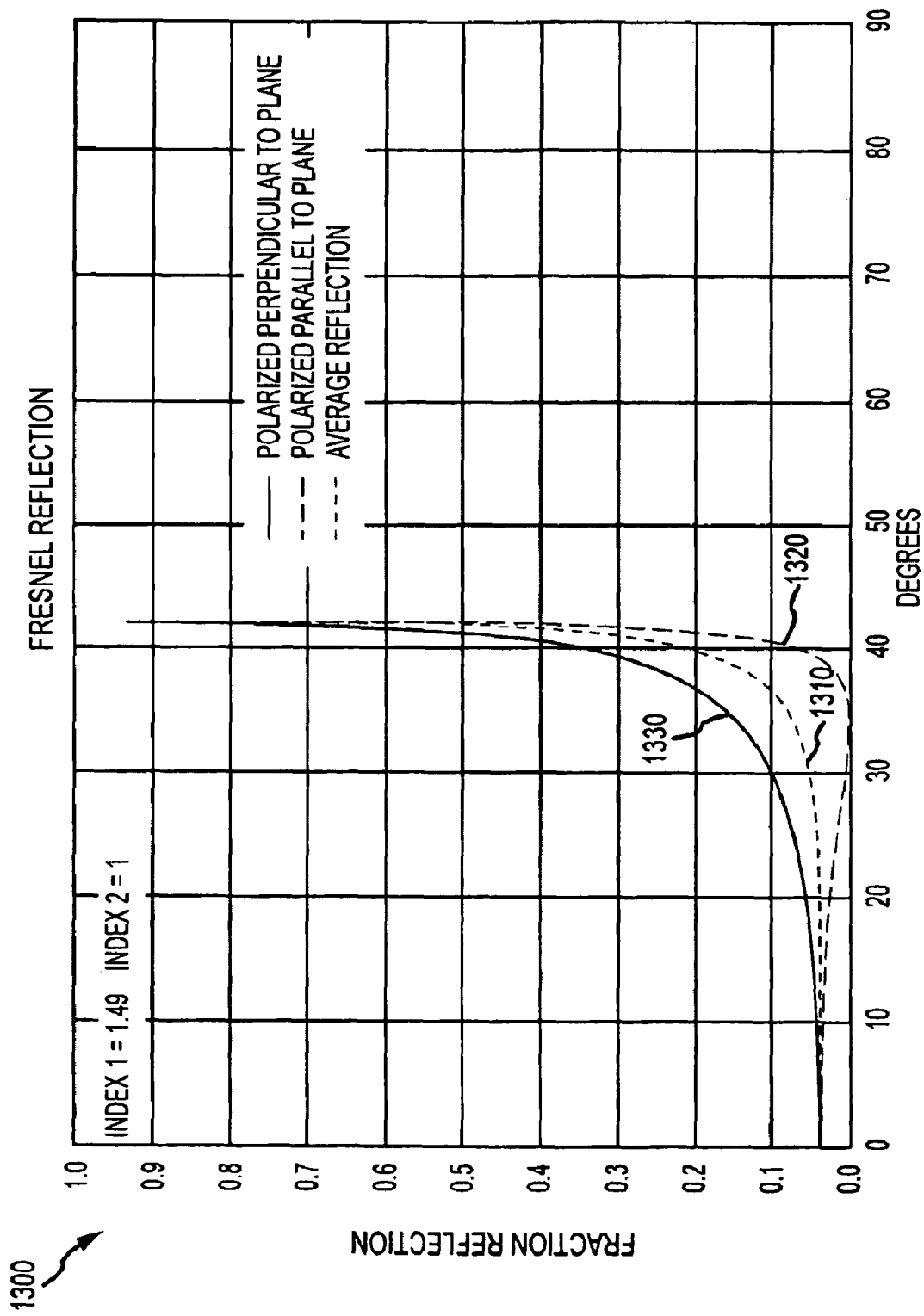

In this case, FIG. 13 shows with line 1310 that the average amount of reflected light slowly increases up to about 35 degrees of incidence and then very rapidly increases at about 42 degrees where all of the light is reflected or total internal reflection occurs (TIR). One base idea of the invention is to have an optical material shaped so as to allow the maximum amount of energy (or a significant portion) to reach the PV material of the solar cell/PV device (e.g., provide numerous TIR elements on a PV enhancement film). The reflected portion of light, which would otherwise go to waste, reflects off of the optical material at an angle that gives TIR so that it strikes the PV material at least a second time (and, in some cases, a third, fourth, or "N" times). In another case, refraction is used and will be discussed later (hence, the TIR elements/structures may use TIR, refraction, and/or other optical techniques to trap reflected light and/or direct it back toward the PV materials of a cell and are not limited to "total" internal reflection). The graphs 1200 and 1300 of FIGS. 12 and 13 show how this might be done. The amount of light lost to reflection when light enters a higher index of material is not high in the 40 to 50-degree angles of incidence region but when light exits at that angle it is mostly reflected (again, remember the funnel concepts described earlier where light may be received by a TIR element as described here but when reflected from a solar cell's light-receiving surface it may be reflected back to the surface for possible absorption).

Figure 14:
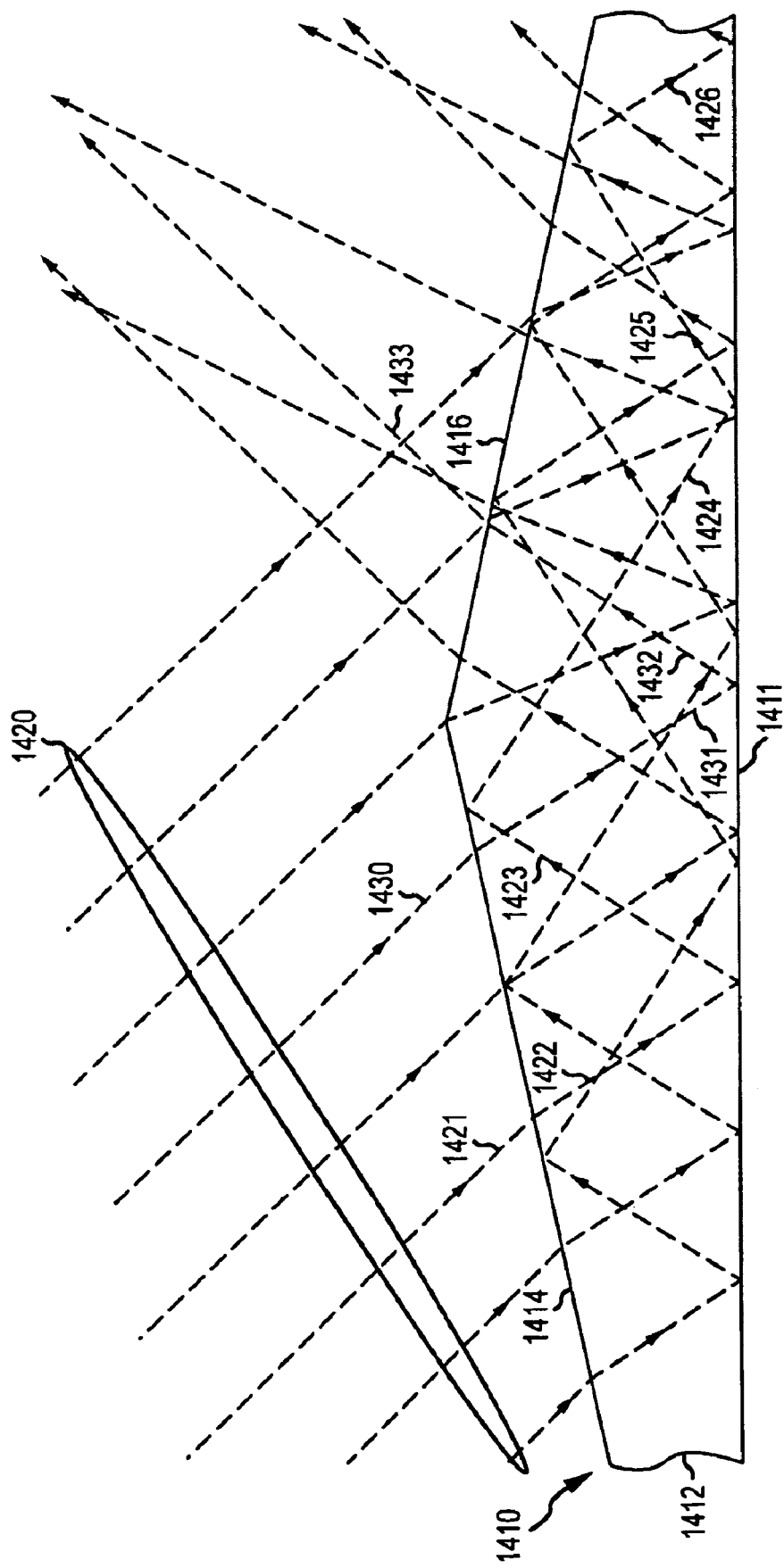
FIG. 14 illustrates a ray tracing for a two-sided or faceted TIR structure of an embodiment of the invention as may be used in a saw-tooth PV enhancement film as shown in FIG. 4, for example, or a textured film as shown in FIGS. 8-11.

For example, the TIR structure 1410 shown in FIG. 14 makes use of TIR to redirect light that has been reflected from the PV surface 1411 (which in FIG. 14 is assumed to be 95 percent reflective or a mirrored surface for showing functionality of the TIR structure 1410). As described earlier, the TIR structure 1410 may be formed of a substrate 1412 and two or more facets or sides 1414, 1416 (shown at angled offsets from the substrate in the range of 20 to 30 degrees but, of course, many other facet/side angles may be used to define the facets 1414, 1416 and the TIR element 1410). The TIR structure 1410 modeled by this ray tracing had a pitch or base width of 20 mils and a thickness or height of the peak (mating line between the facets 1414, 1416) of 2.1 mils. The modeled TIR element 1410 may be a linear or elongated structure with FIG. 14 representing an end view or cross section or it may be a standalone or unitary component with a circular cross section along its central axis passing through the peak between facets 1414, 1416) and a side sectional view as shown when a plane is passed through central axis and cylindrical body (e.g., see FIGS. 8-11 for illustration of similar unitary or non-linear TIR elements). The TIR element 1410 was assumed to be formed of a material (such as a plastic) with a refractive index in the range of 1.4 to 1.6 (e.g., about 1.47), and the traced rays 1420 were assumed to strike the TIR element 1410 at an angles of incidence of about −30 degrees (as measured from normal or orthogonal to the substrate (and light-receiving surface 1411).

FIG. 14 shows a ray tracing in which rays have been ray traced through the TIR structure 1410 (e.g., when combined with other similar structures could provide a saw tooth structure in a PV enhancement film as shown in FIG. 4). The tracing shows rays 1420 enter the structure with little loss but when exiting after reflecting off a PV surface 1411 are reflected back to the surface 1411 for a second (or third or more) chance for absorption. For example, incident ray 1421 is shown to pass into the TIR structure 1420 after striking outer surface of facet 1414 with some refraction as shown with ray 1422 traveling through TIR element body and substrate 1412. The ray 1422 is not absorbed but is instead reflected as ray 1423, which strikes the inner "surface" of the facet 1414. Since this angle is less than about 42 degrees, TIR causes it to be reflected/directed as ray 1424 back to surface 1411. Upon this second chance/second striking of surface 1411, the PV material may absorb the ray 1424 or, as shown in this example, the reflection may continue with ray 1425 striking the inner surface of the second facet 1416 and being reflected again as ray 1426 toward surface 1411. In this example, the ray 1421 and its energy was presented to the light-receiving surface not just once as ray 1422 but also two additional times as rays 1424 and 1426, which also struck at differing angles that may further enhance the odds/chances of successful absorption by an operating solar cell.

Of course, the TIR element 1410 is not able to trap all rays 1420 but, instead, only a fraction or portion of the rays 1420 is redirected toward the surface 1411 at any particular angle of incidence. For example, ray 1430 strikes facet 1414 and is received as ray 1431 for its first chance at absorption as it strikes light-receiving surface 1411. However, if it is not absorbed, the ray 1432 may be reflected in such a way from surface 1411 that is strikes facet 1416 at an angle greater than about 42 degrees. In this case, as shown, the light is lost from the TIR element 1410 as shown with ray 1433. Hence, while the PV enhancement films with TIR structures 1410 of the invention may enhance efficiency of a solar cell or PV device in receiving available sunlight, the TIR structures 1410 attempt to enhance efficiencies by increasing light capture and are designed to increase light capture for particular uses and/or solar array or cell designs (e.g., a differing TIR structure may be used for a solar array that tracks the Sun than for a solar array with no tracking).

Figure 15:
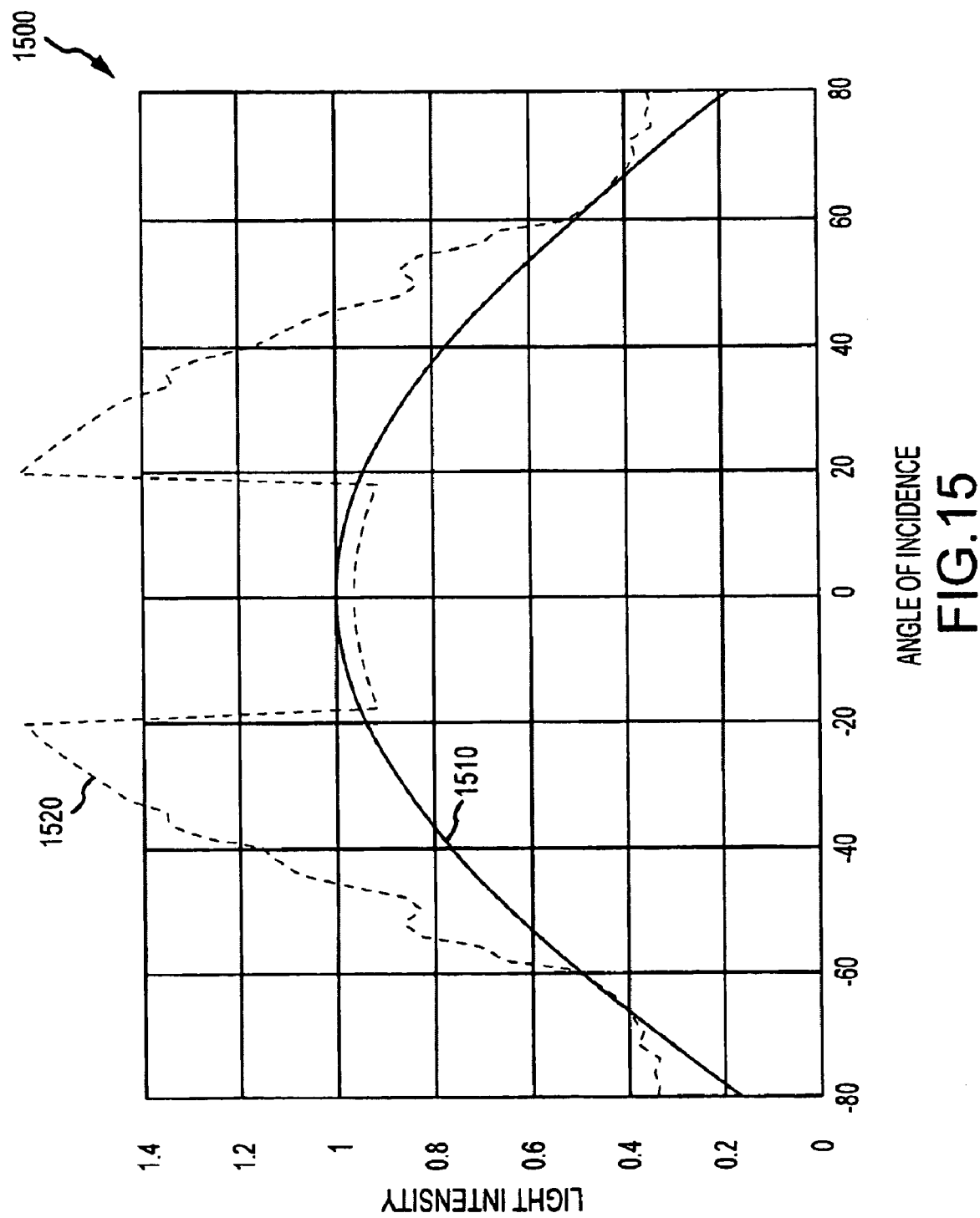
FIGS. 15 and 16 are graphs showing light intensity as a function of angle of incidence of sunlight upon a light-receiving surface with and without a covering or paired PV enhancement film with 95 percent and with 50 percent reflectivity, respectively.

One method of testing or verifying a design of a PV enhancement film and/or a TIR structure design is to plot ray or light intensity received by or striking a solar cell's light-receiving surface with and without use of the PV enhancement film. FIG. 15 illustrates a graph 1500 of the ray intensity received by a PV or light-receiving surface (such as surface 1411 of FIG. 14) as a function of the angle of incidence. In this plot, a TIR element similar to the element 1410 was modeled, but, in this case, the pitch or base width was about 10 mils while the height or thickness of the TIR element body (as measured from the peak to the mating surface of the substrate) was about 2 mils. Line 1510 provides a reference for designing a TIR element and indicates the intensity of light received by a light-receiving surface of a solar cell with no optical enhancement film and no TIR elements provided, which is the cosine function over the range of angles considered. The plotted line 1520 shows the ray intensity received by the same PV light-receiving surface when a PV enhancement film with sawtooth (or two-faceted) TIR structures (such as shown in FIG. 4 and FIG. 14) are positioned over or adjacent the light-receiving surface.

For plot 1520, the light-receiving surface (such as surface 1411) was considered to have 100 percent reflection, which is not the case for PV devices but is useful for determining the functionality of a TIR structure at trapping reflected rays. As shown with line 1520, the TIR rays or redirected rays reflected from the light-receiving surface enhance the intensity of the light-receiving surface over the conventional, uncovered PV device. Use of the TIR structure with a solar cell can be seen to significantly enhance intensity when light is received at incidence angles greater than 20 degrees and less than −20 degrees (with a little loss or decrease typically occurring in the central region due to the approximately 4 percent Fresnel reflection losses associated with rays entering the TIR structure). Calculations show that the average intensity of rays with the use of the TIR structure is 0.937 while the reference intensity without a PV enhancement film is 0.699. Hence, an improvement or enhancement gain of over 30 percent (e.g., about 34 percent) is achieved with this TIR structure design.

Figure 16:
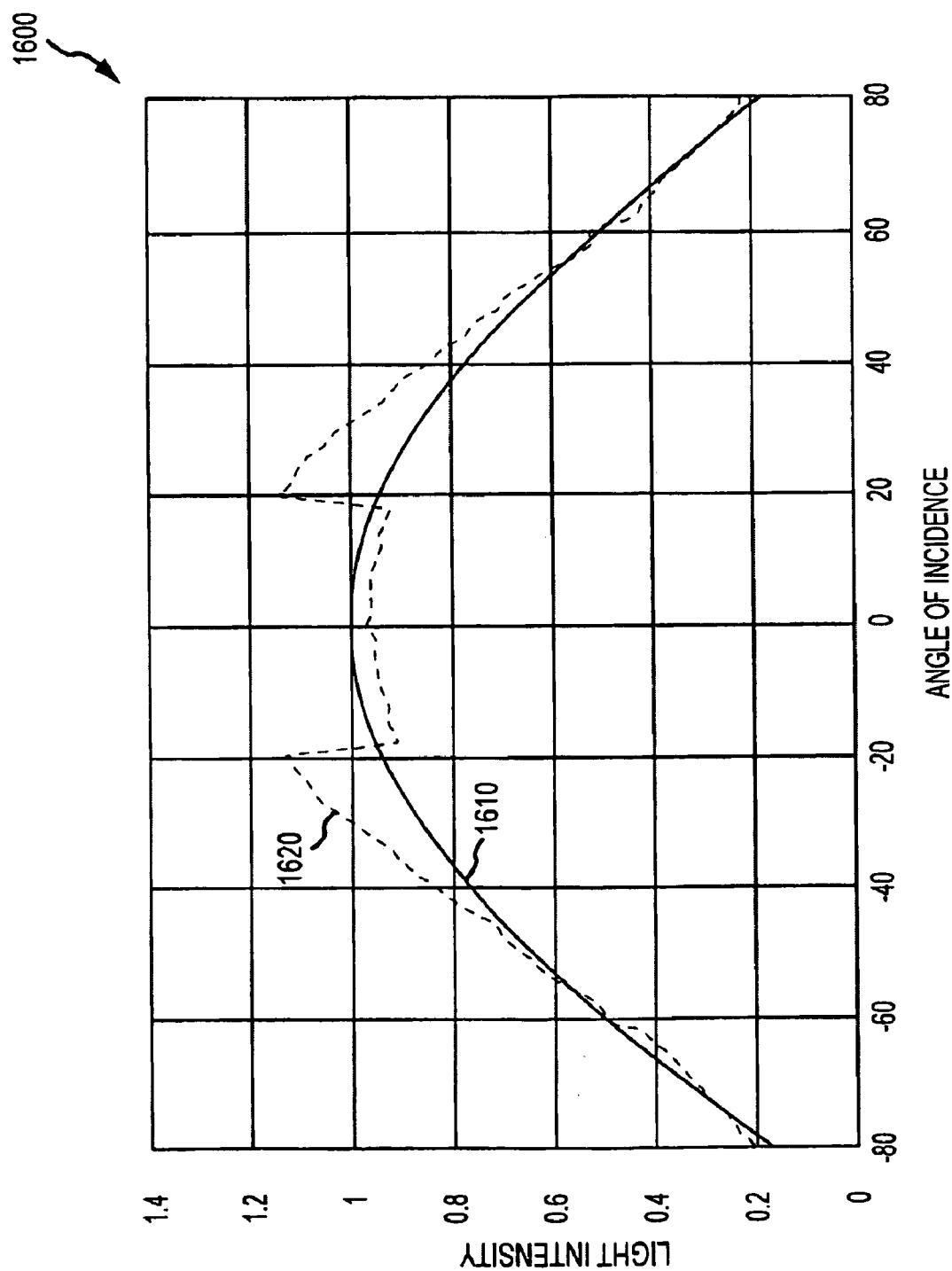

Of course, a typical solar cell or PV device will not have 100 percent reflection from the light-receiving surface as this would not generate electricity. FIG. 16 illustrates a graph 1600 similar to that shown in FIG. 15 for the same TIR structure but with a light-receiving surface with 50 percent reflection. Reference intensity is shown with line 1610 for the surface with no TIR structures while line 1620 shows intensity achieved with reflected light being captured or trapped by TIR and redirected back to the light-receiving surface (such as surface 1411 the facets/sides 1414, 1416 of TIR structure 1410). Intensity is significantly increased in the ranges of +/−20 degrees to +/−50 degrees by this TIR structure, with calculations showing an overall gain of at least about 5 percent to 0.735 over an uncovered PV light-receiving surface. Similar modeling at 75 percent reflection from the light-receiving surface showed an increase in intensity of about 15 percent with use of a TIR structure.

Figure 17:
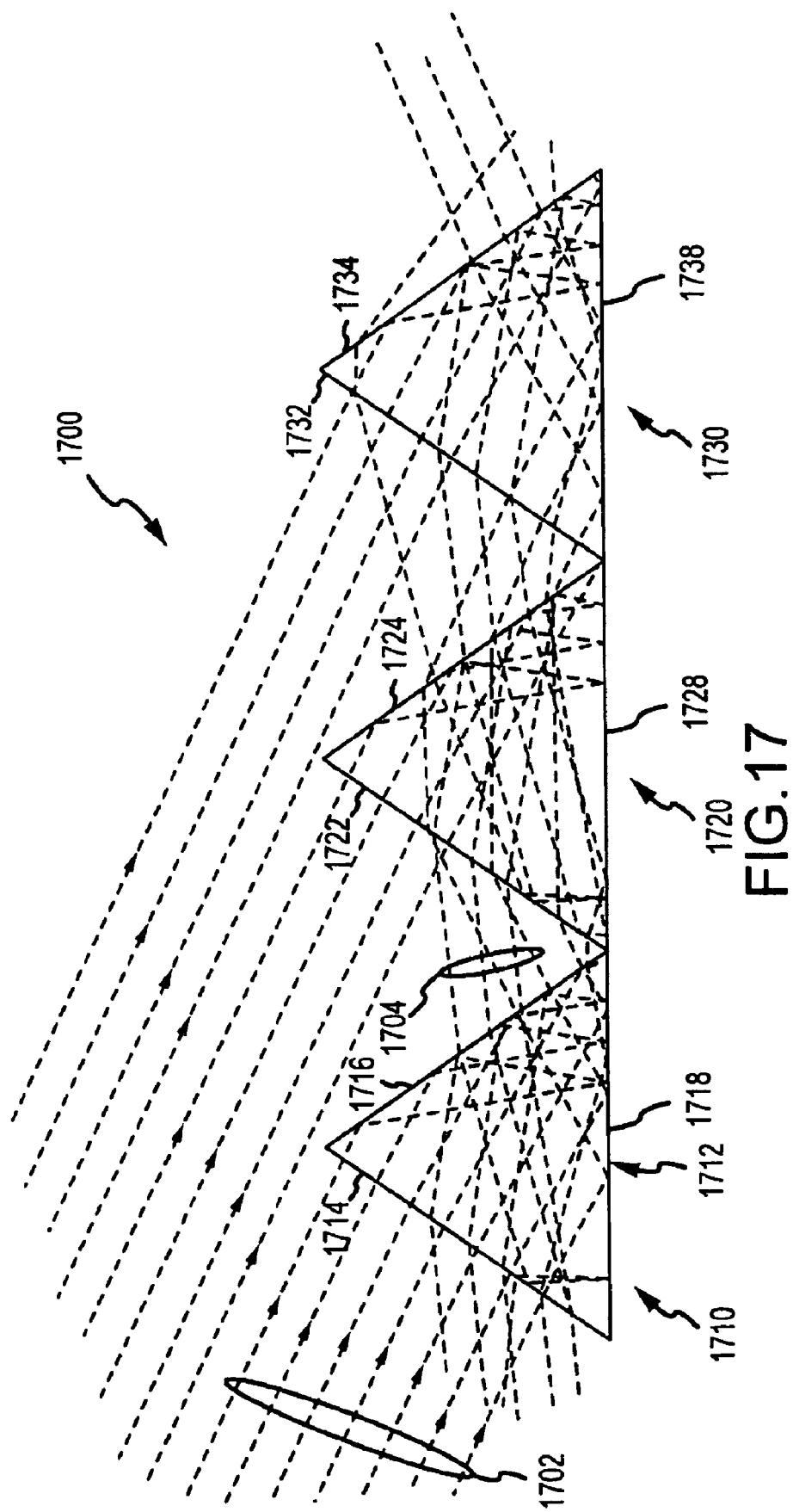
FIG. 17 is a ray tracing for a portion of a PV enhancement film in accordance with an embodiment of the invention using 2-sided or faceted TIR structures and showing refraction effect during use of PV enhancement film.

FIG. 17 illustrates a ray tracing 1700 for one embodiment of a PV enhancement film 1710 utilizing a sawtooth arrangement of linear or elongated, two-sided TIR elements 1712, 1720, 1730 (with only 3 shown for simplicity whereas a typical PV enhancement film will include numerous TIR structures across one surface). In FIG. 17, the film 1710 is shown without a substrate at the base of the elements 1712, 1720, 1730 (e.g., a film of plastic, glass, or ceramic or the like) for ease of illustration, and the ray tracing assumed that the light-receiving surface at the base of the elements 1712, 1720, 1730 had 95 percent reflection. The rays are shown as having an angle of incidence of about −60 to −70 degrees, and it at such larger angles of incidence where the effects of refraction may become more important.

Specifically, the ray tracing 1700 shows that received or originally-incident sunlight or rays 1702 may strike one a first facet/side 1714 of a TIR element 1712 (such as at an angle of incidence larger than about +/−60 degrees or the like) and enter the TIR element 1714 where it may be deflected downward to the light-receiving surface 1718. Some of the light/rays though may pass through the second facet/side 1716 as shown at 1704 to strike an adjacent TIR element 1720 upon facet/side 1722. Again, some of the light may be directed with originally incident rays 1702 striking facet/side 1722 onto light-receiving surface 1728. Other portions may pass through facet/side 1724 as shown to strike facet/side 1732 of the next TIR element 1730, where it again may be directed to the light-receiving surface 1738 with a portion of the captured/trapped light 1702 or pass through facet/side 1734 as unabsorbed light. Light reflected from the surface(s) 1718, 1728, 1738 likewise may be directed to adjacent TIR elements 1712, 1720, and/or 1730 where it may pass through or at least in part be directed to the light-receiving surfaces 1718, 1728, 1738. In this manner, the TIR elements 1712, 1720, 1730 use refraction to recapture reflected rays or transmitted rays to increase the efficiency by directing portions of originally-incident but not absorbed light onto the light-receiving surface (e.g., a surface of a solar cell or the like for absorption). This refractive collection or trapping of light may be considered additive to the overall efficiency gain provided by use of TIR elements (e.g., added to the increased intensity shown in prior figures). In other words, rays reflected and escaping one TIR element may be captured by adjacent structures where they can be again directed to the light-receiving surface.

Figure 18:
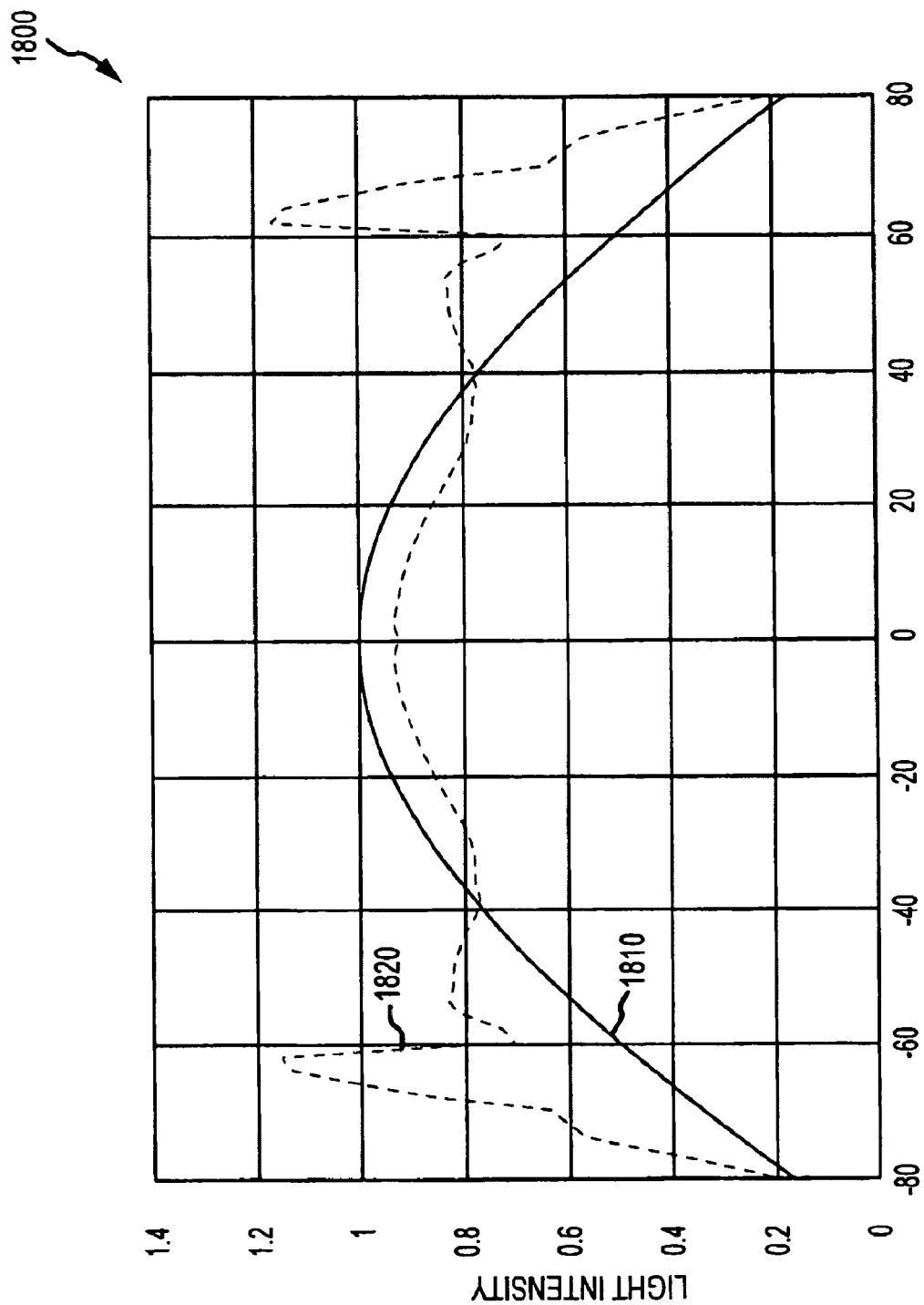
FIG. 18 is a graph showing light intensity as a function of angle of incidence of sunlight upon the PV enhancement film of FIG. 17.

FIG. 18 illustrates a graph 1800 of light intensity as a function of angle of incidence of light upon a light-receiving surface (such as solar cell position underneath the base of the TIR elements 1712, 1720, 1730). In this modeling/evaluation, the TIR structures were elongated or linear body structures with a two-sided (or triangular) cross section as shown in FIG. 17 with a base width or pitch of about 10 mils and a height (or thickness) of about 7 mils. FIG. 18 shows a reference or baseline intensity with line 1810 of a light-receiving surface without a PV enhancement film of TIR structures, and line 1820 illustrates light intensity upon this same surface (such as surfaces adjacent the bases 1718, 1728, 1738) after positioning a PV enhancement film with TIR structures (such as film 1710 with structures 1712, 1720, 1730). The intensity graph 1800 is considering intensity contributions due to refraction effects/capturing, and it shows that the TIR structures of a PV enhancement film may be used to significantly increase intensities at highly oblique angles where losses are often highest for a conventional solar cell (e.g., cells in a solar array with no tracking). Specifically, peak intensity gains are seen at angles greater than about +/−40 degrees (with a peak from about +/−60 to 70 degrees). As shown in FIG. 17, the intensity is beneficially increased for angles beyond 60 degrees. Note, in some applications a small decrease in the center portions between +/−40 degrees (as shown for this TIR structure) might be acceptable in order to achieve the increase at around 60 degrees of ray incidence.

All or a significant portion of the code or pseudocode used by the inventors in modeling and/or designing the TIR structures/elements for embodiments of PV enhancement films in accordance with the invention is provided in a program listing after this detailed description, and it is believed that this code/program listing will be useful to those skilled in the art in selecting a desirable TIR element for use with a variety of solar cells and solar arrays. The computer code was used in part to calculate the curves provided in the attached figures to determine effectiveness of TIR structures in increasing intensity upon a light-receiving surface over ranges of angles of incidence for received light. In use, after the parameters are read in off a user menu, the PV ray tracing routine is called. The computer program that is used to design and evaluate structures is a non-sequential ray tracing program designed to investigate optical structures for PV output power enhancement. The user enters values on a menu that are to be investigated, and these values such as type of structure (e.g., sawtooth, sinusoidal, cylindrical, and so on) and values for thickness, period, amplitude, and radius (if and as applicable). Deep inside the subroutine, the Fresnel reflection and transmissions are calculated in order to find the final intensity of rays striking the PV surface. The PV trace routine is called and is given in the included code/pseudocode.

The PV trace routine or program will give the user the best values found in the range of search for the TIR structure evaluated. These best values are entered into the data menu and rays are traced to evaluate the structure. Typically, 1000 rays are traced for every 2 degrees of angle between the limits of −80 degrees to +80 degrees, and the results plotted as shown in some of the above figures. To examine the rays and how they are refracted and reflected in the structures a small number of rays, e.g. 100 rays, might be used at a specific angle of interest as shown in FIG. 17.

Figure 19:
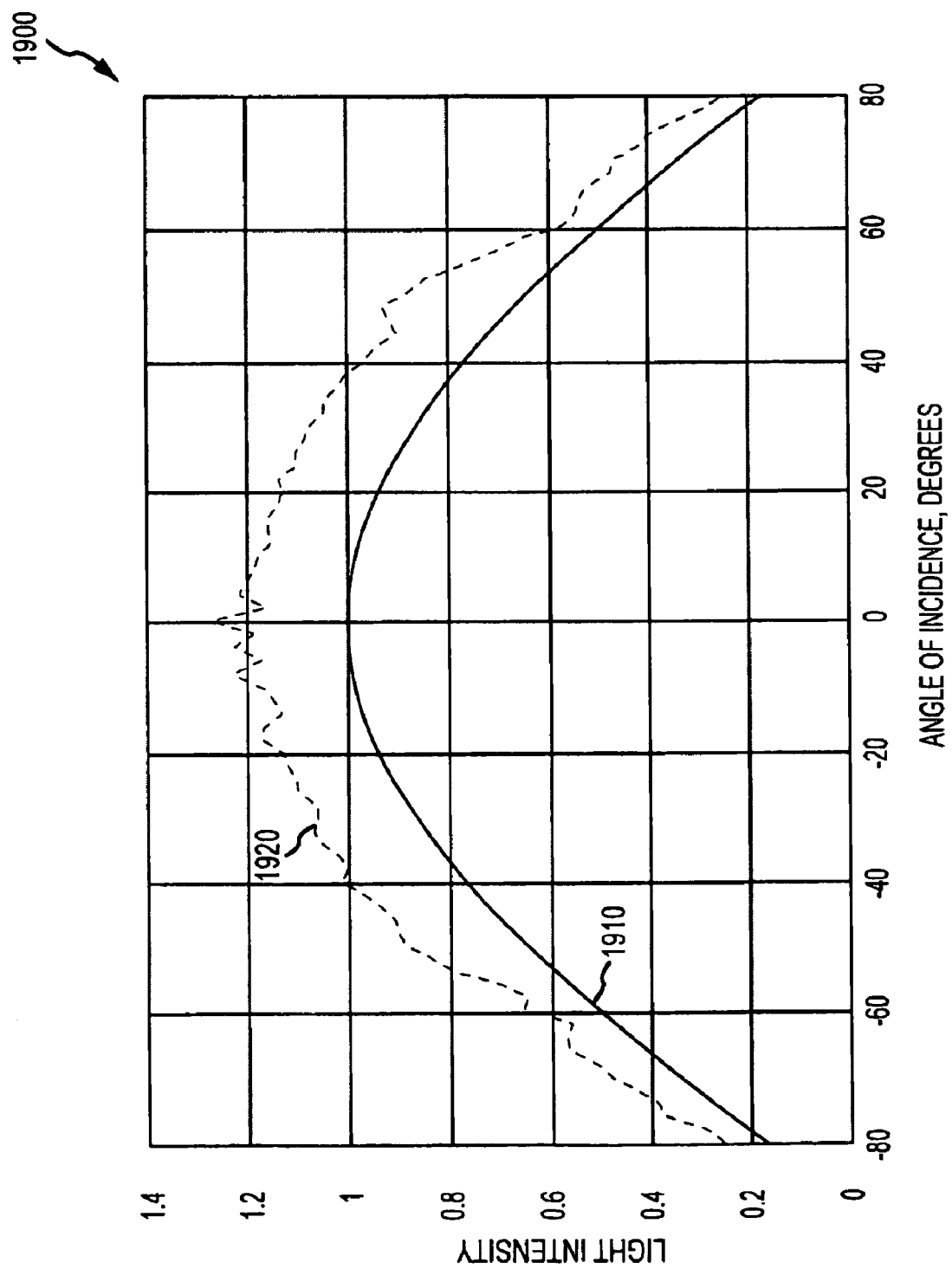
FIG. 19 is a graph showing light intensity as a function of angle of incidence of sunlight upon the PV enhancement film of FIG. 7.

The inventors also modeled the PV enhancement film 732 shown in FIG. 7. Ray tracings (not shown) indicated a significant portion of reflected light from the PV or light-receiving surface 725 was directed back onto the surface 725 for second, third, and additional chances for absorption. FIG. 19 illustrates a graph 1900 showing with line 1910 reference light intensity relative to angle of incidence on the surface 725 prior to application or installation of the PV enhancement film 730 in the assembly 700. Line 1920 illustrates increased intensity across the entire range of angles of incidence for the received light for the assembly 700 after application of the PV enhancement film 730. In this modeling, the TIR structures 734 had base widths of 10 mils, a thickness or height of 2 mils (as measured from the substrate 732, and effects of the substrate 732 were neglected for modeling purposes), and each structure had a wall or light-receiving/trapping facet or side having a 7 micron radius (in its arcuate cross section formed by a plane orthogonal to the longitudinal axis of the elongated body of the TIR structure). The average intensity with the film was found to be 0.875 while without the film the average intensity was 0.699, which represents an increase of about 25 percent (with a highly or perfectly reflective surface 725, and typical PV devices likely would see smaller improvements in intensity and corresponding efficiencies).

Figure 20:
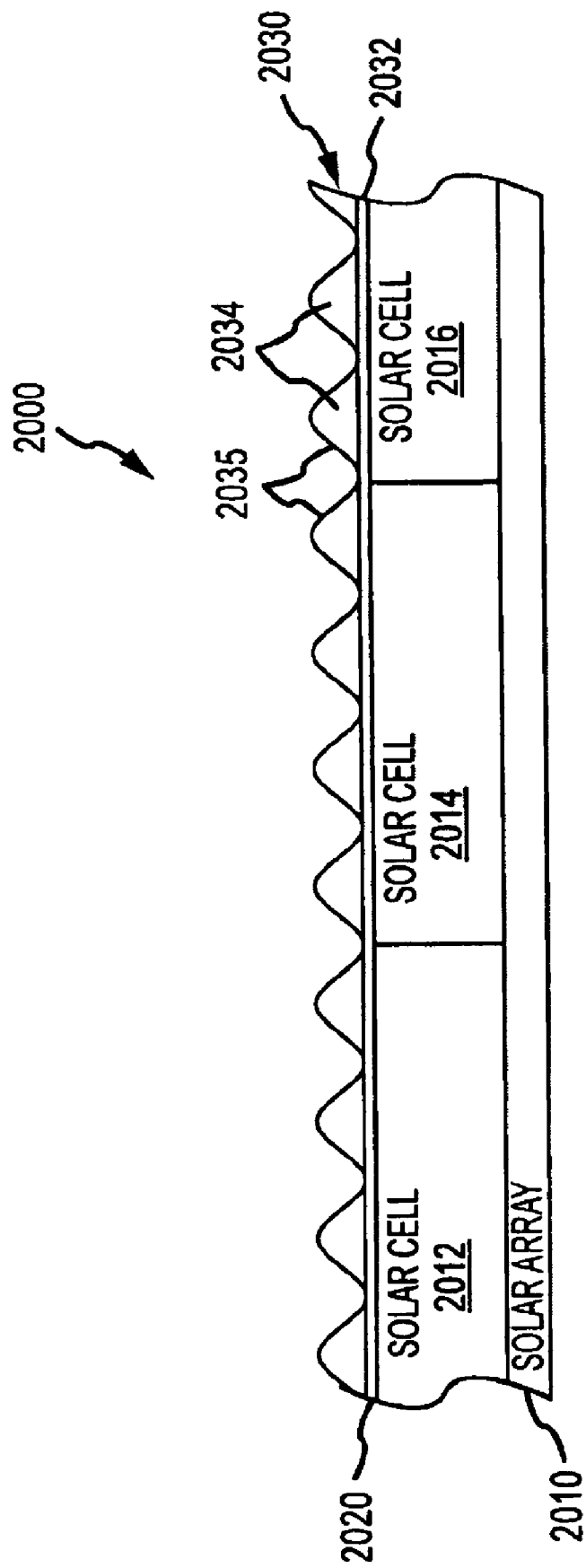
FIG. 20 is a schematic end view of a solar array assembly showing use of a PV enhancement film to improve efficiency of a set of solar cells of the array, with the film including a plurality of linear or elongated TIR structures defined by a sinusoidal light receiving surface.

With the above teaching in mind, one sided in the art will readily be able to expand the concepts to arrive at numerous additional PV enhancement film and TIR structure designs to provide a particular optical effect (e.g., particular light trapping for a planned implementation or use). For example, FIG. 20 illustrates a solar array assembly 2000 that includes a solar array 2010 including a number of solar cells 2012, 2014, 2016. The solar array 2010 (or the solar cells 2012, 2014, 2016) has a light-receiving surface 2020 that generally would be positioned to be directed toward or facing the Sun to receive sunlight when the assembly is in use to generate electricity from available solar energy. As discussed above, the design of the solar cells 2012, 2014, 2016 will typically result in the light-receiving surface(s) 2020 reflecting a percentage of the sunlight that strikes the surface 2020, with the percentage of reflected or lost (not absorbed) light varying with the cell design and also upon the angle of incidence of the sunlight on the surface 2020.

To enhance light capture, the assembly 2000 includes a PV enhancement film 2030 that is applied over the solar cells 2012, 2014, 2016 of the solar array 2010. The film 2030 includes a substrate or sheet 2032 of clear plastic, glass, or ceramic that is substantially transparent to light (e.g., highly transmissive) and includes a planar surface that is positioned adjacent and/or abutting light-receiving surface 2020. Upon an opposite side of the substrate 2032, a plurality of TIR elements 2034 are provided, and the elements 2034 have elongated bodies extending into the plane of the page of the drawing (e.g., FIG. 20 is an end view of film 2030) with the cross sectional shape of the bodies defined by a light-receiving wall or facet/side 2035. The surface 2035 in this embodiment is a sine wave (or is sinusoidal) with peaks and valleys.

Figure 21:
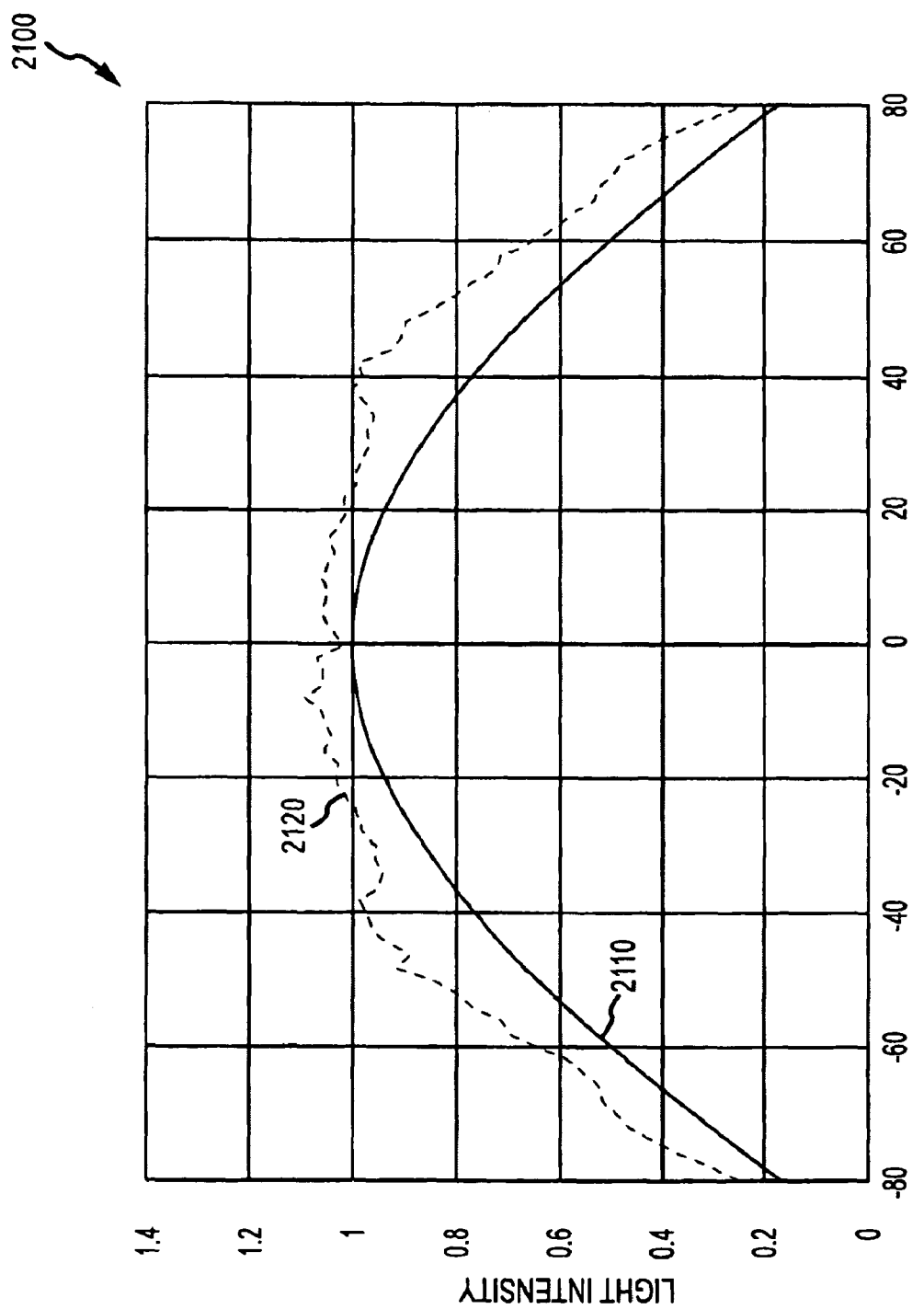
FIG. 21 is a graph showing light intensity on an array light-receiving surface as a function of angle of incidence of sunlight upon the PV enhancement film of FIG. 20 and upon the array without the film.

Modeling of an embodiment of the assembly 2000 provided the graph 2100 of FIG. 21 of light intensity as a function of angle of incidence. The line 2110 models light intensity on the solar array 2010 (or the light-receiving surface 2020) without the film 2030, and line 2120 graphs the light intensity of the light-receiving surface 2020 of the array 2010 (or individual cells 2012, 2014, 2016) when the film 2030 is included in the array 2000 as shown in FIG. 20. To facilitate modeling, the surface 2020 was assumed to be a mirror with 100 percent reflection, and the TIR structures 2034 were assumed to have base widths or pitch of about 10 mils and radius/height of about 7 mils. The average intensity as shown by line 2120 with the film 2030 was found to be 0.829 as compared to a 0.699 reference cosine average intensity without the film 2030, representing an increase of about 18 percent with an increase seen across the entire range of incidence angles.

Figure 22:
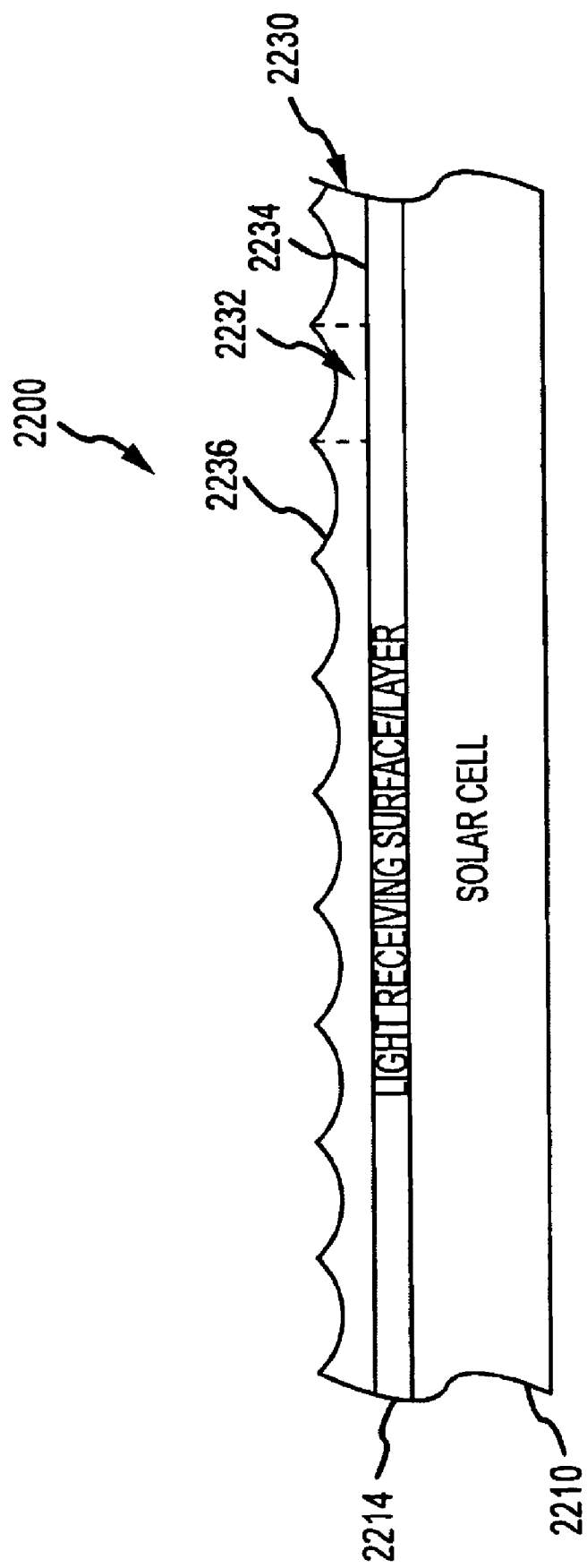
FIG. 22 is a schematic end view of a solar cell assembly showing use of a "cusp up" PV enhancement film in accordance with an embodiment of the invention.

FIG. 22 illustrates a solar cell assembly 2200 in accordance with another embodiment of the invention. In this embodiment, the assembly 2200 includes a solar cell or other PV device 2210 with a light-receiving surface/layer 2214 (e.g., a Si wafer with a front contact and AR coating and/or other layers such as a protective glass layer). Over the light-receiving surface 2214 of the cell 2210, a PV enhancement film 2230 is provided (e.g., applied by adhesive (not shown) or other methods to the cell 2210) with a substrate 2234 having a planar surface abutting or proximate to the light-receiving surface 2214. This embodiment may be thought of as a cusps-up embodiment, as each TIR structure 2232 in the film 2230 is defined by an arcuate side/facet 2236, which has a radius but is downward curved (e.g., generally U-shaped) rather than being upward curved as shown in FIG. 7. In one modeled embodiment, each facet or side 2236 had a radius of about 7 mils and a width/pitch (as measured between peaks of the light-receiving surface 2236 of film 2230) of about 10 mils. When a light intensity was calculated for one embodiment of the film 2230, it was found that the average intensity was about 0.820 while reference cosine average intensity was 0.689 (for a 95 percent reflective surface 2214), for a gain of about 19 percent. In another embodiment, the TIR structures had a pitch of 10 mils, a thickness at the peaks of 3 mils (as measured to include the substrate thickness), and cusp to PV material or light-receiving surface distance of 1 mil. In this embodiment, average intensity achieved was better at 0.937, which represents a gain (over no film) of about 35 percent.

Hence, it will be understood that the particular configuration of the TIR structures may be varied widely to achieve TIR/refraction-based trapping of light and to provide improved efficiency for a solar cell or solar array of cells. The particular TIR element design used may depend upon a number of factors including the material used for the film, manufacturing issues such as costs, and planned use (e.g., for a tracking or non-tracking array, to enhance light trapping at particular values of angles of incidence, and so on).

In many PV enhancement films, it may be useful to use a single TIR structure or element design. This may facilitate manufacturing and provide a consistent optical enhancement or light trapping level across the surface area of the film. However, the inventors recognize that there may be a need or desire to use two or more TIR structures (or TIR element designs) on a single PV film or in an assembly of PV films (e.g., films with differing TIR elements may be used together on a single solar array or cell to achieve a desired light-trapping effect). For example, a PV enhancement film may be provided with a sawtooth pattern of TIR elements on one side, and the TIR elements may have the same or differing pitches/base widths and/or the same or differing heights/body thicknesses to practice the invention.

In one film embodiment, the film includes a sawtooth pattern of TIR structures with a number of TIR structures of a first thickness and a number of TIR structures with a second thickness that differs from the first thickness (but with the same pitch in this case while other embodiments may differ the pitch for the two TIR structure designs). The two TIR structure embodiments may be alternated on the film or one TIR structure thickness may be provided for a first set of TIR structures and then the other TIR structure thickness may be provided for a second set of TIR structures and so on in this pattern (e.g., 10 TIR structures of the first thickness and then 10 TIR structures of the second thickness or another alternating pattern). In this manner, two light intensity or light-trapping characteristic curves may (or TIR structure functionalities) may be blended within a single PV enhancement film (or two or more films arranged upon a solar array to provide the differing TIR structures). For example, sheets or films each containing a particular TIR structure arrangement may be laid upon different portions of a solar panel of PV cells. Each location would have the optical response characteristics associated with the overlying PV enhancement film and its TIR structures. The overall effect from each location to the output of the panel or array would be an average response that may be desired by a solar array designer/user. The customer or user of the PV enhancement films could pick and choose the PV enhancement films based on their optical characteristics (e.g., in what incidence angle ranges do they provide better performance and so on) and install (in a retrofit example) or provide during manufacture the films across the PV panel or array to get the optical response they desire. Of course, three or more TIR structure designs may be used together to enhance the efficiency of a solar panel/array or a solar cell and fine tune a PV response.

FIG. 23 illustrates schematically an end view of a solar array (or PV device) assembly 2300 that makes use of the concept of two or more TIR structure designs being included in a single solar array assembly or even a single PV enhancement film. As shown, the solar array 2310, which typically would be formed with a plurality of solar cells, has a light receiving surface/layer 2312 that is positioned in use to receiving incident sunlight. To trap light reflected or lost from surface 2312, the assembly 2300 includes a PV enhancement film 2330 (e.g., a relatively thin sheet of transparent plastic, glass, ceramic, or the like) that is positioned to at least partially cover the light-receiving surface 2312 (e.g., front surfaces of solar cells or other portions of PV structures). Instead of a single TIR structure design, the film 2330 includes two TIR structure arrangements that are alternated across the surface of the film 2330 (whereas other embodiments may include two or more of one design and then alternate with the second (or more) design).

The film 2330 includes a substrate or film 2332 of substantially transparent material, e.g., with a planar surface for abutting or being positioned proximate to light-receiving surface 2312. The film 2330 further includes a plurality of TIR structures upon the substrate 2332 with alternating configurations. As shown, a first configuration is represented by TIR structure 2340 that includes first and second facets 2342, 2344 (e.g., has a triangular cross section), and a second configuration is represented by TIR structure 2350 that includes first and second facets 2352, 2354 (e.g., has a triangular cross section). In this embodiment, the TIR structures 2340 and 2350 have the same base size or pitch but differing heights/thicknesses to provide differing optical characteristics (e.g., to achieve differing reflectivity or TIR effects at varying angles of incidence of sunlight upon the solar array 2310). These TIR configurations are alternated across the width or length of the light-receiving surface of the film 2330. While sawtooth designs are shown in FIG. 23, it will be understood that other TIR structures may be mixed and/or alternated such as structures with 3 or more facets (e.g., to provide a triangular cross section, a pyramid cross section with three, four, or more facets), arcuate or cylindrical structures, sinusoidal structures, inversed curve (or cusp-up) designs, and so on.

Figure 24:
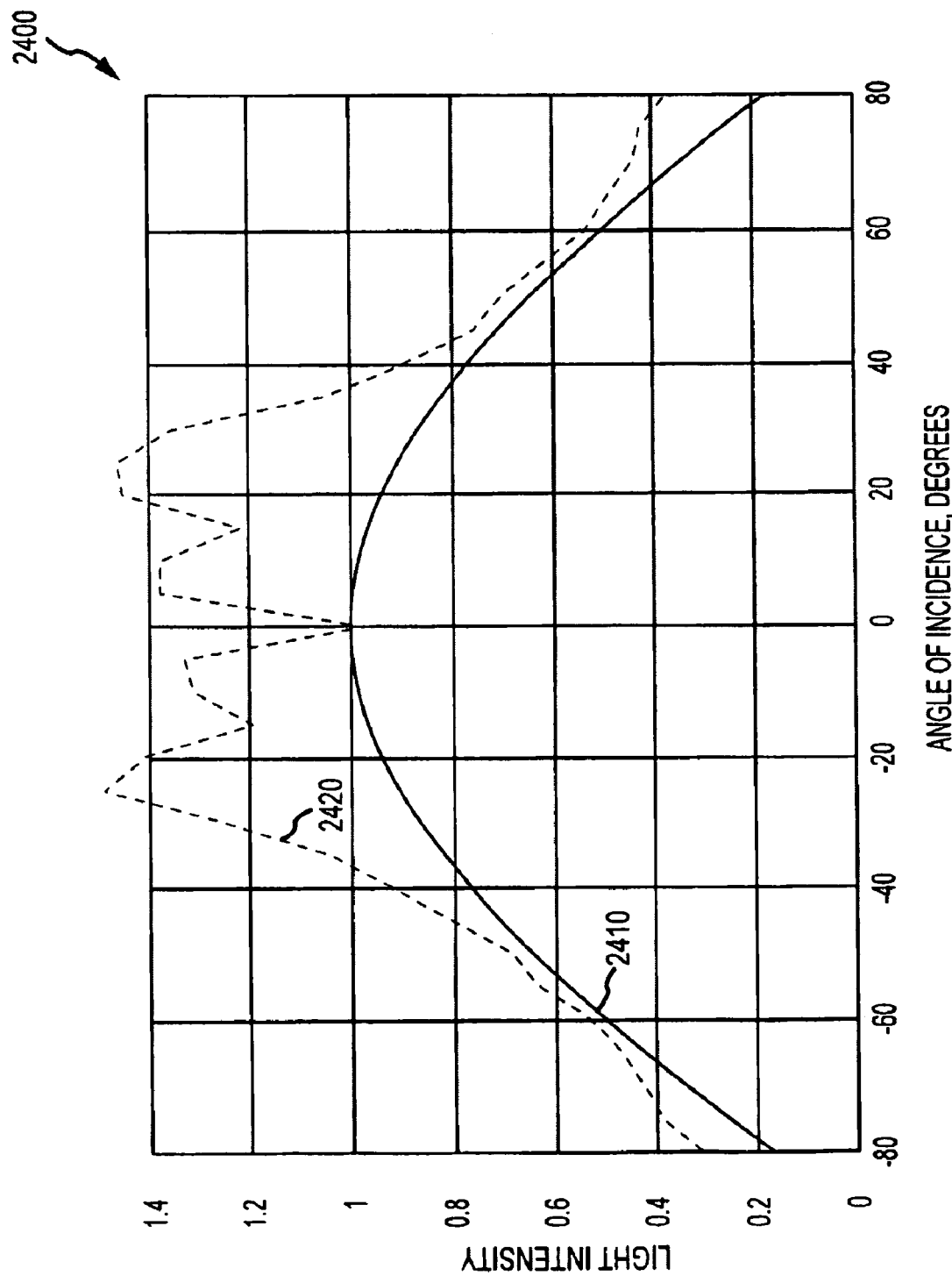
FIG. 24 is a graph showing light intensity on a solar array light-receiving surface as a function of angle of incidence of sunlight upon the PV enhancement film of FIG. 23 and the array without the film.

To evaluate the film 2330 of FIG. 23, the pitches (or base widths) of the TIR structures were set at 10 mils while the height or thickness of the first TIR structure 2340 was set at 3 mils and the height or thickness of the second TIR structure 2350 was set at 4 mils. FIG. 24 illustrates a plot or graph 2400 of light intensity as a function of angle of incidence on the light-receiving surface 2312 (which was assumed to be 95 percent reflective or a mirror in this test run). Reference cosine average intensity is shown with line 2410 without use of the film 2330, and average intensity at the surface 2312 with use of the alternating sawtooth PV enhancement film 2330 is shown with line 2420. When a film with only 3 mil thick TIR structures was modeled using the included TIR element evaluation or ray tracing routine, there was a relatively large gap in achieved gain in the smaller values of angle of incidence. But, when a film with only 4 mil thick TIR structures was similarly modeled, there was relatively high gain in these same ranges of values of the incidence angle (e.g., −18 degrees to 18 degrees or the like). Then, when the film 2330 of FIG. 23 was modeled with alternating thicknesses of 3 and 4 mils was tested as is shown in FIG. 24, it was found that light intensity was enhanced more effectively across the range of incidence angles. The average intensity was found to be 0.901 with the film as compared to 0.689 without, for a gain of about 31 percent (but, of course, when reflection is much lower than 95 percent the gain or enhancement achieved will be lower).

The inventors recognize that many other cross sectional and overall shapes for the TIR elements may be useful to practice the invention, and many of these configurations are believed to be considered within the breadth of this description when considered alone or in combination with the attached figures. For example, FIG. 6 illustrates use of linear, three-sided or faceted TIR element 614 in the PV enhancement film 610. These may be considered to have pyramid cross sections with three sides. The TIR elements 614 in some preferred embodiments may be modified to include 4 sides/facets such that the two lower sides of the TIR element are angled inward from the substrate 612 and the upper sides/facets may be angled inward at a sharper angle to meet at a point/apex. In other embodiments, five or more facets may be included in the cross section of the linear or elongated TIR elements 614. Likewise, such 3, 4, or more sided TIR elements may be used in the sawtooth PV enhancement film 2330 shown in FIG. 23 with varying designs being alternated (two, three, or more cross sectional shapes may be provided in a repeating pattern or provided in groups that repeat once, twice, or more times across the surface of the film 2330). Further, the inventors understand that PV enhancement films shown in FIGS. 8-11 may be modified to include pyramid shaped TIR elements (in place of the cone or frustoconical shaped structures and dome structures or to supplement such pyramid-shaped TIR elements). These standalone pyramid TIR elements may be three, four, or more sided pyramids in which the sides meet at a point (e.g., with each side mating with the substrate at a variety of angles such as 30 to 70 degrees with 45 to 60 degrees being useful in some embodiments) or meeting at a peak surface, which may be planar (e.g., a flat top such that the shape is a truncated pyramid), domed/arched, or another configuration facilitating manufacturing and/or capture of received sunlight.

It may also be useful to further discuss the decision of whether to provide TIR elements that are pyramids and/or three-dimensional structures or that are linear triangular cross section structures. For a perfect orientation of linear triangular structures (TIR structures) to the seasonal azimuth of the Sun, the direction of the linear structures would be in a perfect North to South orientation, and the panel would be placed in a perfect orientation East and West with the panel facing the Sun at mid day perfectly with both axis points parallel to the pathway of the Sun. The above placement/use, however, can typically only be accomplished by mounting panels exactly to the azimuth of the sun in the East to West orientation. However, this is not likely or often practical, as most rooftops are not conducive to this and rather have off-angles in most cases. In addition, even if this were possible (with mounting brackets, by design, or with luck), one would still need to adjust for the seasonal azimuth to the sun to compensate for the 42-degree angular difference from summer to winter.

The testing procedure and software used to model PV enhancement films allowed the additional efficiencies obtained by using linear TIR structures to be measured and modeled in a linear diagram with triangular cross section structures (e.g., in order to observe the individual angular effects and resulting TIR with "ideal" placement), and, hence, some of the initial designs and prototypes utilized two-faceted TIR elements. Given ideal circumstances (e.g., perfect placement), the results would be measureable with these triangular structures and results documented appropriately. However, since ideal placement in the field or home use is unlikely, a three-dimensional structure such as a pyramid is believed by the inventors to provide performance enhancement at off-angles in the direction perpendicular to the linear structure (e.g., a three-faceted pyramid, a four or more sided structure, or similar cross section may be preferred in many applications). Overall, performance enhancement characteristics in non-perfect installations (most installations) may be as much as double or more using pyramidal or three-dimensional (non-linear or linear or 4 or more sided) structures. Typical placement of panels (non-ideal placement) provides not only normal cosine fall off and decreased efficiency from normal sunrise to sunset but also non-perfect placement to the seasonal azimuth of the Sun resulting in additional cosine fall off and resulting reflective losses. Since a pyramidal structure having appropriate benefiting angles in several directions increases TIR and decreases cosine fall off from several angles, overall efficiencies are improved even more than a control model with perfect placement to the Sun. In other words, a non-perfectly placed panel may achieve 10% efficiency overall without the film yet may achieve 18% or more with the pyramidal film, while only 14% may be achieved with linear structures because of the incident angles to the structures.

Numerous methods of manufacturing may be used to provide the PV enhancement films (and apply these films to existing or being fabricated cells, PV devices, and/or solar arrays). For example, various base films may be used as carriers, and the carrier film itself may or may not have photovoltaic material already applied to the film. Base films may be PET, acrylic, OPP, Polycarbonate, polyethylene (high or low density) or even thin glass. The TIR structures may be engraved into a metal, glass, ceramic, rubber, photopolymer or plastic cylinder with diamond tooling, or by a photo-polymeric exposure system, or even laser engraved. The structures may be placed into the film with a combination of heat and pressure with an embossing system in a roll form, or with a hot die stamp and platen directly onto the film itself Conversely, they may also be cast with UV cured liquid or e-beam, or any type of energy cured polymer or solvent based polymer in roll or sheet form. One preferred method of manufacture may be electron beam casting using polymers that are engineered for durability in the sun.

Many of the above examples and evaluations were limited to a two-dimensional analysis or ray tracing of incident light. In other words, the results in the program take into account a linear structure running in a North-South direction, with the Sun rising in the East and setting in the West and with the collector optimized for the seasonality of the Sun. Therefore, it is believed that implementing the TIR structures as nonlinear, 3-dimensional shapes such as pyramids, cones, domes, frustoconical shapes, and the like may provide even better results and potentially increase the effectiveness in a real life applications exponentially. Keeping this in mind, overall increases in efficiency may go up to more than 100 percent in many cases depending upon the placement of the solar panels or PV devices with the PV enhancement films (e.g., which may be determined by roof shape not based upon optimum angular placement in residential settings and some commercial applications).

In brief, the PV enhancement films provide structures over a solar cell, a solar array, a PV film, or combined with PV film or materials, and the TIR structures are adapted to purposely create total internal reflection. The PV enhancement films (or at least the TIR structures) are made of glass, plastic, ceramics, or energy cured polymers that are substantially transparent (e.g., transmit a large portion of received light). The TIR structures may be nearly any size or thickness, but, in practice due to economic realities, manufacturing challenges, and other reasons, the TIR structures (and the films) often will be under about 100 mils in thickness and routinely under about 5 mils. Some embodiments of the PV enhancement films include elongated or linear TIR structures with two, three, or more straight (or near straight) facet or sides angling inward from the substrate of the film at 10 to 60 degrees. These structures may be saw tooth shapes (when viewed in cross or on end) with 50 degree (45 degrees may be ideal for directly overhead sun) to under 20 degree inwardly-angled sidewalls. In other embodiments, PV enhancement films may include 3D or non-elongated TIR structures that can be 3-sided to a sharp point, be hexagonal shapes to a sharp point, may be cone shaped structures 10 to 60 degrees sidewalls with a point or a flat, planar top, may be circular in cross section to form a series of domes on the PV film surface, or have other shapes to provide TIR effects in a 3D context. It should be noted that the TIR structures, including the linear lenticular-like structures with regular Pi or round radii cross sections designed to go over the top of the PV materials, do not act to "focus" the received or incident light but act to trap reflected light coming off of the covered solar cell or light-receiving surface (e.g., the lenticules of such a PV enhancement film are truncated and appear to be parts of "circles" from a side view and are not configured for focusing received light onto the solar cell). The 3D TIR structures may be dome shaped or "fly's eye" structures. Again, the TIR structures are not designed to focus light (and do not work like regular lenses), but, rather, the TIR domes sit directly on the PV materials (or are the base film for the PV materials) and act to provide TIR trapping of reflected light from the PV materials. A normal lens would have to have a height-to-width ratio of about 1.5 or 2 to 1 H/W to create a focus in a linear or round lens. In contrast, the described TIR structures almost have no height (e.g., are very thin in most cases) and may be thought of as truncated "circles" or thin hemispheres sitting or positioned upon the light-receiving surface of the PV material or of the solar cell(s).

One way to understand some of the concepts of this invention is to understand that a certain percentage of rays that enter through the microstructures (e.g., TIR elements or structures) and hit the film substrate and then the PV material (or light-receiving surface of a solar cell/array) will always be lost. This is due to the relationship of the exiting angles and the point of impact of the wall and those angles (e.g., reflect in directions such that they strike the sides or facets of the TIR structures/elements at angles greater than 42 degrees). It is important to understand that the percentage of deflected rays from PV materials is much greater when light from the Sun in relationship to the panel (which includes the PV materials such as within solar cells) is at a greater angle, which leads to greater deflection and less efficiency, and this occurs typically when the Sun is not at perfect angles to the collector (e.g., not directly overhead at noon or the like). However, a great many of the unabsorbed rays that are deflected from the PV film will try unsuccessfully to exit the microstructures and will be deflected through TIR one or more times (e.g., to a theoretical but nearly impossible infinite number of times), and this TIR functionality of the TIR elements of the invention creates multiple chances and multiple possibilities (and practical differences in angles at every "strike"). Overall, the TIR structures provide a significant mathematical increase in probability for absorption. For instance, operation of a solar array may experience 50 percent of the rays being lost due to cosine fall off or other structural deflections during the daytime as the Sun moves across the sky. But, with the use of the PV enhancement films designed in accordance with one or more embodiments of the invention with one or more TIR structure configuration, most of the deflections are eligible for TIR deflection back to the PV materials (or light-receiving surfaces of a solar array or solar cell or PV device).

The following formulas may be used, with actual data from PV materials for input, to test individual PV enhancement films and/or PV assemblies that include such films and TIR structures. A possible example is as follows:

$X$=deflected rays (70% of rays)

$Z$=newly absorbed rays from TIR (20% of X)

$S$=original efficiency (100%−70%=30% and then (0.30)(0.20)=0.06 or 6%)

$H$=increased efficiency: with $X$=70%, $H$=(0.20)($X$)= (0.20)(0.70)=0.14

Total efficiency=$S+H$ or, in this example, 6%+14%=20% (versus 6 percent original)

More importantly, the above was drawn from the following formula, each individual range below in angles represents an efficiency gain at each of the angles including cosine falloff as a result of the following angles times 2 (covering 140 degrees) as a result of a positive angle or a negative angle.

$I$=incoming rays from 60 to 70 degrees (also −60 to 70 degrees)

$J$=incoming rays from 50 to 60 degrees (also −50 to −60 degrees)

$K$=incoming rays from 40 to 50 degrees (also −40 to −50 degrees)

$L$=incoming rays from 30 to 40 degrees (also −30 to 40 degrees)

$M$=incoming rays from 20 to 30 degrees (also −20 to −30 degrees)

$N$=incoming rays from 10 to 20 degrees (also −10 to −20 degrees)

$O$=incoming rays from 0 to 10 degrees (also −10 to 0 degrees)

The above represents approximately 12 hours of daylight or sunshine. Negative numbers represent morning and positive numbers represent afternoon. Positive and negative numbers will yield the same data. For purposes of formula, each set of angles will count twice (one for negative and one for positive). Currently, this formula does not take into account angles resulting from other than ideal panel placement in a north south seasonal azimuth. The reason for this lies in the existing program, and the method of ray racing the program in a linear way and in two dimensions instead of three dimensions. This can be addressed later in future program versions. In other words, it is important to note that in these conditions further mathematical efficiency improvements would be found from this invention. Additionally, linear TIR structures may not yield the best results, and this is why several different TIR structures are and PV enhancement films are shown in the figures with non-linear or non-elongated TIR structures.

Therefore, to find the values of each value (I–O) use, $V$=Value (indicating total value) times 2 (not squared). For example: Total value of $I$=value of I X2, which takes into account the morning and evening values. For the purpose of this modeling, the rays being deflected in the ray tracing program striking the strips of absorbers will simulate absorption of the ray, when in fact that ray may be deflected again by the PV material, and then be sent back again by the microstructure. Since the inventors found it difficult to perform this rather subjective experiment with the ray tracing program, the following procedure was used to evaluate TIR structures and PV enhancement films:

Baseline 1. 50% of the "space" between the measurements of the proposed (before placing the structures) structures has 10 separate strips equating to 5% each of the total space as absorbers, and the corresponding remainder are mirrors.

2. Rays are then traced at each value (average value) in each category by changing the incoming ray angles in the programs.

3. Absorbed rays are then recorded with the same input data.

Micro Structures Addition

1. Repeat the above, only with the structures.

2. Measure the values using the structures, and calculate the increased absorption.

3. Calculate the absorption by value (angle)

4. Calculating the theoretical addition of the addition of variance in the "Y" axis describing efficiency increases in normally placed field application (imperfect placement).

As discussed at the beginning of this detailed description, the TIR structures may be configured to provide a modification or even an optimization of a path length of incident rays on a PV element or device, and the PV enhancement films may be thought of as including absorption enhancement structures (which provide path length enhancement and also TIR capturing of reflected rays). One of the ways to increase the efficiency of a PV cell output is to increase the path length of photons traveling in the PV material. Such a path length increase improves the chances of absorption and, thus, the conversion efficiency of sunlight power into electrical output power for a PV device or solar power assembly that includes PV enhancement films with properly designed absorption enhancement structures or elements.

The condition of greatest intensity of sunlight striking a surface occurs when the surface (e.g., the light receiving surface of a PV device or of PV material) is perpendicular to the direction of sunlight because the intensity falls off from this point as the cosine of the angle of the incident rays. Rays falling on a PV material perpendicular to the PV light-receiving surface pass through the material along the direction of the shortest path (e.g., have an optical path length equal to about the thickness of the PV material). Manufacturers of PV devices such as solar panels of cells often apply a mirror surface on the back surface of the PV material (opposite the light receiving surface) in an attempt to get a second pass/ chance for absorption (and, in effect, obtain some additional path length), but this second pass still occurs at the shortest (or a relatively short) path length direction as the rays are returned by the mirror surface along the mirror reversed path. A longer path length occurs for rays entering the PV material at an angle, but, due to the cosine fall off in intensity, the efficiency increase in absorption due to these longer path lengths is significantly reduced by the cosine fall off.

One aspect of embodiments of the present invention is to provide PV enhancement films with absorption enhancement structures adapted to increase path lengths of rays traveling in the PV material of a PV device (such as a solar panel or array of solar cells) in order to get increased output from light falling on or incident upon the PV collection system (e.g., to better convert incident light on light receiving surfaces of the PV material into electricity). This aspect or feature is achieved via two aspects of the specially designed optical structures provided on the PV enhancement film. One feature is that the angle of rays from the optical or light receiving surface of the absorption enhancement structures refracts rays upon the light receiving or entry surface of the PV device (e.g., a solar cell, a PV cell, or the like with PV material) such that the rays travel in longer paths than they normally would in the PV material without inclusion of the film and its absorption enhancement/TIR structures. The second feature is the property of reflecting back rays that normally would escape from the system or device after not being absorbed by the PV material by using TIR. In practice, both path length increase and TIR redirection are accomplished by using the absorption enhancement structures described herein, which are typically computer-optimized, and provided on an outward facing, light-receiving surface of a PV enhancement film.

Figure 27:
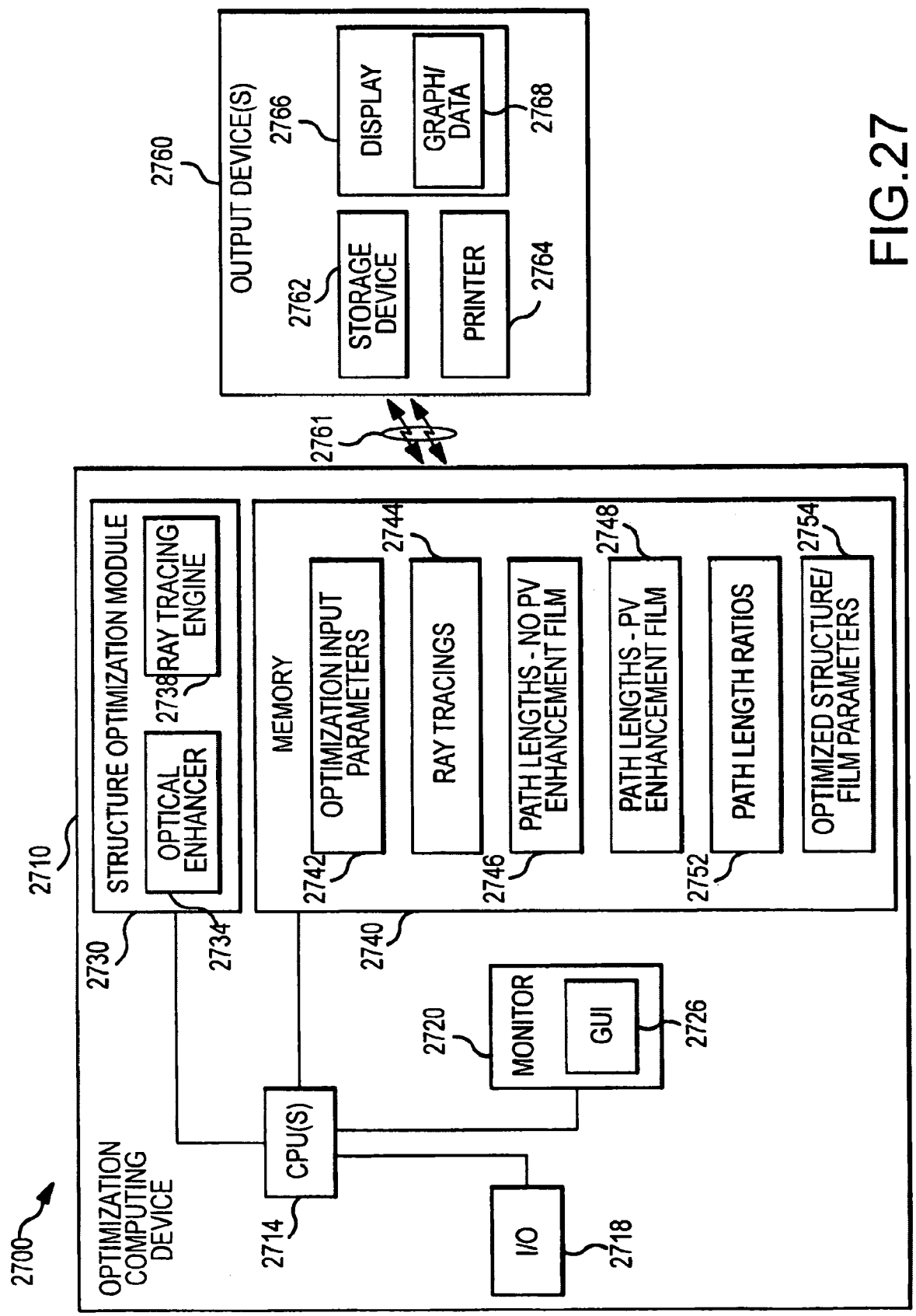
FIG. 27 is a functional block diagram of a computer system particularly adapted (e.g., running computer program products or code provided on computer readable medium with one or more processors) to provide the absorption enhancement structure optimization functions described herein including providing a transformation of input data and/or other modeling information to ray tracings, path lengths, path length ratios, and optimized structure/film parameters that are stored in memory and/or output to output devices such as computer-readable medium/storage devices, printers, and display devices (e.g., displayed on a monitor of a computing or electronic device)

FIG. 27 illustrates a computer system or computer network 2700 adapted for supporting optimization of PV enhancement film by, in part, performing optimization processes for absorption enhancement structures including performing ray tracing over a range of incidence angles for one or more structure configuration/design, determining path lengths and path length ratios that compare use of a PV enhancement film with a PV device without such film, and determining if improvements are achieved to identify an "optimized" structure for a particular PV device. The system 2700 includes an optimization computing device 2710 that may take the form of nearly any computer or computing device such as a personal computer with one or more processors or CPUs 2714. The number of calculations that are performed by the device 2710 may number in the many millions to billions for each structure being tested/modeled, and, hence, it is desirable for the processor 2714 to be a relatively high speed and high capacity processor (and/or the computer 2710 may include two or more cores/CPUs 2714 to this end). The computing device 2710 uses the CPU 2714 to manage I/0 devices 2718 such as keyboard, a mouse, a touch screen, voice recognition software, and other user input/output devices. The CPU 2714 also manages operation of a monitor 2720, which may have a GUI 2726 to facilitate user data entry such as entry of the optimization input parameters 2742, and manages memory 2740, which may be local or remote but accessible (in a wired or wireless manner) by the CPU 2714 to perform optimization processing.

Figure 28:
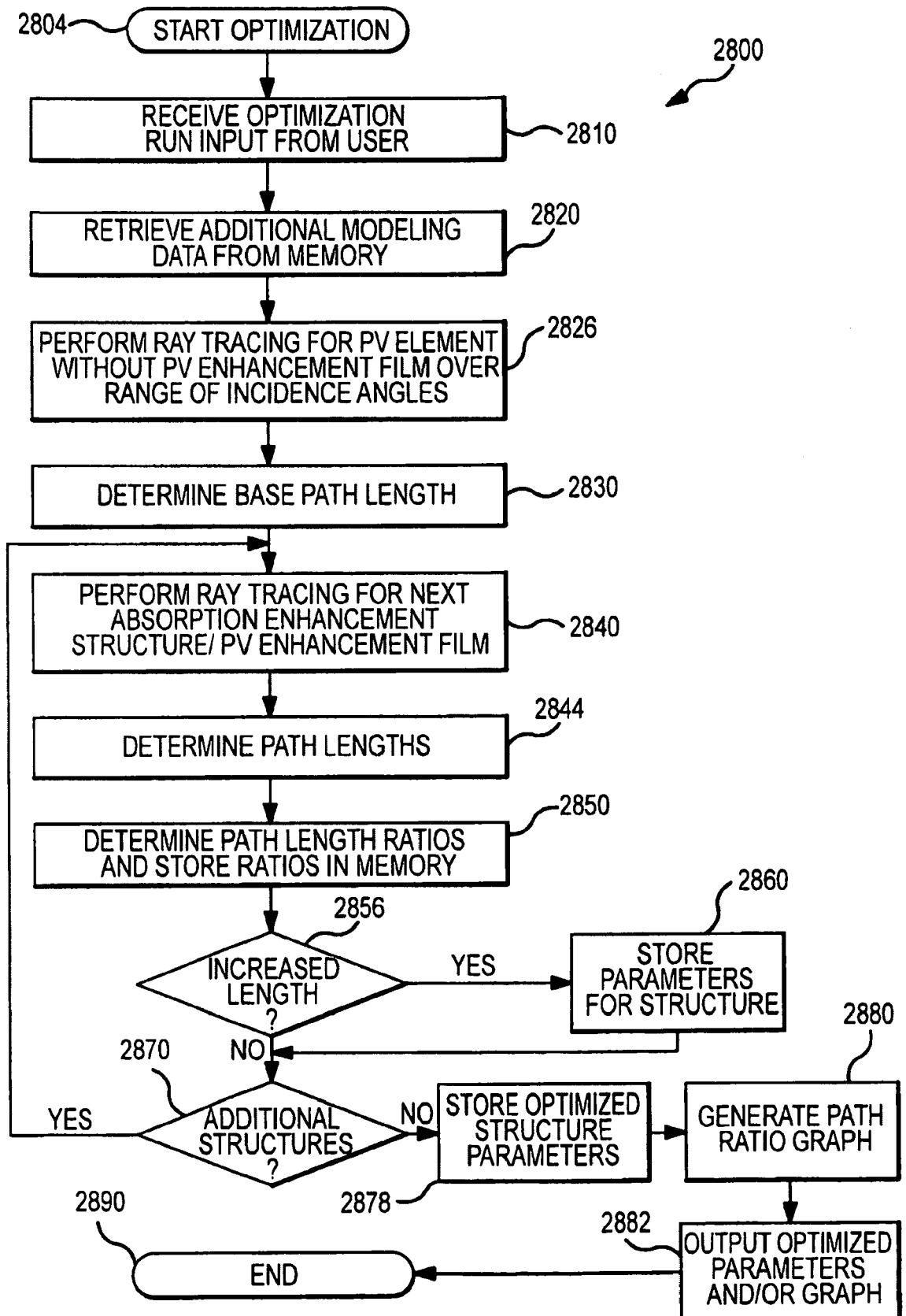
FIG. 28 illustrates a flow chart or diagram of a structure/film optimization method or computer-implemented method that may be provided by the operation of the system shown in FIG. 26, e.g., by running a structure optimization module in accordance with one or more embodiments of the present invention.

The optimization computing device 2710 uses the CPU/ cores 2714 to run a structure optimization module (or PV enhancement film optimizer engine or the like) 2730 that typically is provided as code in one or more programming languages stored or accessible in memory 2740 or other computer readable medium that is configured to cause the computing device 2710 (or CPU 2714) to perform the optimization functions described herein (such as the method 2800 shown in FIG. 28). The optimization module 2730 may run or call an optical enhancer 2734 to perform numerous functions such as determining path lengths and/or path length ratios, determining when improvements are provided over prior ratios, and so on. The module 2730 may also call or run via CPU 2714 one or more ray tracing engines 2738 to provide ray tracings for a PV device with and without addition of one or more PV enhancement film configurations over a range of incidence angles.

Memory or data storage 2740 is used to store a variety of input information used by the optical enhancer 2734 and ray tracing engine 2738 and a variety of output results (intermediary determinations such as path lengths as well as final results such as optimized structures/films for a PV device and path ratio and ray tracing graphs). As shown, the memory 2740 is used to store optimization input parameters 2742 (such as parameters defining/describing a PV device and defining a PV enhancement film and its structures to be modeled/tested), ray tracings 2744 for one or more PV devices and devices with PV enhancement films, path lengths without PV films 2746 and with PV films 2748, path length ratios 2752, and optimized structure/film parameters 2754 (e.g., the structure or PV enhancement film defining parameters or characteristics for a modeled PV enhancement film that provides more significant improvements in path length ratios, for example, and/or for improved intensity over a particular range of incidence angles striking a PV device).

The product or output generated by the structure optimization module 2730 may be thought of as the transformation of input parameters and/or other modeling data into the optimized structure/film parameters 2754 and/or graphs (such as path ratio or intensity graphs provided in the attached figures). Such generated output may be transmitted via wired or wireless digital communication links 2761 to one or more output devices 2760. Such devices 2760 may include digital data storage devices 2762 such as portable memory devices (USB memory devices and the like, disks, and so on) or other data stores such as tape drives, servers, and the like. The output devices 2760 may also include one or more printers for printing out graphs or data reports showing the data generated by the module 2730 run by CPU 2714 (such as a listing or table including the optimized structure/film parameters 2754). Further, the output devices 2760 may include one or more display devices 2766 that may be used to display graphs and/or data (such as parameters 2754) on a screen to a viewer/user of the devices 2760.

FIG. 28 shows an optimization process 2800 that may be implemented by the system 2700 (such as by computing device 2710 running optimization module 2730 to cause the processor(s) 2714 to perform the steps of process 2800). It may be useful to describe the process 2800 in more general terms and then proceed with several specific examples of its use to model/optimize a PV enhancement film by selecting absorption enhancement structures useful for providing a desired path length ratio (or path length increase relative to a PV device with no film) and/or TIR that combine to provide a desired improvement in intensity (or increased conversion efficiency of the PV device). As shown, the process 2800 starts at 2804 such as with selection by a user of a particular PV device to be used with a PV enhancement film. As discussed above, many PV devices will include a protective cover/top (such as a layer of glass or the like) that may be applied to the PV material with adhesive. In other embodiments, the PV enhancement film may be applied directly to the PV material (with adhesive or the like) such as by providing the absorption enhancement structures as part of a glass or other material protective cover/top (e.g., provide the structures in a glass cover layer). The starting step 2804 may also include selecting a particular shape and/or arrangement of the absorption enhancement structures for use with the film such as by running the process 2800 for a particular cross sectional shape for elongate structures (such as triangular cross section, elongated structures as shown in FIG. 4) or for individual members as shown in FIG. 8.

At step 2810, with reference also to FIG. 27, a user may enter or select optimization run input 2742 that may be accessed or received by the optimization module 2730. The input parameters may include characteristics of the PV device (e.g., PV material, cover plate or top, adhesive, and thicknesses and refractive indices for each) and of the PV enhancement film including for the structures such as their pitch, thicknesses, refractive index, shapes/configurations, and other parameters that may be needed to properly perform ray tracings through a solar cell or PV device assembly including the film. The user may also enter one or more ranges of angles of incidence or sunlight for use in the optimization run (e.g., optimize over plus/minus 80 degrees, plus/minus 40 degrees, or some smaller range that may have been a weakness of another structure design such as plus/minus 10 degrees or plus/minus 20 degrees or the like). At 2820, the optimization module 2730 may act to retrieve additional modeling data 2742 from memory 2740, which may include retrieving default values for PV elements and/or structures, retrieving refractive indices when materials and thicknesses are entered, retrieving default ranges of angles of incidence when these are not entered/set by a user, and the like.

At 2826, the method 2800 continues with performing ray tracing for the PV element defined in steps 2810 and 2820 prior to a PV enhancement film being applied. This may be performed by the ray tracing engine 2738 run by CPU 2714 over a range of angles of incidence and the product of such data processing may be stored at 2744. In step 2830, the method 2800 includes determining a base path length through the PV material at each angle of incidence in the range (or at a subset of such angles of incidence such as performing tracking at each degree, at every other degree, or the like or at fractions of degrees such as by performing a tracking at each 0.5 degrees or the like). These base path lengths are stored at 2746 in memory 2740. The method 2800 continues at 2840 with the ray tracing engine 2738 performing ray tracing for a next absorption enhancement structure (or PV enhancement film with a particular structure configuration defined by user input provided via step 2810 and/or default information via step 2820). At 2844, the path lengths are determined for this structure/film such as by optical enhancer 2734 or tracing engine 2738, and these produced path lengths over the range of angles of incidence of concern are stored in memory 2740 at 2748. Again, these path lengths 2748 represent the achieved or modified path lengths achieved by applying or including a PV enhancement film in PV device or solar cell assembly (such as changing the direction of the received or incident light with an outer or refraction surface of the structures on the PV enhancement film).

At step 2850, the optical enhancer 2734 acts to determine the path length ratios comparing the PV device or solar assembly with the PV enhancement film and without the film (a base device). The ratio may be determined at each angle of incidence or at the same angles of incidence for which the path lengths were calculated at steps 2830 and 2844, with no improvement or change for each angle of incidence being equal to one and an increase in length being shown as a ratio greater than one (e.g., a ratio of 1.1 indicates an increase in path length of 10 percent at the particular angle of incidence). These ratios are stored in memory 2740 at 2752. At 2856, the optical enhancer module 2734 determines whether there was an increase in path length based on these ratios (with an initial comparison being against base or a ratio of one) relative to previously tested/modeled structures or films. If yes, the method 2800 continues at 2860 with storing the parameters defining the present structures or PV enhancement film as optimized structure/film parameters 2754 in memory 2740. If no, the enhancer 2734 determines at 2870 whether there are additional structures/films to be tested, and, if so, the method 2800 continues at 2840 with performing additional ray tracing and path length calculations for a next absorption enhancement structure or film containing such structures.

If there are no additional structures/films to process with optimization module 2730, the method 2800 continues at 2878 with storing optimized parameters 2754 (or identifying these previously stored data points as the best results for structure designs based on improvements in path length shown by high ratios over a particular range of angle of incidence). At 2880, the structure optimization module 2730 may further function to generate one or more path ratio graph, which may be transferred at 2882 to output devices 2760 for storage in devices 2762, output to a printer 2764, and/or display on a monitor 2766 as graph 2768 (with input and/or produced date such as the ratio values and path length values and the like) for viewing by users of the system 2700. The method 2800 ends at 2890.

The method of calculation used to design the above-described surface of a PV enhancement film includes in some embodiments using a computer (as discussed with reference to FIGS. 27 and 28 for example) to trace parallel rays arriving at a PV structure or absorption enhancement structure from various angular directions simulating the sun rays incident on the PV structure throughout the day (or over a particular range of angles of incidence). Then, the computer may run one or more software modules to calculate the path length of the rays in the PV material for various angles of incidence. The total path length obtained from this ray trace is compared to the total path length without the optical device in place (e.g., without use of a PV enhancement film in a solar cell assembly or a PV device) to obtain a path length ratio for the film.

Thus, for example at 30 degrees incidence, if the total path length of the rays traced without any enhancement structure adds up to 10 mm and the total path length adds up to 15 mm with the inclusion of an absorption enhancement structure of the invention, the path length ratio at 30 degrees incidence is 1.5 (which represents an increase of 50 percent in optical path length at this angle of incidence for this particular absorption enhancement structure). The ray tracing and path length and ratio calculations are done for each angle of incidence (or a subset sampling of such incidence angles such as using 5 degree increments when the range of angles is −80 degrees to +80 degrees). An average path length ratio may also be calculated for the whole run of angles as well as calculating a peak length ratio, e.g., a PV enhancement film may provide an average path length ratio of 1.3 while a peak length ratio may be 1.5. Optimization may also include determining the ratio particularly in the area of higher sun light intensity (e.g., from about plus/minus 40 degrees and more typically plus/minus 20 degrees) to verify that improvements are obtained in this important region, which as discussed elsewhere may benefit from mixing of two or more structure configurations to achieve a better overall efficiency increase as well as improved average path length ratio (e.g., in the above example, two absorption enhancement structures may be used within a single PV enhancement film to increase the average path length ratio from 1.3 to 1.4 or 1.5 or more by filling any holes or weak ranges of angles of incidence in the design achieving a ratio of 1.3).

Figure 29:
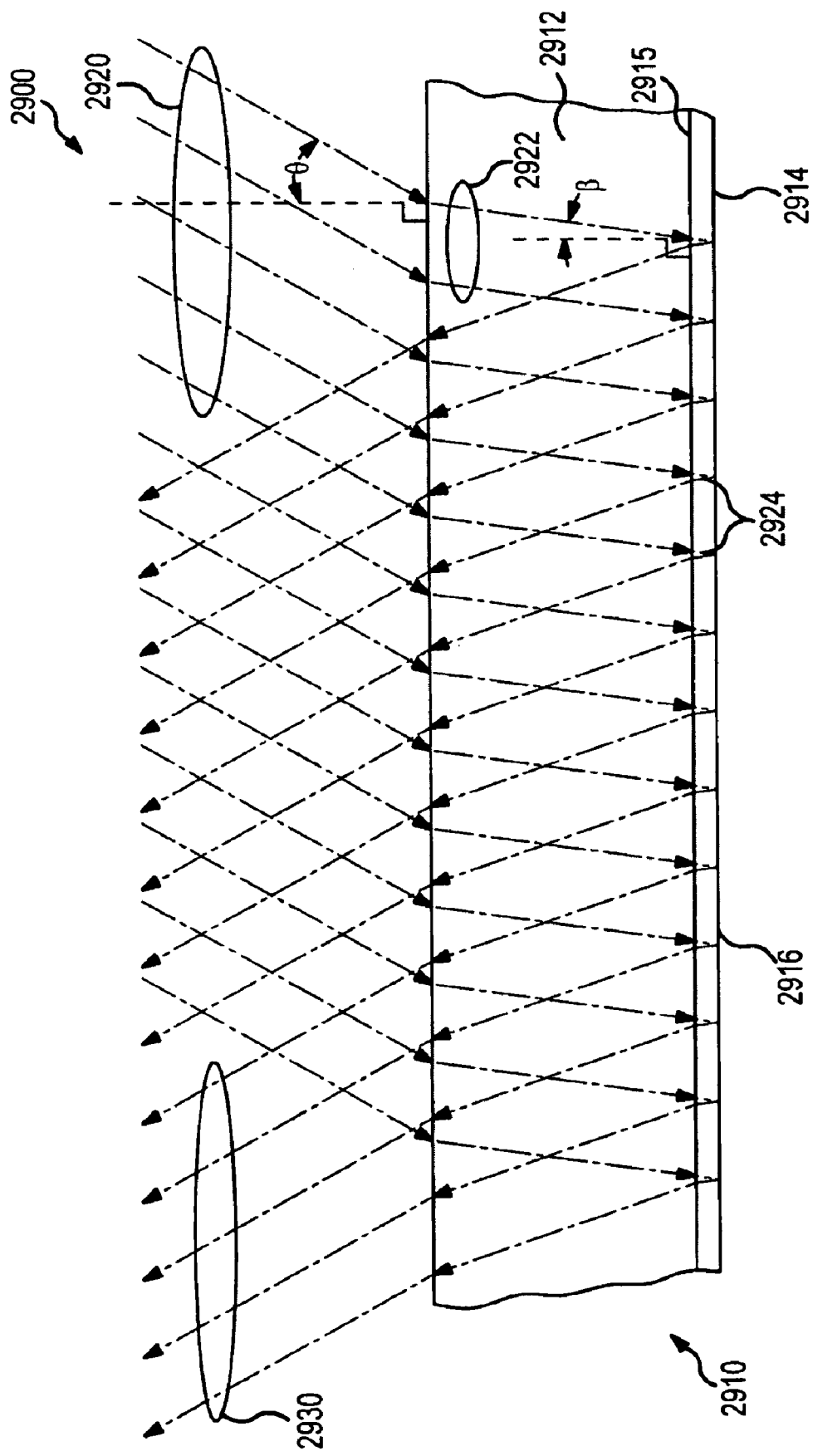
FIGS. 29 and 30 illustrate ray tracings for a conventional PV device or solar cell at a particular angle of incidence showing incident or received light passing through a protective glass layer, coating, or top then through a layer of PV material and being reflected from a reflective backing or mirror.

FIG. 29 illustrates a ray tracing 2900 for a particular incidence angle as may be performed by a ray tracing engine (or optimization module) of the invention for a commercial or conventional solar cell or PV device. As shown, the PV device 2910 includes, from the top down, a protective glass cover 2912, PV material 2914 with its light receiving surface 2915, and a reflective backing or mirror element 2916. Sunlight or light rays 2920 are received by the device 2910 at an incidence angle, $\theta$, such as 20 degrees or the like. In a typical tracing, a large number of rays 2920 would be traced such as 100 to 500 or more per angle of incidence (or per each angle in a subset traced within a range of incidence angles of interest for optimization), with a much smaller number shown in FIG. 29 for clarity and ease of illustration.

Figure 30:
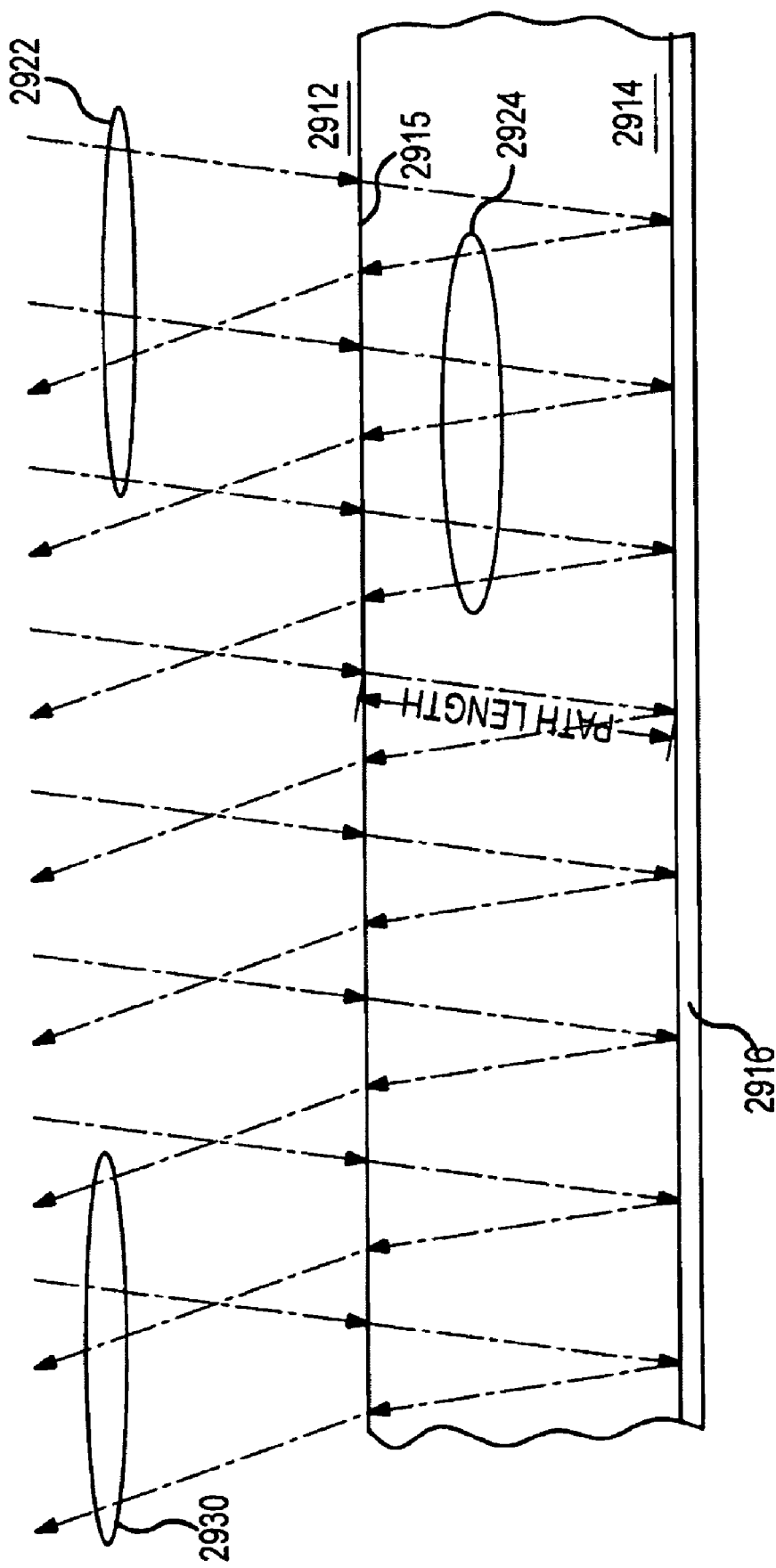

The rays 2920 strike the protective glass cover/top 2912, are refracted as shown with rays 2922 to strike the PV material surface 2915 at a second angle (or angle of incidence of light or angle of received sunlight upon the PV material 2914), $\beta$, which may be smaller than the original angle of incidence, $\theta$, such as 10 to 20 degrees when the value is 20 to 30 or the like. Then, the received light 2924 travels through the PV material 2914 where it strikes the reflective surface 2916 (if not absorbed) and is reflected back out of the PV device 2910 as shown at 2930. An enlarged or close up view of this tracing is shown in FIG. 30, This shows more clearly the path length of the rays 2924 traveling in the PV material 2914, and FIG. 30 also shows that the optical path is relatively short or direct. Hence, improvements in absorption can be obtained by changing the direction of the rays striking the surface 2915 of the PV material 2914 (or to provide a larger incidence angle, $\beta$, as measured from an orthogonal plane to the surface 2915). Also, as discussed above, TIR may be used to capture or redirect at least a portion of the rays 2930 prior to their loss from the solar cell or PV device assembly.

Figure 31:
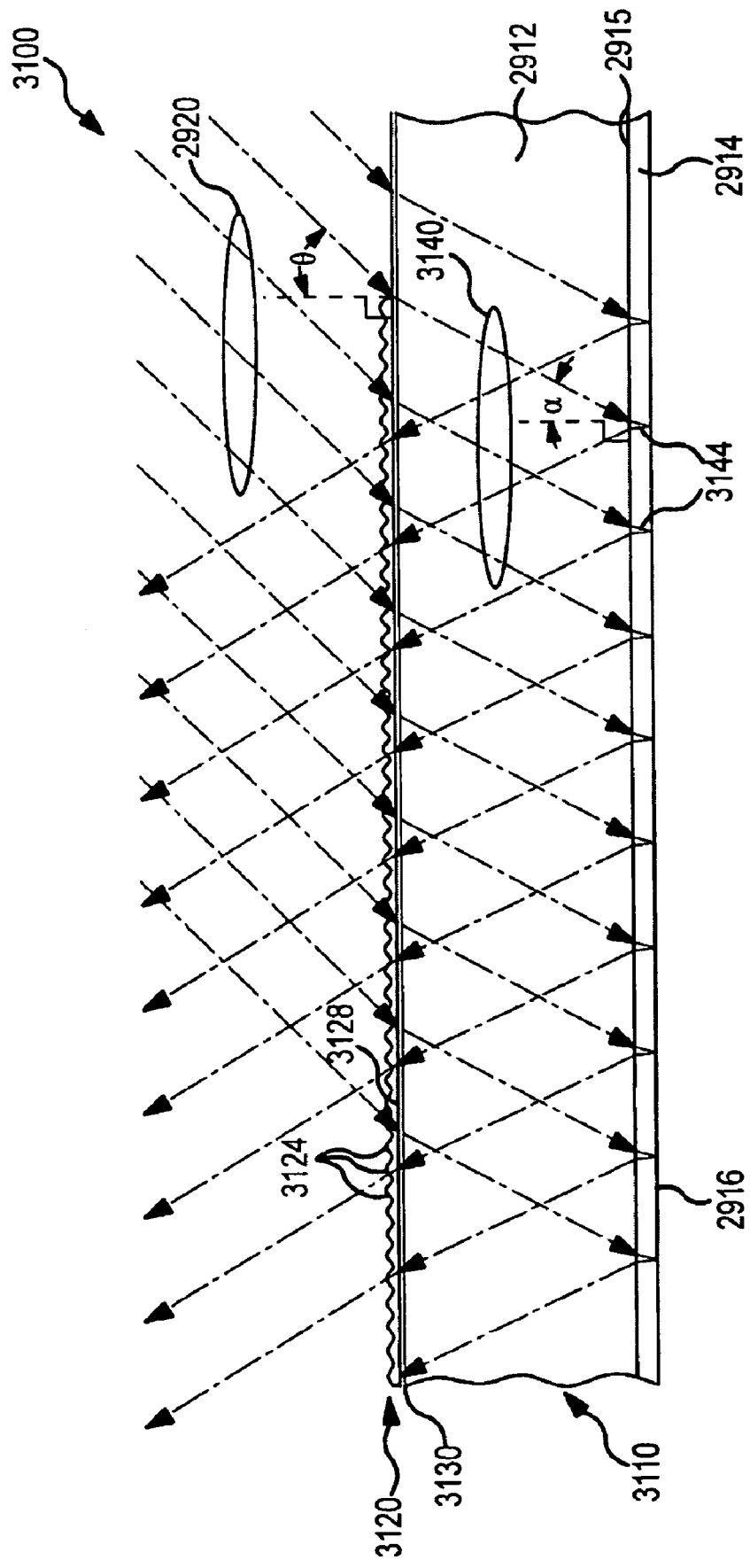
FIGS. 31 and 32 illustrate ray tracings for a solar cell assembly or modified PV device that includes a PV enhancement film applied to the protective glass layer of a PV device to refract or modify the path of incident light to achieve an improved (e.g., longer) path length in the PV material as compared with the tracings shown in FIGS. 29 and 30 (e.g., a path length ratio greater than one such as greater than about 1.10 or more)
Figure 32:
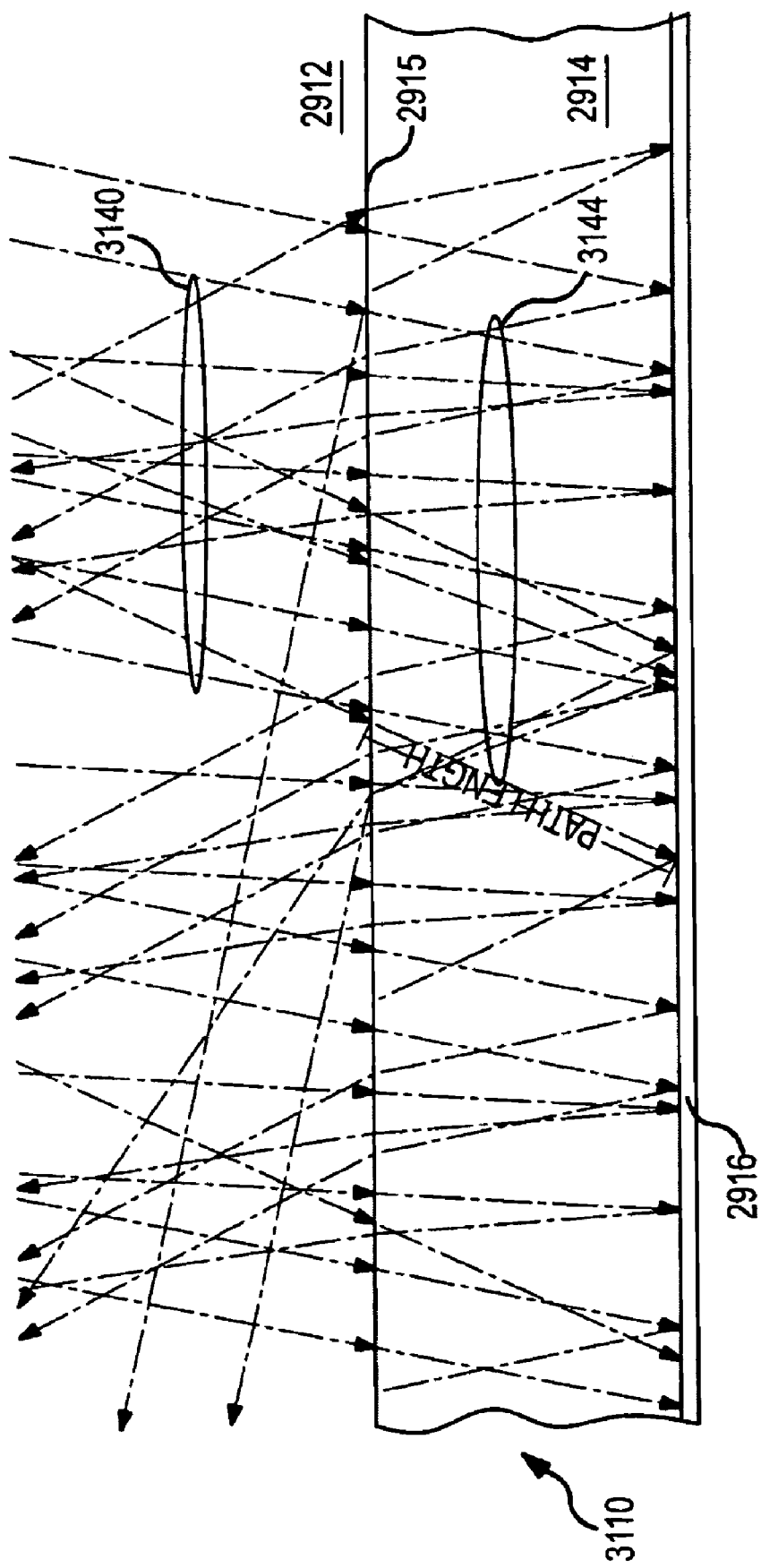

In FIGS. 31 and 32, ray tracings 3100 are shown for a solar cell assembly or PV device 3110 that includes the PV device 2910 of FIG. 29 with its protective glass cover 2912, PV material 2914, and reflective backing 2916. Additionally, though, a PV enhancement film 3120 is included that is applied over the glass cover 2912 with an adhesive layer 3130. In this embodiment, the PV film 3120 includes a sawtooth pattern of absorption enhancement structures 3124 on a substrate 3128, with the structures 3124 having a single configuration (e.g., elongated bodies extending the length of the film 3120 with a triangular cross section as shown, for example, in FIGS. 4 and 5). With the use of the PV enhancement film 3120, the incident or received sunlight 2920 at incidence angle, $\theta$, are refracted by the facets or refraction/light receiving surface of the structures 3124. As a result, the rays 3140 traveling through the glass cover/layer 2912 strike or are incident upon the light receiving surface 2915 of the PV material 2914 at a second angle or second incidence angle, a, that differs from the base device or device without the PV enhancement film. Typically, this second angle or angle of received sunlight, a, is greater than without of the structures 3124 (such as a few to many degrees larger than angle, $\beta$). The light 3144 than travels through the PV material 2914 along a different, longer path as shown with the path length in FIG. 32, which provides a path length ratio that is greater than 1 and that allows the PV material, in use, to more efficiently absorb the rays 3144 as compared with the rays 2922 that follow a shorter path through the PV material. Although not clearly shown in FIGS. 31 and 32, the structures 3124 also provide a level of ray capture of light reflected from the surface 2915 and/or from surface 2916 back up to the PV enhancement film, with TIR redirecting at least some fraction back to the PV material 2914 for possible absorption in a second or greater number pass.

Significantly, the ray tracing 3100 is performed taking into account the presence of the glass 2912 and also the adhesive 3130. This enables the path lengths in the PV material 2914 to be more accurately determined, which, in turn, allows a better optimization (or selection) of a combination of structures 3124 (size and/or shape) and adhesive 3130 for a particular PV device with a known cover 2912 (or to allow a designer to select from two or more such protective glass covers or tops, with it being understood that cover/top 2912 may be made of other materials than glass with the tracing simply being adjusted to include the parameters such as thickness and refractive index for the different material).

The components of the PV device assembly 3110 may be varied to practice the invention with differing covers 2912, differing PV materials 2914, and, of course, a wide variety of PV enhancement films 3120 with a variety of configuration for structures 3124 (as shown in the numerous figures presented herewith). However, it may be useful to further describe at least one configuration or arrangement for a solar cell assembly 3110 that was modeled using the computer system 2700 of FIG. 27. The PV material 2914 in this example was a thin film amorphous silicon PV layer with an index of 3.44 and a thickness of 11 mils. The cover 2912 was assumed to be formed of a thickness of 125 mils of glass with an index of 1.5. The adhesive 3130 was assumed to have a thickness of 2 mils and an index of 1.51. The PV enhancement film 3120 was formed of a plastic with an index of refraction of 1.49, with elongated sawtooth structures 3124 of a single triangular cross sectional shape. In the film 3120, the pitch/base of each structure 3124 was 13.333 mils with a height or thickness of about 7 mils while substrate thickness was 4 mils. Also, the ray tracing module acted to trace 470 rays per angle modeled for a single angle of incidence (e.g., about 20 to 25 degrees). The optical enhancer or structure optimization module processed the ray tracings of the assembly 3110 as well as a base or uncovered PV device and determined that the average path length ratio was 1.283, which represents an increase in path length of 28.3 percent with this configuration of the PV device, adhesive, and PV film including its material, substrate thickness, and absorption enhancement design.

In some cases, as discussed with reference to FIGS. 25 and 26, a PV enhancement film such as film 3120 may show weaknesses in particularly desirable ranges of incidence angles such as within the prime solar energy collection range of about −20 to about +20 degrees (or up to plus/minus 40 degrees in some cases). When ray tracing and path length calculations are performed for the film 3120, the result may be that average length ratio is 1.525 with a peak length ratio up to over more than 3. However, the graph of the path length ratio relative to angle of incidence, such as that shown in FIG. 25, may indicate that there is a weak spot or gap in the usefulness of the film 3120 in increasing path length such as in the range of −10 to +10 degrees.

Hence, the design process for a PV enhancement film may call for optimizing the path length ratios for a PV enhancement film for a certain desired angular range or spread such as −20 to +20 degrees (as measured from orthogonal for the light receiving surface of the PV material) to increase the efficiency of the PV device. To this end, the assembly 3110 with the single design of structure 3124 may provide a gap in this target range of angles (as shown in FIG. 25). The overall angular range for a PV enhancement film can, in some cases, be improved by providing two or more sets of absorption enhancement structures each with differing designs that may be useful for obtaining a better path length (or TIR response) for ranges of angles. By combining, for example, a second structure that addresses the weaknesses of a first structure with the first structure on a single PV enhancement film, a better overall path length ratio may be achieved and/or the conversion efficiency may be increased (e.g., the ratio may not be increased and may even be lower but if it is enhanced in prime real estate such as plus/minus 20 degrees the efficiency can be increased without an overall jump in the path length ratio).

In one exemplary embodiment of mixing structure configurations in a PV enhancement film, FIG. 33 shows a mixed sawtooth pattern of two absorption enhancement structures 3324, 3328 in a PV enhancement film 3320 that also includes a substrate 3330. The PV enhancement film 3320 is mounted onto a PV device 2910 (such as that described with reference to FIGS. 29-32) with a layer of adhesive 3340 applied to the cover glass 2912 to form a solar cell assembly or enhanced PV device 3310. In this assembly 3320, a first set (or about half of the overall number) of structures 3324 is provided that have the shape and characteristics described for the film 3120 of FIG. 31 (e.g., with a pitch of 13.333 mils, a height/thickness of 7 mils with two facets or sides 3325 extending along the length of the structure 3324 and meeting at a point to define a triangular cross section). A second set (or about half) of structures 3328 is provided that have a different shape such as having the same characteristics such as pitch and index but a differing height/thickness of about 10 mils to provide facets or sides at a differing angle to obtain differing refraction and also differing TER effects. Typically, these two sets of structures are alternated on the PV enhancement film, but, in some cases, two or more of each design may be grouped together and these groups may be alternated (with the more significant feature being the mixing of two differing structure designs to obtain improved overall results).

FIG. 33 shows a ray tracing 3300 with this dual-structure PV enhancement film 3320 applied to the PV device 2910 to provide an assembly 3310 that is substantially more efficient than the PV device 2910. In part, this is because the two structures 3324, 3328 with sides/facets 3325, 3329 act in conjunction to provide an average length ratio of about 1.2 to about 1.5 or more (or up to about a 20 to 50 percent or more increase in path length on average; whereas, note, when the structure of the first set with a thickness/height of 7 mils is used alone the overall or average length ratio may be nearly the same value but the increase obtained in the −10 to 10 degree range makes the mix of structures highly useful for increasing not just path length but resulting efficiency of the resulting solar cell assembly), which may significantly increase the ability of the PV material of device 2910 to absorb photons or received solar energy. The curve of the PV path length ratio compared with angle of incidence of the assembly 3310 may take an appearance similar to that shown in FIG. 26, and, particularly, the addition of or use of the second set of structures 3328 fills the gap or hole (hole/gap 2520 of graph 2500 in FIG. 25) by providing a large improvement of path length in the range of −10 to +10 degrees such that the PV enhancement film 3320 has very desirable properties in prime solar energy collection ranges of −20 to +20 degrees (or, typically, from about 10 AM to about 2 PM in the northern hemisphere and during much of the year). Additionally, the structures 3324, 3328 provide TIR to reflect at least some of the reflected light from the PV material as can be seen in the tracing 3300 particularly in the second set of structures 3328 at this particular angle of incidence.

As will be understood from this detailed description, a number of different types of structures can be considered for optically enhancing the path length in the PV material. In some embodiments, the computer-implemented optimizing program has built-in circular lenticular shapes, both cusp up and cusp down, sinusoidal lenticular shapes, and saw tooth cross section lenticular shapes that can be investigated and used for the absorption enhancement structures of a PV enhancement film and included in an optimization run. In a typical run, a shape will be picked by a user providing input. Then, the parameters appropriate to the structure such as radius, amplitude, thickness, pitch, cusp to structure base spacing, and the like may be entered by the user but, more typically, are varied and traced as described before by the optimization module. An optimization run will try all combinations of the parameters set or chosen by the program user.

In one optimization run with a saw tooth design with one structure configuration, the following parameters were used. Starting at the bottom of the overall PV device and going up, there was a mirror or reflector and PV material of thickness 11 mils and index of refraction 3.44. The PV device also included cover glass of thickness 125 mils and an index 1.5.

The PV enhancement film was applied using an adhesive layer of thickness 2 mils and index 1.51, and the film included optical enhancing material with index 1.49. The optimization module or software run by the computer used a ray trace width of 600 mils (e.g., the range over which the structures will be traced) and a starting angle of −80 degrees and a stopping angle of +80 degrees, with a step angle of 5 degrees (e.g., tracing over the range of plus/minus 80 degrees by 5 degree steps). In the optimization, the number of rays traced per angle was 235 while the number of structures traced was 35 to 70 in steps of 1. The thickness of the sawtooth traced was from 3 to 12 mils in steps of 1 mil while the cusp to base spacing was 4 mils (e.g., the substrate of the PV film was 4 mils). The highest average path length ratio identified occurred for the following saw tooth conditions during the optimization, a structure with a pitch or base width of 13.333 mils and a structure height or thickness of 7 mils, and the resulting path length ratio on average was 1.525 with a peak ratio of 3.084. However, a gap such as gap 2520 shown in FIG. 25 was found for this optimized configuration for the range of plus/minus 80 degrees in the range of plus/minus 18 degrees.

Hence, to fill in the values between about −18 to +18 degrees another run was made limiting the optimization angle values used to be between −20 to +20 in steps of 5 degrees (note, the peak ratio of the 7 mil high structures was outside plus/minus 20 degrees). With this new limiting optimization input (e.g., an incidence angle range of plus/minus 20 degrees as opposed to plus/minus 80 degrees), the optimized thickness found was 10 mils (with a base/pitch again of 13.333 mils and a substrate thickness set at 4 mils). The two optimized results (or absorption enhancement structure configurations or design defining parameters) were combined to produce a PV enhancement film having an alternate sawtooth pattern of structures with alternating thicknesses of 7 and 10 mils (and bases of 13.333 mils and substrate thickness of 4 mils). A ray trace was done from −80 to 80 degrees for this dual-structure PV enhancement film, and the path length ratio plot of the combined structure is similar to that shown in FIG. 26, where we see a substantial increase in path length ratio across the angular range (e.g., an average path length ratio of about 1.526). The included apex angle (between the two facets and defining the shape of the facets or sides or refraction and TIR surfaces of the structures) of the 7 mil thickness sawtooth was 131.544 degrees and of the 10 mil sawtooth 96.026 degrees.

As discussed, the design of the structure(s) for the PV enhancement films of embodiments of the invention may be performed or facilitated by an automatic optimization routine (as shown in FIGS. 27 and 28) that does a ray trace over a range of variables for a range of angles stepping a specified value (for the variables and/or the angles). Each incident angle of rays that is traced by this optimization module is evaluated by the module for the path length ratio increase over the non-optically enhanced surface. The average increase is compared to the best value obtained to date and, if the current value is an improvement, the parameters for the structure/film are saved in memory. At the end of the run of all angles and all structure parameters, the best combination of parameters (or optimized parameters for the structure/film) are recalled and output (e.g., transmitted to a display or other output device).

The above examples have stressed the use of the PV enhancement film over a protective glass layer to increase path lengths and/or capture or redirect reflected rays. Although this is useful in retrofit applications or to allow continued use of an existing PV device design, the PV enhancement film may also incorporate the protective glass in its substrate (e.g., replace the glass or other protective cover with a layer of glass that includes the TIR or absorption enhancement structures described herein). For new panel construction, it may be advantageous to create glass panels with optimized structures built into the glass maximizing (or at least improving) the performance of the PV material based upon the characteristics of the PV material and the desired gain in performance at specific angles.

Customizing the thickness and the characteristics of these structures within the glass itself is advantageous and can provide significantly better results for performance enhancement for PV materials (e.g., more than an overlay film as described in some of the above examples of PV enhancement films). This better result is in part because a PV enhancement film designer has more latitude with the creation of the structures and their optimization in the software program. In other words, the likely enhancement created by the overlay embodiments of the PV film necessitates the use of existing parameters of the solar cell or PV device such as the ⅛-inch layer of glass already over the panel or PV material. Allowing the optimization program or module to optimize both TIR and increased path length structures for structures provided on the glass surface or within or as part of the glass cover or top allows for better results relative to a later applied film and a wider parameter of data possibilities. The possible absorption enhancement structures in some embodiments include structures going down toward the level of the PV material (or nearly) and all the way up to the top of the glass (⅛" thick). These possibilities make for greater possibilities in enhancement, especially for path length enhancement.

Data can be gathered from the desired PV product based upon its reflective and absorption characteristics of the material. Standard poly-silicon may have certain characteristics for reflection at certain angles, and also different absorption characteristics. Path length can be optimized at desired angles with the combination of several different structures (such as an alternating sawtooth pattern or the like) while TIR structures can also be added to the glass for recycling reflected rays (e.g., a sawtooth pattern with two, three, or more structures on or within the glass to provide a desired combined result). In some embodiments, a combination of structures optimized for TIR and path length as a result of the characteristics of the PV materials can be built into the glass, with better overall results as compared with a film overlay because of the advantage of using the thickness of the glass for structure optimization. In some aspects, the concept of using a specially designed glass layer as the film is the same or similar to that described above for a later applied PV enhancement film, but the ability not to have an intervening glass top or cover to start with and all of the thickness to work with (e.g., to include as part of the PV enhancement film or structure) may provide much better optimization of the desired structures in some designs of PV devices such as solar arrays.

We claim:

1. A solar cell assembly for more efficiently capturing solar energy, comprising:
 a photovoltaic (PV) device including a layer of PV material and a protective top covering the layer of PV material; and
 a PV enhancement film comprising substantially transparent material applied to at least a portion of the protective top of the PV device, the PV enhancement film comprising a substrate, with a light-receiving surface and a cell-mating surface opposite the light-receiving surface, positioned with the cell-mating surface proximate to the protective top and comprising a plurality of absorption enhancement structures on the light-receiving surface of the substrate, wherein the absorption enhancement structures each comprise a surface that refracts incident light striking the PV enhancement film to provide an average path length ratio of greater than about 1.10 in the layer of PV material over a range of incidence angles as determined based on an first pass of the refracted incident light traveling through the PV material and wherein the absorption enhancement structures face away from the PV device,
wherein each of the absorption enhancement structures comprises an elongated body extending along the length of the substrate and having at least two sides angled inward, and
wherein the absorption enhancement structures comprise two sets of differing configurations, a first one of the configurations having a triangular cross section with a base of less than about 13 mils and a height of less than about 7 mils and a second one of the configurations having a triangular cross section with a base of less than about 13 mils and a height greater than the height of the first one of the configurations and less than about 10 mils.

2. The solar cell assembly of claim 1, wherein the average path length ratio is determined as an average of a plurality of path length ratios determined within the range of incidence angles and each of the path length ratios being a path length of the refracted incident light traveling through the PV material after passing through the PV enhancement film compared with a path length of the incident light traveling through the PV material in an absence of the PV enhancement film.

3. The solar cell assembly of claim 2, wherein the plurality of path length ratios are determined based on ray tracings performed at a plurality of angles within the range of incidence angles.

4. The solar cell assembly of claim 1, wherein the range of incidence angles is a range of angles selected from the range of negative 80 degrees to positive 80 degrees as measured from an orthogonal plane passing through a light-receiving surface of the PV material.

5. The solar cell assembly of claim 4, wherein the range of incidence angles is a range of angles selected from the range of negative 20 degrees to positive 20 degrees as measured from an orthogonal plane passing through a light-receiving surface of the PV material.

6. The solar cell assembly of claim 1, wherein the absorption enhancement structures are configured such that the average path length ratio is greater than about 1.20 in the layer of PV material over the range of incidence angles.

7. The solar cell assembly of claim 6, wherein the absorption enhancement structures are configured such that the average path length ratio is greater than about 1.50 in the layer of PV material over the range of incidence angles.

8. The solar cell assembly of claim 7, wherein the range of incidence angles includes the range of angles from negative 20 degrees to positive 20 degrees as measured from an orthogonal plane passing through a light-receiving surface of the PV material.

9. The solar cell assembly of claim 1, wherein at least a portion of the refracted incident light passed through the PV enhancement film is reflected back from the PV device and wherein the absorption enhancement structures direct a fraction of the reflected portion using TIR back toward the layer of PV material.

10. The solar cell assembly of claim 1, wherein the first configurations of the absorption enhancement structures are configured for increasing the average path length ratio over 1.10 in the layer of PV material over a first range of the incidence angles and the second configurations of the absorption enhancement structures are configured for increasing the average path length ratio over 1.10 in the layer of PV material over a second range of the incidence angles that differs from the first range, whereby an efficiency of the solar cell assembly is greater than achieved with use of absorption enhancement structures configured similar to only one of the first and second configurations.

11. The solar cell assembly of claim 1, wherein the first and second configurations are alternated in first and second sets of the absorption enhancement structures across a width of the light-receiving surface.

12. The solar cell assembly of claim 1, wherein the absorption enhancement structures of the first configuration provide the average path length ratio of greater than 1.10 at least in a range of incidence angles of −10 degrees to +10 degrees and the absorption enhancement structures of the second configuration provide the average path length ratio of greater than 1.10 at least in a range of incidence angles of −40 degrees to +40 degrees.

13. A photovoltaic apparatus with enhanced absorption in a layer of photovoltaic (PV) material that is positioned under a protective layer of substantially transparent material and incident light striking the protective layer over a range of incidence angles has a first average path length through the PV material, comprising:
a substrate of substantially transparent material;
a layer of adhesive attaching the substrate to the protective layer opposite the PV material; and
a plurality of absorption enhancement structures on a side of the substrate opposite the adhesive, wherein each of the absorption structures enhancement comprises a body formed of substantially transparent material, the body being shaped to transmit light incident upon an outer surface of the body toward the PV material at a differing angle than the incident light striking the protective layer and to direct at least a portion of light reflected from the PV material back toward the PV material using total internal reflection (TIR), wherein the light incident upon the body over the range of incidence angles has a second average path length, as measured on a single pass through the PV material, that is at least about 10 percent greater than the first average path length,
wherein the bodies of the absorption enhancement structures are elongated with a symmetric triangular cross sectional shapes with two sides defining a light receiving and trapping surface using TIR to direct the portion reflected light back to the light-receiving surface and using refraction to provide the differing angle and wherein the absorption enhancement structures face away from the layer of PV material and wherein the bodies comprise two sets of differing configurations, a first one of the configurations having a triangular cross section with a base of less than about 13 mils and a height of less than about 7 mils and a second one of the configurations having a triangular cross section with a base of less than about 13 mils and a height greater than the height of the first one of the configurations and less than about 10 mils.

14. The apparatus of claim 13, wherein the protective layer comprises glass and the PV material comprises a silicon-based thin film PV device.

15. The apparatus of claim 13, wherein an average path length ratio of the second average path length to the first average path length is greater than about 1.2.

16. The apparatus of claim 13 wherein an average path length ratio of the second average path length to the first average path length is greater than about 1.5.

17. The apparatus of claim 13, wherein the absorption enhancement structures further comprise at least three differing body configurations in which the bodies of the members differ in at least one of size or shape.

18. The apparatus of claim 13, wherein the absorption enhancement structures comprise a plurality of elongated, side-by-side members, wherein the bodies of adjacent ones of the members differ in height, and wherein a first one of the heights provides increased path length ratios for a first range of incidence angles and a second one of the heights provides increased path length ratios for a second range of incidence angles differing from the first range of incidence angles.

19. A solar array, comprising:
a plurality of solar cells arranged in a planar panel with a light-receiving surface; and
a photovoltaic (PV) enhancement film comprising a substrate with a planar first surface proximate to the light-receiving surface and a second surface comprising a plurality of absorption enhancement structures, the PV enhancement film being formed of a substantially transparent material wherein each of the absorption enhancement structures comprises at least one facet receiving incident light, directing the incident light toward the light-receiving surface of one of the solar cells whereby a path length in PV material of the solar cells, measured as a single pass through the PV material, is greater than a base path length determined in an absence of the PV enhancement film, and reflecting a portion of light reflected from the light-receiving surface,
wherein the absorption enhancement structures comprise elongate members with at least two facets for the receiving and the directing of the incident light and for the reflecting of the portion of the reflected light, the reflecting being performed using total internal reflection (TIR),
wherein a ratio of the path length over the base path length is greater than about 1.2 on average over a range of incidence angles including the range of −20 to +20 degrees as measured from an orthogonal plane extending from the light receiving surface,
wherein the absorption enhancement structures face away from the solar cells, and
wherein the absorption enhancement structures comprise two sets of differing configurations, a first one of the configurations having a triangular cross section with a base of less than about 13 mils and a height of less than about 7 mils and a second one of the configurations having a triangular cross section with a base of less than about 13 mils and a height greater than the height of the first one of the configurations and less than about 10 mils.

20. The solar array of claim 19, wherein the PV enhancement film comprises a planar glass element with the absorption enhancement structures formed on a side of the glass element distal to the light receiving surface and further comprising a layer of adhesive attaching the glass element to the light receiving surface, wherein the light receiving surface includes an upper layer of PV material in the solar cells.

21. The solar array of claim 19, the sides of each of the members being angled inward at an angle of less than about 60 degrees.

22. The solar array of claim 19, wherein a ratio of the path length over the base path length is greater than about 1.5 on average over a range of incidence angles including the range of −40 to +40 degrees as measured from an orthogonal plane extending from the light receiving surface.

23. A solar cell assembly for more efficiently capturing solar energy, comprising:
a photovoltaic (PV) device including a layer of PV material and a protective top covering the layer of PV material; and
a PV enhancement film comprising substantially transparent material applied to at least a portion of the protective top of the PV device, the PV enhancement film comprising a substrate, with a light-receiving surface and a cell-mating surface opposite the light-receiving surface, positioned with the cell-mating surface proximate to the protective top and comprising a plurality of absorption enhancement structures on the light-receiving surface of the substrate, wherein the absorption enhancement structures each comprise a surface that refracts incident light striking the PV enhancement film to provide an average path length ratio of greater than about 1.10 in the layer of PV material over a range of incidence angles and with path lengths measured on single passes through the layer of PV material,
wherein the absorption enhancement structures face away from the PV device and comprise a plurality of side-by-side members with a first set of the members having a first cross-sectional shape providing the average path length ratio over a first portion of the range of incidence angles and a second set of the members having a second cross-sectional shape differing from the first cross-sectional shape providing the average path length ratio over a second portion of the range of the incidence angles differing from the first portion,
wherein the members of each of the absorption enhancement structures comprise an elongated body extending along the length of the substrate and having at least two sides angled inward, and
wherein elongated bodies of the absorption enhancement structures comprise two sets of differing configurations, a first one of the configurations having a triangular cross section with a base of less than about 13 mils and a height of less than about 7 mils and a second one of the configurations having a triangular cross section with a base of less than about 13 mils and a height greater than the height of the first one of the configurations and less than about 10 mils.

* * * * *